(12) United States Patent
Kawaguchi et al.

(10) Patent No.: US 7,061,048 B2
(45) Date of Patent: Jun. 13, 2006

(54) POWER MOSFET DEVICE

(75) Inventors: Yusuke Kawaguchi, Miura-gun (JP);
Norio Yasuhara, Kawasaki (JP);
Syotaro Ono, Yokohama (JP); Shinichi Hodama, Yokohama (JP); Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 10/790,137

(22) Filed: Mar. 2, 2004

(65) Prior Publication Data

US 2004/0164350 A1  Aug. 26, 2004

Related U.S. Application Data

(62) Division of application No. 10/055,947, filed on Jan. 28, 2002, now Pat. No. 6,720,618.

(30) Foreign Application Priority Data

Nov. 14, 2001  (JP) .............................. 2001-349152

(51) Int. Cl.
*H01L 27/96* (2006.01)

(52) U.S. Cl. .................. 257/341; 257/336; 257/335

(58) Field of Classification Search ................ 257/341, 257/327, 335, 336
See application file for complete search history.

(56) References Cited

U.S. PATENT DOCUMENTS 5,426,320 A * 6/1995 Zambrano .................. 257/328

| 6,372,557 | B1 | 4/2002 | Leong |
| 6,600,182 | B1 | 7/2003 | Rumennik |
| 2001/0042886 | A1* | 11/2001 | Yoshida et al. ............. 257/341 |
| 2002/0050619 | A1 | 5/2002 | Kawaguchi et al. |

FOREIGN PATENT DOCUMENTS

JP  2000-156383  6/2000

OTHER PUBLICATIONS

E. Yanokura, "Switching Power Supply", Symposium 2001, pp. B2-1-1 - B2-1-6.

* cited by examiner

*Primary Examiner*—Bradley K. Smith
(74) *Attorney, Agent, or Firm*—Oblon, Spivak, McClelland, Maier & Neustadt, P.C.

(57) ABSTRACT

A power MOSFET device comprising a low resistance substrate of the first conductivity type, a high resistance epitaxial layer of the first conductivity type formed on the low resistance substrate, a base layer of the second conductivity type formed in a surface region of the high resistance epitaxial layer, a source region of the first conductivity type formed in a surface region of the base layer, a gate insulating film formed on the surface of the base layer so as to contact the source region, a gate electrode formed on the gate insulating film, and an LDD layer of the first conductivity type formed on the surface of the high resistance epitaxial layer oppositely relative to the source region and the gate electrode, wherein the LDD layer and the low resistance substrate are connected to each other by the high resistance epitaxial layer.

34 Claims, 45 Drawing Sheets

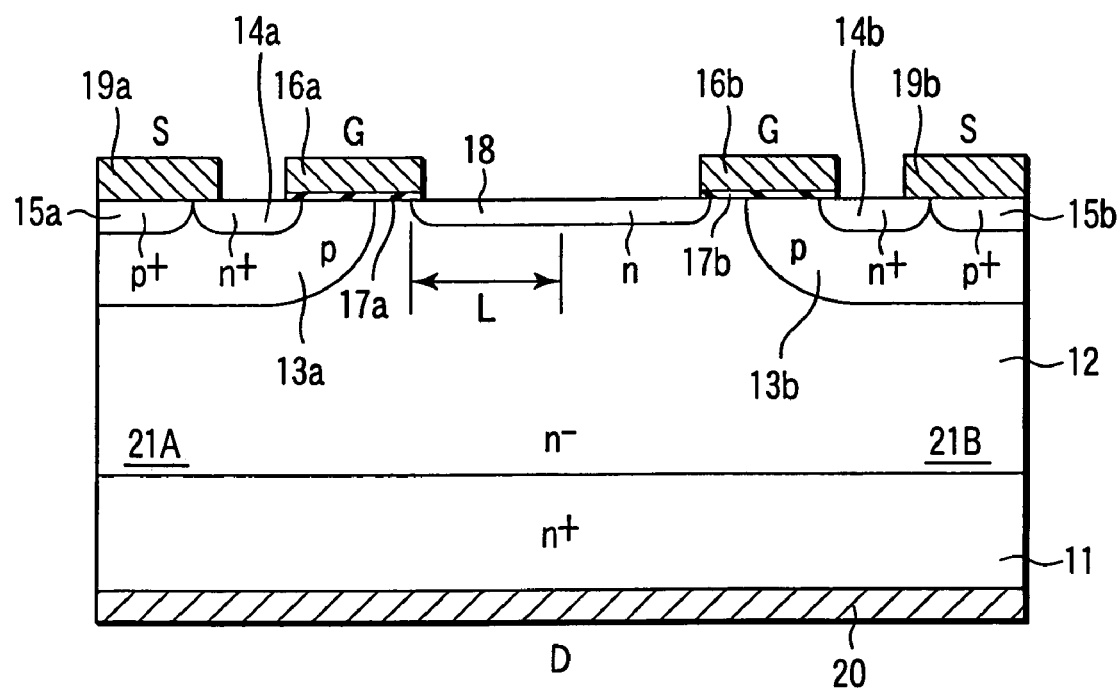
F I G. 1
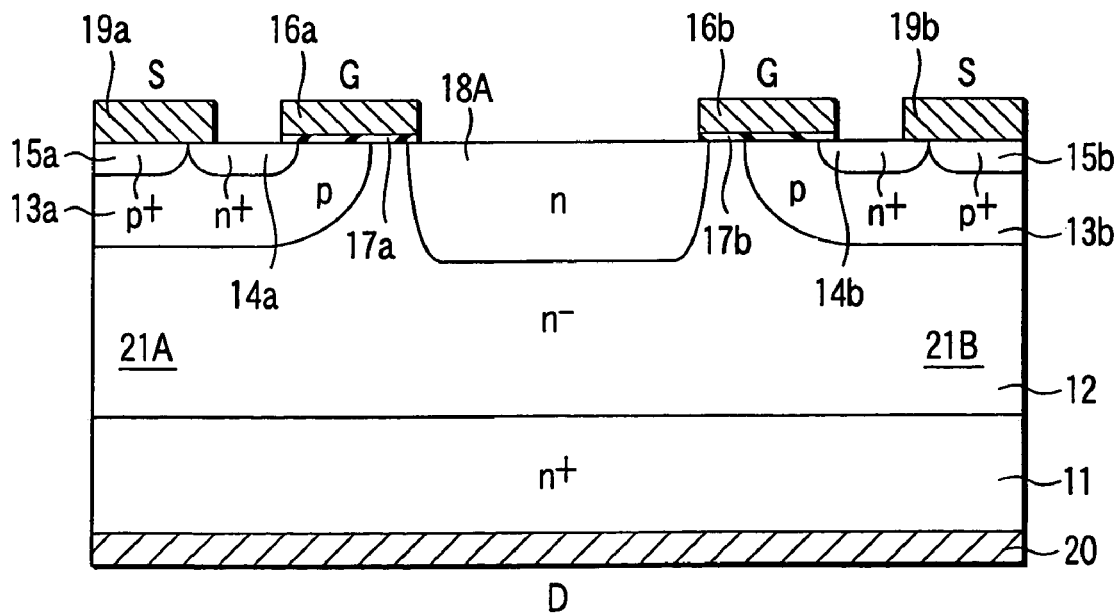
F I G. 2

POWER MOSFET DEVICE

CROSS REFERENCE TO RELATED APPLICATIONS

This application is a division of and claims the benefit of priority under 35 USC §120 from U.S. Ser. No. 10/055,947, filed Jan. 28, 2002 now U.S. Pat. No. 6,720,618, and is based upon and claims the benefit of priority under 35 USC §119 from Japanese Patent Application No. 2001-349152, filed Nov. 14, 2001, the entire contents of which are incorporated herein by reference.

BACKGROUND OF THE INVENTION

1. Field of the Invention

This invention relates to a power semiconductor device and, more particularly, to a power MOSFET device 2. Description of the Related Art In recent years, there has been a rapidly increasing demand for power MOSFET devices in a market of large current switching power supply devices with a high breakdown voltage, as well as in the market of switching power supply devices for mobile telecommunications devices including notebook-sized personal computers (PCs) so as to realize highly power-saving. Since power MOSFET devices are adapted to applications particularly in the field of power management circuits and safety circuits for lithium ion cells, they are required to provide a number of functional features including a low voltage drive capability that allows them to be used directly with the cell voltage, a low ON resistance and a reduced switching loss. These functional features can be realized by a reduced capacitance between the gate and the drain of the power MOSFET device. To meet these requirements, studies are made for applying horizontal element structures that have hitherto been mainly used for ICs to discrete elements in addition to the use of vertical element structures. With the use of the horizontal element structure, it is possible to reduce both the ON-resistance and the capacitance between the gate and the drain of a power MOSFET device.

FIG. 79 of the accompanying drawing is a schematic cross sectional view of a conventional vertical type power MOSFET device. With this vertical type power MOSFET device, an n–type epitaxial layer 102 is formed on an n+type semiconductor substrate 101 and a pair of p-type base layers 103a, 103b is formed on respective surface regions of the epitaxial layer 102 with a predetermined distance separating them. Then, n+type source regions 104a, 104b are formed respectively on surface regions of the p-type base layers 103a, 103b that are separated from a boundary between the epitaxial layer 102 and the p-type base layers 103a, 103b by a distance corresponding to the channel length. The n+type source regions 104a, 104b are located adjacent to respective p+type layers 105a, 105b which are used for connection to a power source. Subsequently, a gate electrode 106 is formed between the pair of source regions 104a, 104b to cover the surfaces of the base layers 103a, 103b and all the surface of the epitaxial layer 102 with a gate insulating film 107 interposed between them. Source electrodes 108a, 108b are formed on the respective surfaces of the p+type layers 105a, 105b so as to partly cover the surfaces of the source regions 104a, 104b. A drain electrode 109 is formed on the lower surface of the n+type semiconductor substrate 101.

FIG. 80 is a schematic cross sectional view of another conventional power MOSFET device, wherein a lateral element structure is applied to a discrete element in order to reduce the capacitance between the gate and the drain thereof. Referring to FIG. 80, an n–type epitaxial layer 202 is formed on an n+type semiconductor substrate 201 and a pair of p type base layers 203a, 203b is formed on respective surface regions of the epitaxial layer 202 with a predetermined distance separating them. Then, n+type source regions 204a, 204b are formed respectively on surface regions of the p type base layers 203a, 203b with a distance separated from a boundary between the epitaxial layer 202 and the base layers 203a, 203b corresponding to the channel length. The layers 204a, 204b are located adjacent to respective p+type layers 205a, 205b which are used for connection to a power source. N-type LDD layers 207a, 207b are formed on the surface of the epitaxial layer 202 between the pair of p type base layers 203a, 203b with a deep n+type sinker layer 206 interposed between them. The sinker layer 206 is so deep as to get to the n+type substrate 201. Then, between the paired source regions 204a, 204b and the corresponding paired LDD layers 207a, 207b, gate electrodes 208a, 208b are formed to cover the surfaces of the base layers 203a, 203b and those of the epitaxial layer 202 with gate insulating films 209a, 209b interposed between them respectively. Source electrodes 210a, 210b are formed respectively on the surfaces of the p+type layers 205a, 205b so as to partly cover the surfaces of the source regions 204a, 204b. A drain electrode 211 is formed on the lower surface of the n+type substrate 201.

The conventional vertical type power MOSFET device shown in FIG. 79 is accompanied by a problem of a large capacitance between the gate and the drain and a slow switching speed because the n–type epitaxial layer 102 and the gate electrode 106 are arranged oppositely over a large area with the gate insulating film 107 interposed between them.

On the other hand, the conventional horizontal type power MOSFET device shown in FIG. 80 has a problem that any effort for reducing the pitch of arrangement of elements, or the distance between the gate electrodes 208a, 208b faces the limit because the central sinker layer 206 is formed by diffusion and its surface width expands substantially as large as the distance between the surface and the n+type substrate 201. Accordingly, any attempt at reducing the ON-resistance per unit sectional area also faces a limit.

BRIEF SUMMARY OF THE INVENTION

According to one aspect of the present invention, there is provided a power MOSFET device comprising:

a low resistance substrate of the first conductivity type;

a high resistance epitaxial layer of the first conductivity type formed on the low resistance substrate;

a base layer of the second conductivity type formed in a surface region of the high resistance epitaxial layer;

a source region of the first conductivity type formed in a surface region of the base layer;

a gate insulating film formed on the surface of the base layer so as to contact the source region;

a gate electrode formed on the gate insulating film; and an LDD layer of the first conductivity type formed on the surface of the high resistance epitaxial layer relative to the source region and the gate electrode;

wherein the LDD layer and the low resistance substrate are connected to each other by the high resistance epitaxial layer.

BRIEF DESCRIPTION OF SEVERAL VIEWS OF THE DRAWING

FIG. 1 is a schematic cross sectional view of a first embodiment of the invention;

FIG. 2 is a schematic cross sectional view of another embodiment of the invention;

DETAILED DESCRIPTION OF THE INVENTION

Figure 3:
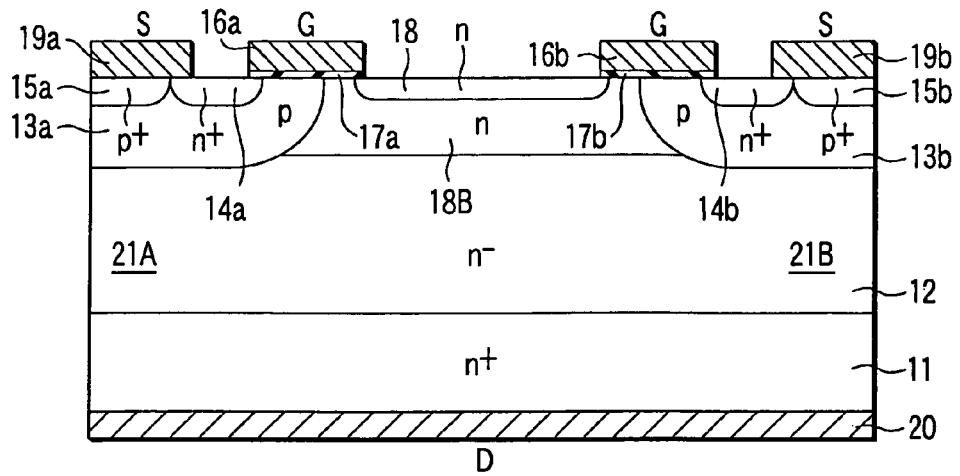
FIG. 3 is a schematic cross sectional view of still another embodiment of the invention.

Now, the present invention will be described by referring to the accompanying drawing that schematically illustrates various embodiments of the invention.

First Embodiment

FIG. 1 is a schematic cross sectional view of a first embodiment of the present invention realized by applying to the vertical type elements. Referring to FIG. 1, a high resistance n–type epitaxial layer 12 is formed on a low resistance n+type semiconductor substrate 11 such as a silicon wafer, and a pair of p type base layers 13a, 13b is formed on respective surface regions of the epitaxial layer 12 with a predetermined distance separating them.

Then, n+type source regions 14a, 14b are formed respectively on surface regions of the p type base layers 13a, 13b which are respectively separated from a boundary between the epitaxial layer 12 and the base layers 13a, 13b by a distance corresponding to the channel length so that they may be located adjacent to respective p+type layers 15a, 15b.

Subsequently, gate electrodes 16a, 16b are formed to cover the surfaces of the base layers 13a, 13b and also surface areas of the epitaxial layer 12 corresponding to channel regions respectively with gate insulating films 17a, 17b interposed between them. On the surface region of the epitaxial layer 12 between the gate electrode 16a and 16b is formed an n–type LDD layer 18. Furthermore, source electrodes 19a, 19b are formed respectively on the surfaces of the p+type layers 15a, 15b so as to partly cover the surfaces of the source regions 14a, 14b. A drain electrode 20 is formed on the lower surface of the n+type substrate 11.

In this way, a pair of vertical type MOSFET elements 21A, 21B is formed. Practically, a number of MOSFET elements having a configuration same as the MOSFET elements 21A, 21B are formed in a juxtaposed manner on the surface of the epitaxial layer 12 along a direction perpendicular to the section of FIG. 1 in order to obtain totally a desired current capacity. Thus, all the MOSFET elements are connected in parallel by means of a connecting section (not shown) to produce a large capacity power MOSFET device.

Figure 79:
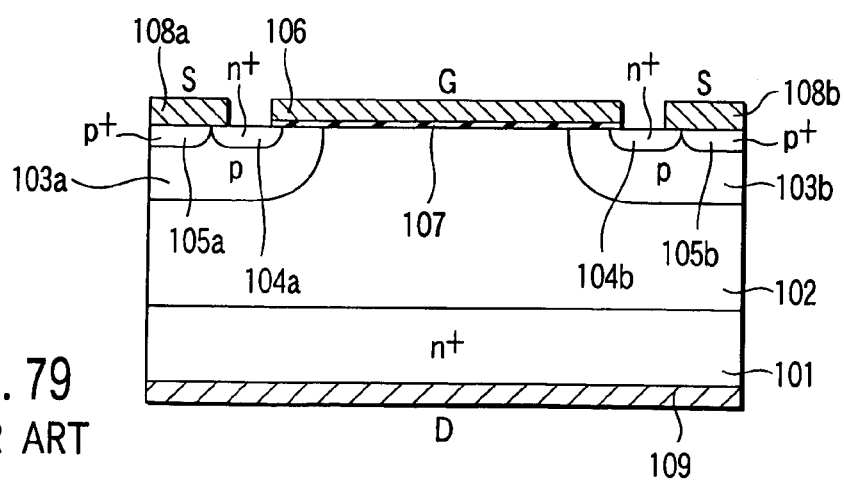
FIG. 79 is a schematic cross sectional view of a conventional vertical type power MOSFET device.

With the above described arrangement, the area over which the gate electrodes 16a, 16b and the epitaxial layer 12 disposed oppositely is reduced in comparison with such the conventional vertical type element as shown in FIG. 79 so that the capacitance between the gate and the drain is reduced in the respective elements 21A and 21B. In an experiment, it was found that, while the electric charges accumulated in the capacitance between the gate and the drain of the known element shown in FIG. 79 was 1 nC when the power MOSFET device is manufactured as a 30-volt device, the corresponding electric charges of the element of the embodiment shown in FIG. 1 was reduced to 0.38 nC when manufactured also as a 30-volt device.

Additionally, while the LDD layer 18 of the embodiment of FIG. 1 can be formed by diffusion, since it is formed thinly on the surface of the epitaxial layer 12, the time required for the diffusion after the process of implanting n-type dopant ions is reduced and the diffusion practically does not expand horizontally so that the channel length is not changed and the distance between element 21A and element 21B does not practically change. Thus, elements 21A, 21B can be formed with the designed dimensions and the pitch of arrangement of elements can be reduced. Furthermore, since the LDD layer 18 is formed by ion implantation in a self-aligning manner after the step of forming the gate electrodes 16a, 16, using the gate electrodes 16a, 16b as masks, it is possible to accurately control the extent of overlap of the offset layer or the LDD layer 18 relative to the gate electrodes 16a, 16b so that the horizontal dimensional margins provided in the design stage to accommodate possible displacements of masks can be minimized.

In one of the MOSFET elements of FIG. 1, the MOSFET element 21A for instance, 0V is applied to the gate electrode 16a, 0V to the source electrode 19a and +30V to the drain electrode 20 in a gate-off state. Since a 30V inverse bias voltage is applied to the pn junction formed between the p-type base layer 13a and the n–type epitaxial layer 12 under this condition, the depletion layer expands into the high resistance n–type epitaxial layer 12 to a large extent to provide a sufficiently high breakdown voltage between the source electrode 19a and the drain electrode 20.

On the other hand, in a gate-on state, the 30V supply voltage is divided between the power MOSFET element 21A and a load (not shown) and typically 5V is applied forwardly between the drain electrode 20 and the source electrode 19a. If a predetermined positive control voltage is applied to the gate electrode 16a under this condition, an inversion layer appears in the channel region formed in the p type base layer 13a right below the gate electrode 16a between the n+type source region 14a and the n–type epitaxial layer 12. Therefore, electrons that are injected as carriers from the source region 14a flow into the n–type epitaxial layer 12 through the inversion layer.

Since the low resistance n-type LDD layer 18 having a resistance lower than that of the epitaxial layer 12 is formed on the surface of the epitaxial layer 12 located close to the channel region, the carriers that flow out of the inversion layer mostly go into the LDD layer 18. Since the depletion layer is mostly produced at the side of the high resistance epitaxial layer 12 but not in the low resistance LDD layer 18, the depletion layer does not expand horizontally along the LDD layer 18 covering a surface region of the epitaxial layer 12. Therefore, a carrier pathway is formed through the LDD layer 18 and then extends vertically downwardly from the lower surface of the LDD layer 18 toward the substrate 11. In other words, there is formed a positively directed electric field that extends from the LDD layer 18 toward the drain electrode 20 and electrons, or carriers, are drawn toward the drain electrode 20 by the electric field. Thus, carriers flow through the epitaxial layer 12 from the LDD layer 18 and reaches at the drain electrode 20 via the N+type substrate 11 so that an electric current flows from the drain electrode 20 toward the source electrode 19a.

The other power MOSFET element 21B operates in a similar manner so that carriers flow from the source region 14b to the LDD layer 18 by way of a channel region right below the gate electrode 16b and then toward the drain electrode 20.

Practically, a number of pairs of power MOSFET elements having a configuration same as the paired power MOSFET elements 21A, 21B illustrated in FIG. 1 are formed in a juxtaposed manner on the low resistance substrate 11 and all the MOSFET elements are connected in parallel to produce a power MOSFET device having a desired current capacity.

In the embodiment of FIG. 1, the capacitance between the source and the drain of the power MOSFET element 21A is defined by the area of the gate electrode 16a and the effective area of the epitaxial layer 12 formed of a semiconductor layer located at the drain side facing the gate electrode 16a with the gate insulating film 17a interposed between them. It will be noted that the area of the gate electrode 16a is much smaller than that of the conventional vertical type element shown in FIG. 79 so that the capacitance between the gate and the drain of the each power MOSFET element of the embodiment of FIG. 1 is very small. Therefore, it is possible to provide a power MOSFET device showing a large switching speed by using such power MOSFET elements manufactured according to the embodiment of the present invention.

In the embodiment of FIG. 1, the LDD layer 18 is formed to be very thin on a surface region of the epitaxial layer 12. However, alternatively, as shown in FIG. 2 embodiment, an LDD layer 18A having a low resistivity than that of the epitaxial layer 12 may be formed deep into the epitaxial layer 12 until its front end or a bottom surface gets to a position lower than that of the base layer 13a, for example.

With this arrangement, carriers can flow well in the LDD layer 18A to reduce the ON resistance. In the embodiment of FIG. 2, the components same or similar to those of the embodiment of FIG. 1 are denoted respectively by the same reference symbols and will not be described any further.

FIG. 3 shows an embodiment wherein an n-type low resistance intermediary layer 18B is formed between the base layers 13a, 13b under the LDD layer 18. The depth of the layer 18B is formed to be similar to those of the base layers 13a, 13b. In other words, the LDD layer 18A of FIG. 2 is not formed but the intermediary layer 18B is formed with a bottom surface reached at the depth similar to the bottoms of the base layers 13a, 13b. The dopant concentration of the intermediary layer 18B is so selected that it is lower than that of the LDD layer 18 but higher than that of the epitaxial layer 12. As a result, the extent of the depletion layer extending from the pn junction right below the gate electrode 16a is made smaller than that of the embodiments of FIGS. 1 and 2 so that carriers can easily flow from the LDD layer 18 into the low resistance intermediary layer 18B and the ON resistance can be reduced further.

Figure 4:
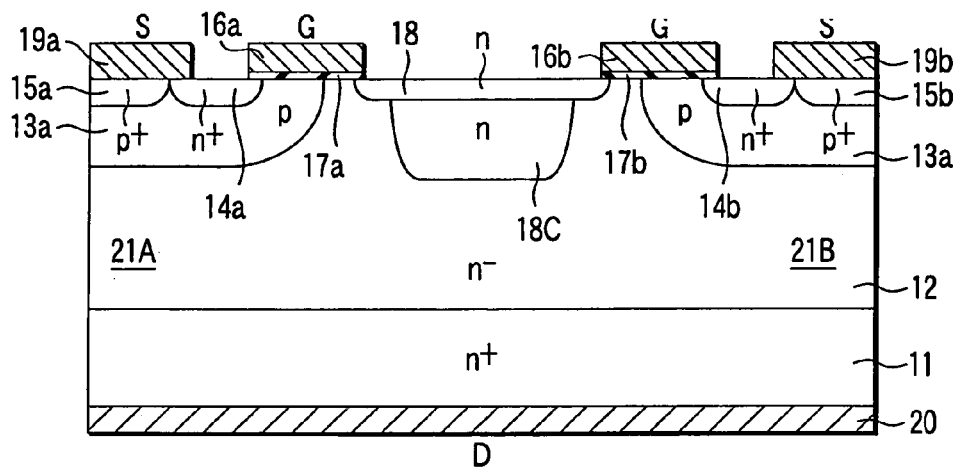
FIG. 4 is a schematic cross sectional view of still further embodiment of the invention.

The embodiment of FIG. 4 is obtained by modifying that of FIG. 2. It comprises a thick n-type current conducting layer 18C formed under the thin LDD layer 18. The dopant concentration of the current conducting layer 18C may be the same as or slightly lower than that of the LDD layer 18. With this arrangement, the ON resistance can be reduced as in the case of the embodiment of FIG. 2.

In all the embodiments of FIGS. 1 through 4, the epitaxial layer 12 is so formed as to contact with the base layer 13a so that a depletion layer is produced at the side of the epitaxial layer 12 from the pn junction between the epitaxial layer 12 and the base layer 13a, thereby improving the breakdown voltage between the source and the drain. However, it may be noted that a large depletion layer is not required to be produced in the n-type epitaxial layer when a power MOSFET device is formed as a low-voltage device.

Figure 5:
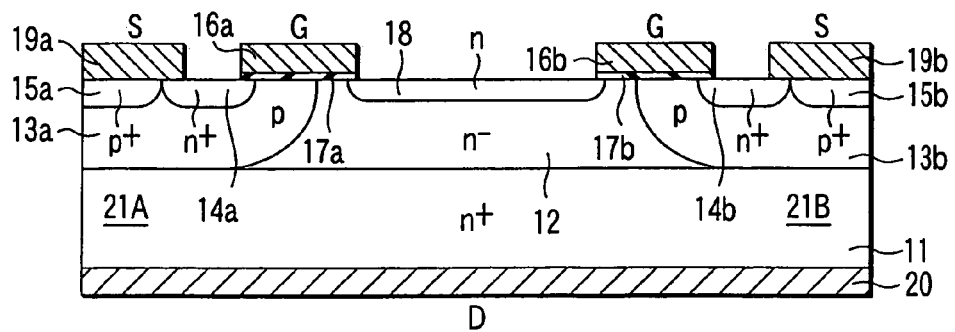
FIG. 5 is a schematic cross sectional view of still another embodiment of the invention.

FIG. 5 shows an embodiment in which a low-voltage device is manufactured. As seen from FIG. 5, the thickness or height of the epitaxial layer 12 is made smaller than that of the embodiment of FIG. 1 and the bottom surfaces of the base layers 13a, 13b are made to contact with the boundary of the epitaxial layer 12 and the low resistance substrate 11. Otherwise, the embodiment of FIG. 5 is identical with that of FIG. 1 and hence will not be described any further.

During the OFF time of the embodiment of FIG. 5, the inverted bias voltage of about 20V from the power source is directly applied across the drain electrode 20 and the source electrode 19a. More specifically, this voltage is applied across the p-type base layer 13a and the n-type substrate 11 and the epitaxial layer 12. Since the resistance of the substrate 11 is lower than that of the epitaxial layer 12, the depletion layer is mainly extended in the side of the epitaxial layer 12. Usually, a breakdown between the source and the drain of a power MOSFET often takes place on the surface of the substrate below the gate electrode. However, a thick depletion layer expands in the epitaxial layer 12 in an area right below the gate electrode 16a of this embodiment so that the breakdown voltage will not be so lowered even if the epitaxial layer 12 is made thinner than that of the embodiments of FIGS. 1 through 4.

As described above, the breakdown voltage of the embodiment of FIG. 5 is about 20V, which is relatively low if compared with that of any of the embodiments in FIGS. 1 through 4, which is about 30V. However, the ON-resistance will be reduced further because the height of the high resistance epitaxial layer is made further smaller than those of the embodiments of FIGS. 1 through 4.

Now, the manufacturing process of a power MOSFET element 21A as shown in FIG. 1 will be described below by referring to FIGS. 6A through 9B. While the other power MOSFET element 21B of FIG. 1 is manufactured with the element 21A simultaneously, the manufacturing process will be described only in terms of the element 21A for the purpose of simplicity.

Figure 6A:
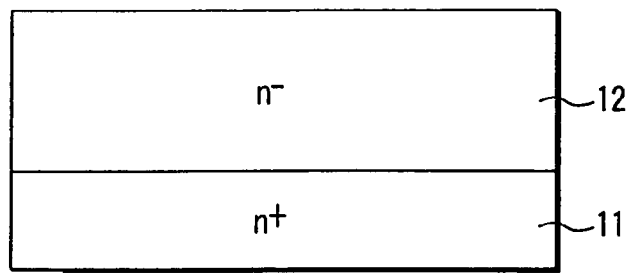
FIGS. 6A through 6D are schematic cross sectional views of the first embodiment of the invention, showing different steps of the manufacturing process.

Referring to FIG. 6A, an epitaxial layer 12 is formed on an n+silicon substrate 11 by epitaxial growth.

Figure 6B:
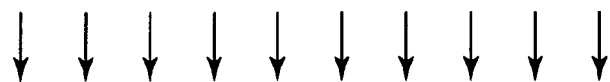
Figure 6B:
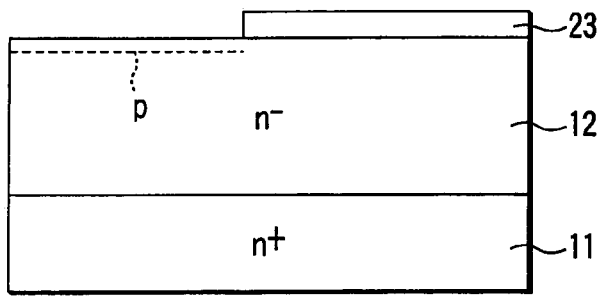

Then, as shown in FIG. 6B, the entire surface of the epitaxial layer 12 is covered with a resist film and exposed to light with an exposure mask placed thereon. Thereafter, the resist film is photo-graphically developed to produce a resist pattern 23 so that a region for forming a base layer 13a on the surface of the epitaxial layer 12 becomes exposed. Under this condition, p-type dopant ions are implanted into the epitaxial layer 12 to a predetermined depth indicated by a broken line in FIG. 6B at a predetermined dose.

Figure 6C:
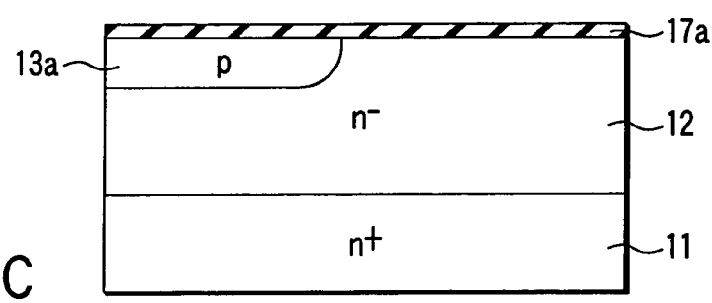

Thereafter, as shown in FIG. 6C, the implanted ions are heated to diffuse and produce a p-type base layer 13a there. After removing the resist pattern 23, a gate oxide film 17a is formed on the entire surface of the epitaxial layer 12.

Figure 6D:
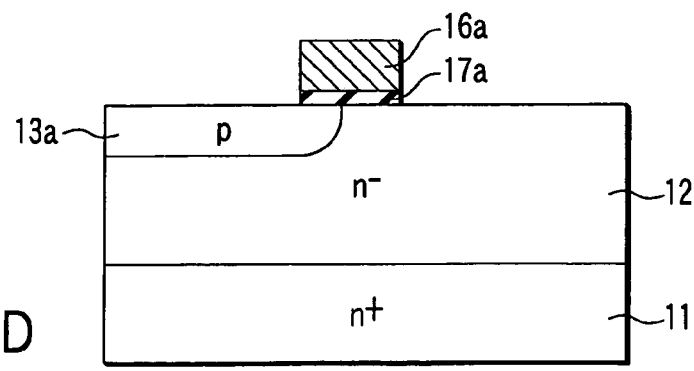

Then, a polysilicon film is formed on the entire surface of the gate oxide film 17a for the purpose of forming a gate electrode and, after forming resist film on the polysilicon film, the resist film is subjected to a patterning operation. As a result, a resist pattern is formed only on the gate electrode 16a as shown in FIG. 6D. Then, the pattern of a gate electrode 16a and a gate insulating film 17a is formed by selective etching. The area where the gate electrode 16a and the gate insulating film 17a are formed corresponds to the area where the boundary of the base layer 13a and the epitaxial layer 12 is located below the gate electrode 16a.

Figure 7A:
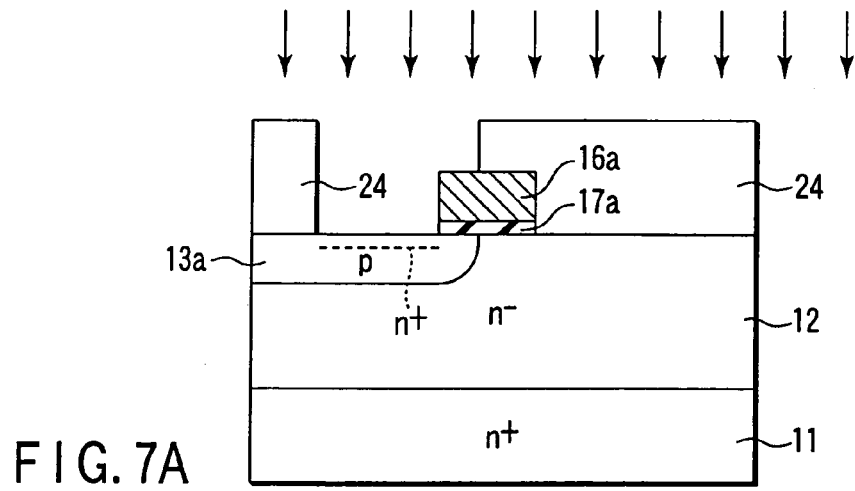
FIGS. 7A through 7C are schematic cross sectional views of the embodiment of FIGS. 6A through 6D, showing subsequent steps of the manufacturing process.

Then, as shown in FIG. 7A, a resist pattern 24 having an opening corresponding to a region for forming a source region 14a is formed and n+ions are implanted into an area indicated by a broken line in FIG. 7A.

Figure 7B:
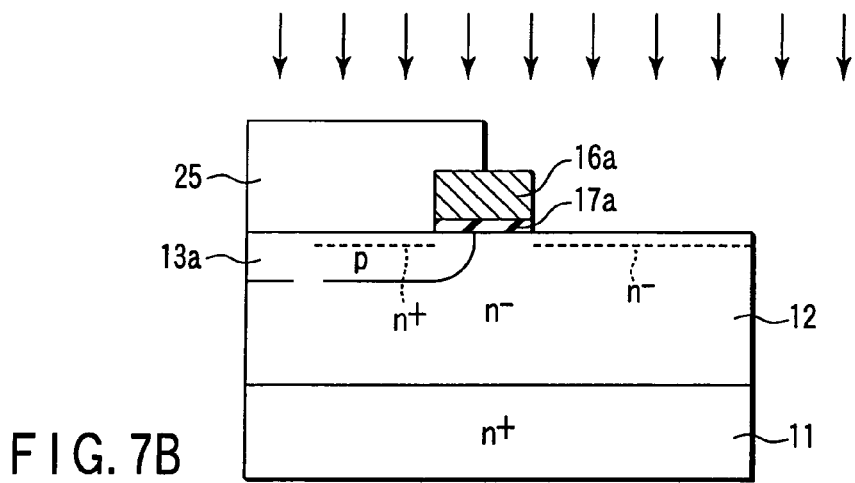

Thereafter, as shown in FIG. 7B, the resist pattern 24 is removed and another resist pattern 25 is formed to cover the source forming region. Then, P+(Phosphorus) ions are implanted into an area indicated by a broken line in FIG. 7B, which is the area where an LDD layer 18 is to be formed, in a self-aligning manner by using the gate electrode 16a as a mask. Furthermore, after removing the resist pattern 25, another resist pattern 26 having an opening corresponding to a region for forming a p+layer 15a is formed and B+ions are implanted into an area indicated by a broken line in FIG. 7C.

Figure 10:
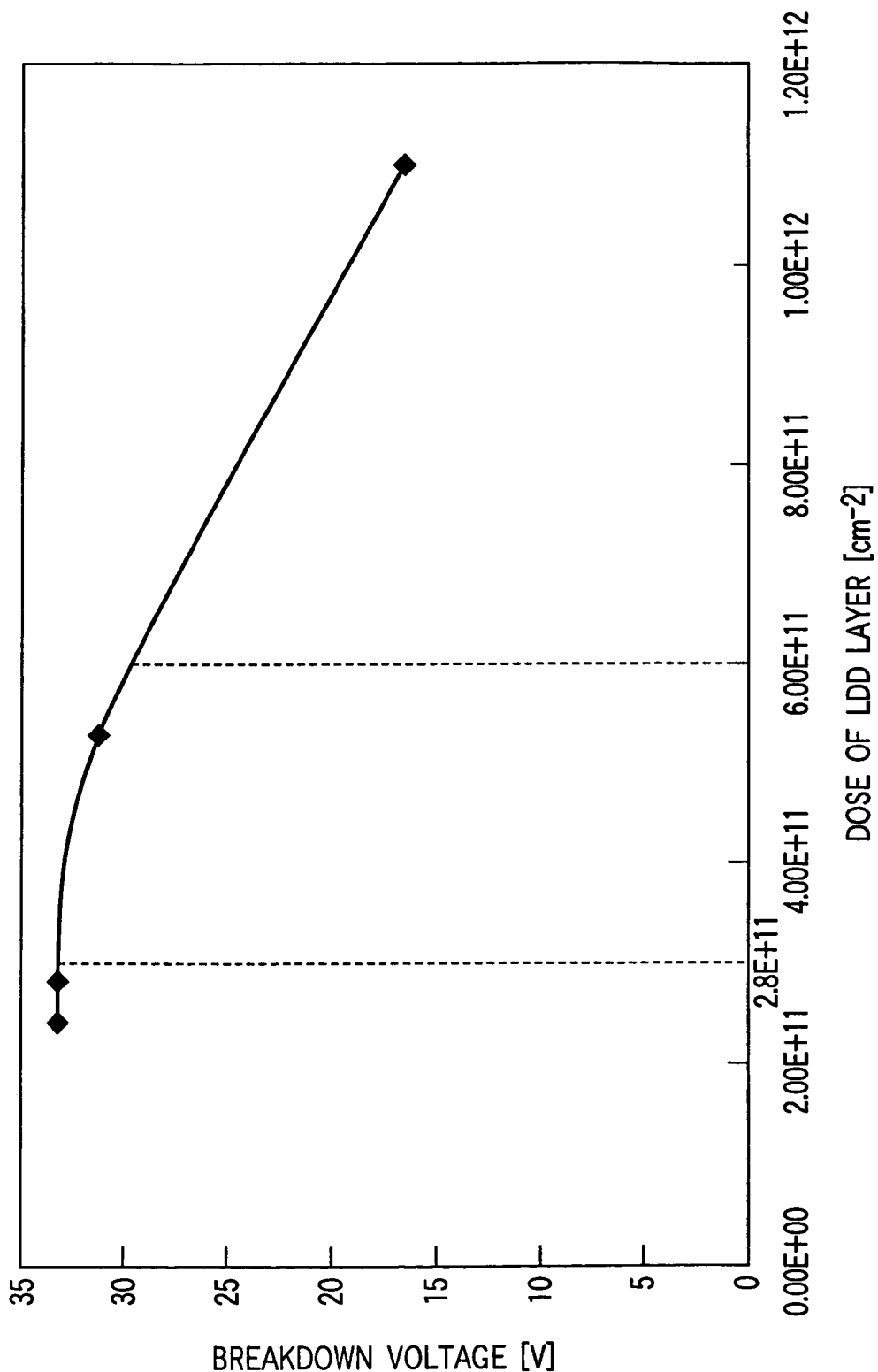
FIG. 10 is a graph illustrating the relationship between the withstanding voltage and the dose of the LDD layer of the first embodiment of the invention.

The rate at which P+ions are implanted, or the dose, for forming an LDD layer 18 needs to be not higher than $6 \times 10^{11}/cm^2$ when the power MOSFET element 21A is of the type showing a breakdown voltage of 30V as will be described in greater detail hereinafter by referring to FIG. 10.

Figure 11:
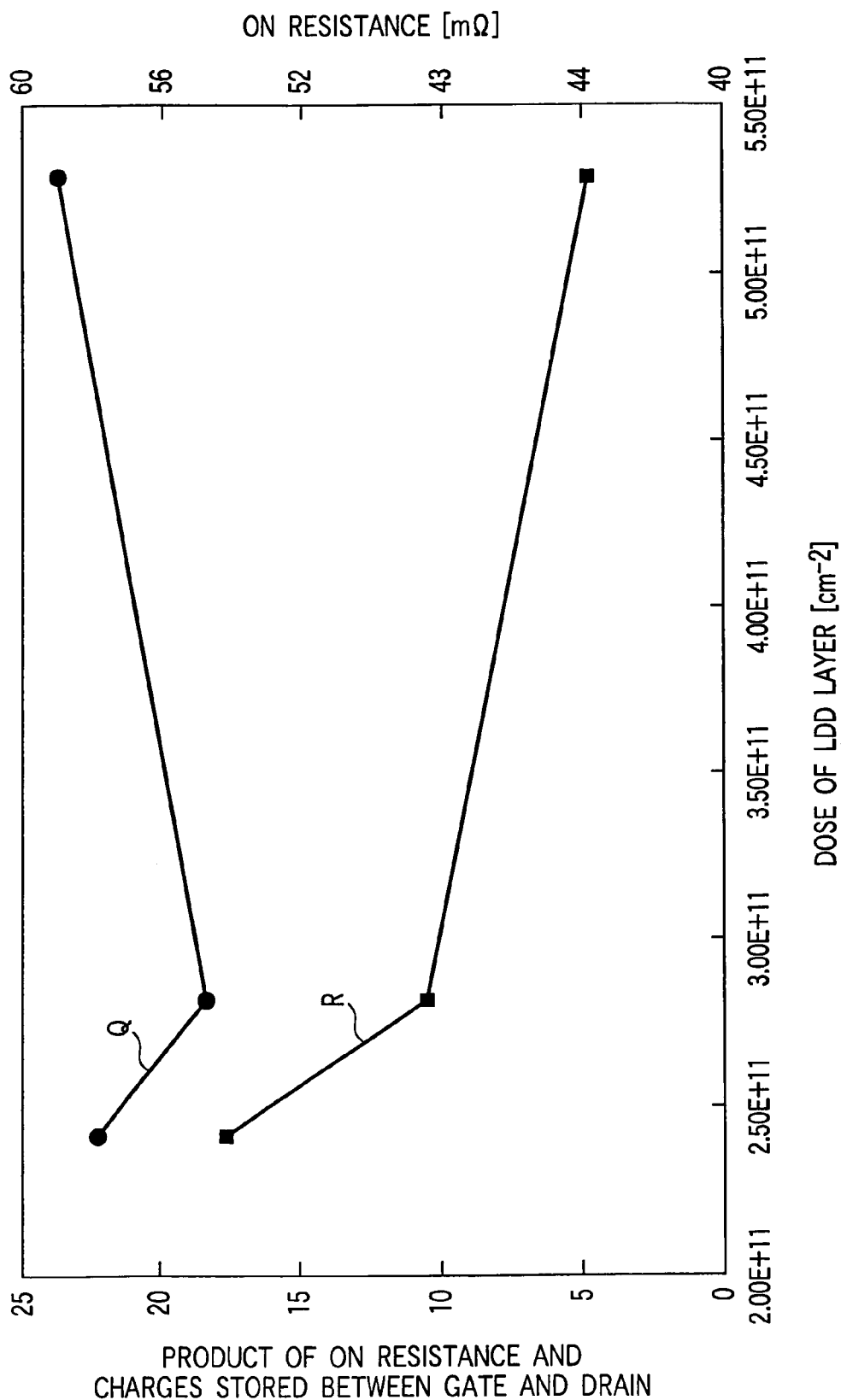
FIG. 11 is a graph illustrating the relationship of the ON-resistance, the capacitance between the gate and the drain and the dose of the LDD layer of the first embodiment of the invention.

In FIG. 11, graph Q shows the relationship between the dose of the LDD layer 18 and the product of ON resistance and the electric charges stored between the gate and the drain, whereas graph R shows the relationship between the dose and the ON resistance. From the graph R, it will be seen that the ON resistance gradually falls when the dose exceeds $2.8 \times 10^{11}/cm^2$. On the other hand, the graph Q evidences that the stored electric charges are minimized when the dose is equal to $2.8 \times 10^{11}/cm^2$ and gradually increases thereafter. Therefore, the product of the ON resistance and the charges is minimized at the dose of $2.8 \times 10^{11}/cm^2$ so that a power MOSFET element whose accumulated electric charge and ON resistance are both satisfactory can be obtained by using a dose of about $2.8 \times 10^{11}/cm^2$.

Figure 12:
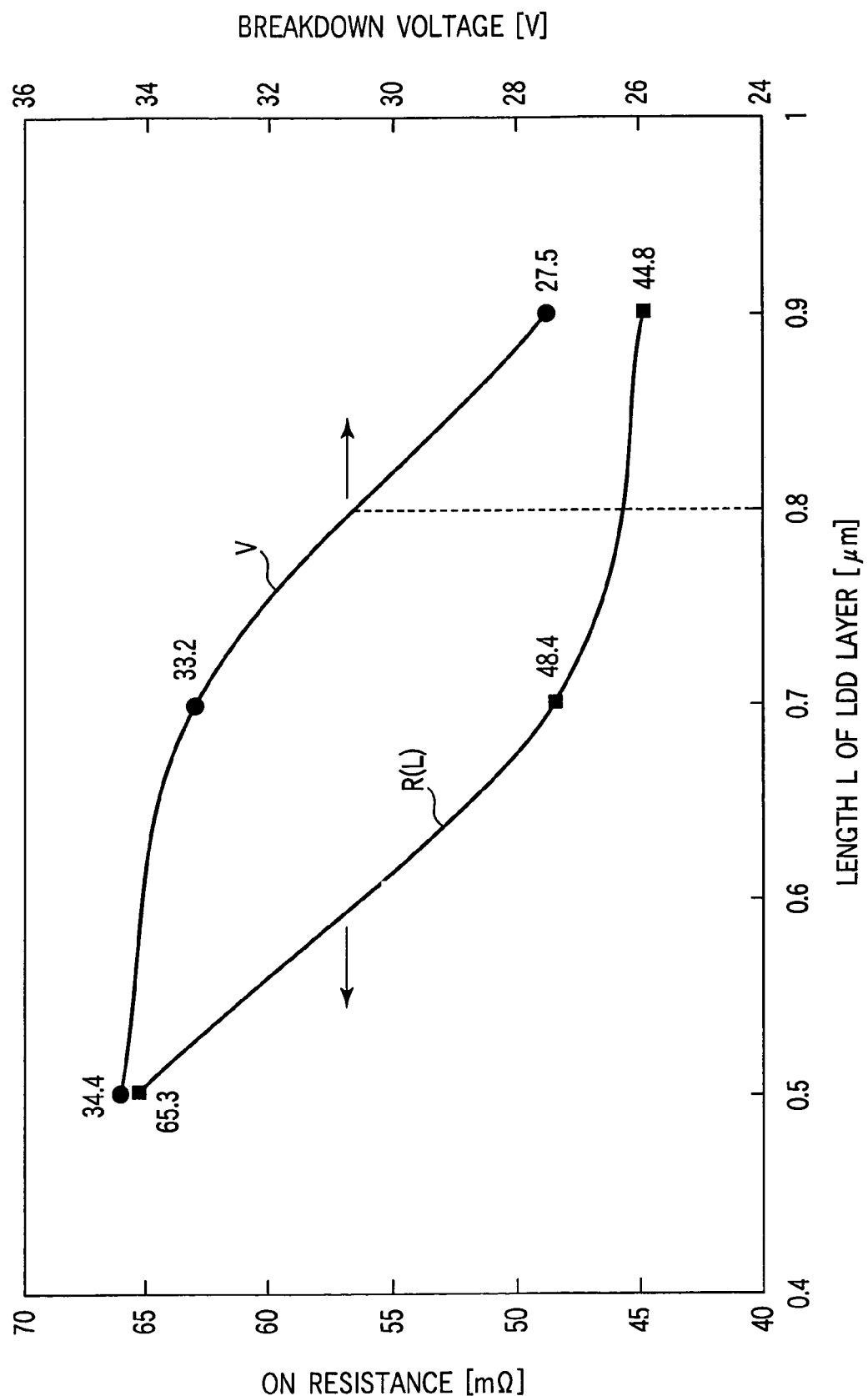
FIG. 12 is a graph illustrating the relationship of the ON-resistance, the length of the LDD layer and the withstanding voltage of the first embodiment of the invention.

In FIG. 12, graph R(L) shows the relationship between the length of the LDD layer 18, or the distance L between the middle point of the two gate electrodes 16a, 16b of the embodiment of FIG. 1, and the ON resistance, whereas graph V shows the relationship between the distance L and the breakdown voltage.

As seen from the breakdown voltage graph V, the breakdown voltage is slightly higher than 30V when the length L of the LDD layer 18 is 0.8 μm to suggest that the length L of the LDD layer 18 is preferably less than 0.8 μm. However, the ON resistance graph R(L) shows that the ON resistance increases largely when the length L falls short of 0.7 μm to evidence that a value less than 0.7 μm is not acceptable for the length L of the LDD layer. Thus, it is appropriate to select a value between 0.7 μm and 0.8 μm for the length L and a value close to 0.7 μm is preferably from the viewpoint of the breakdown voltage of the element.

Figure 7C:
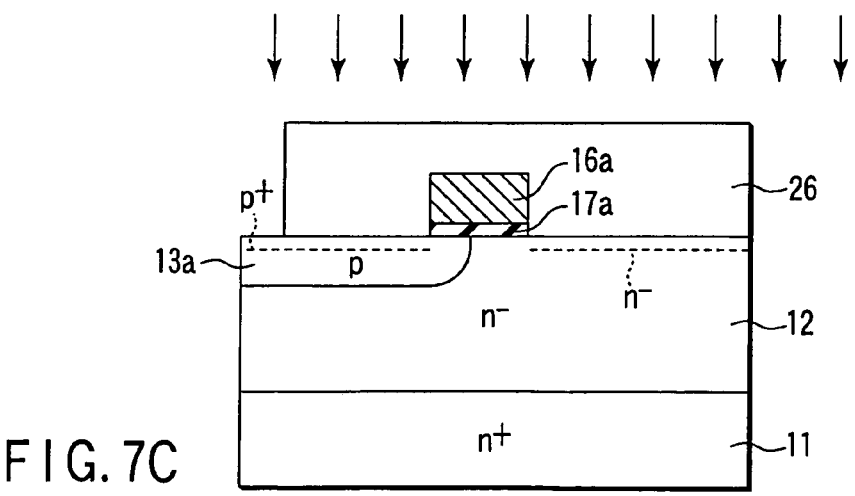
Figure 8A:
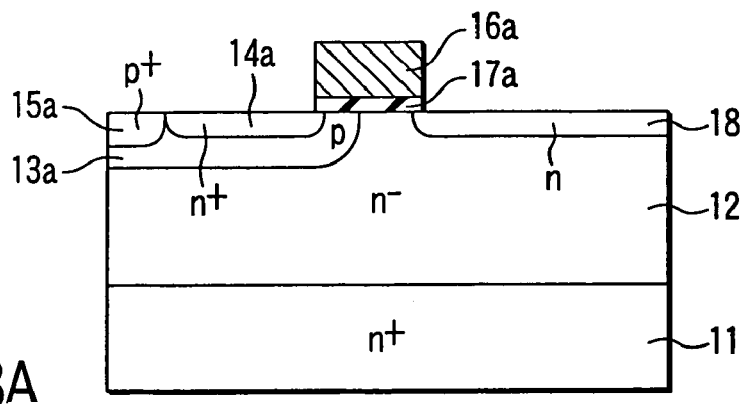
FIGS. 8A through 8C are schematic cross sectional views of the embodiment of FIGS. 6A through 6D, showing further steps of the manufacturing process.

After the step of FIG. 7C, the work is annealed at a predetermined temperature to diffuse the implanted ions and produce a source region 14a, a p+layer 15a and an LDD layer 18, as shown in FIG. 8A.

Figure 8B:
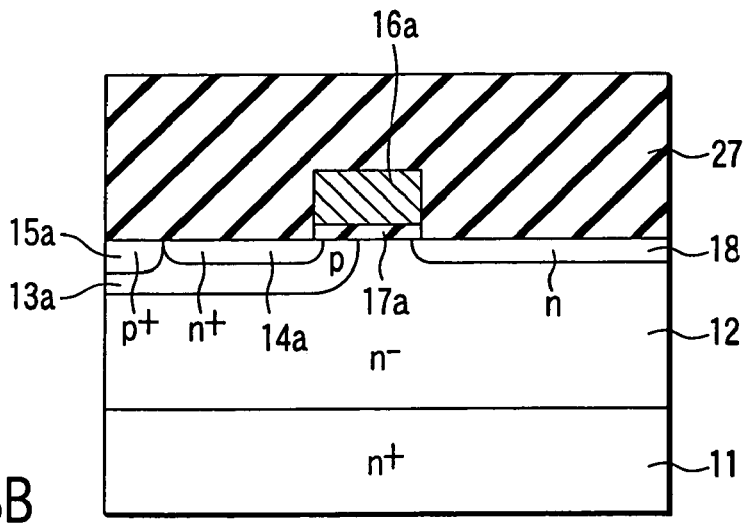
Figure 8C:
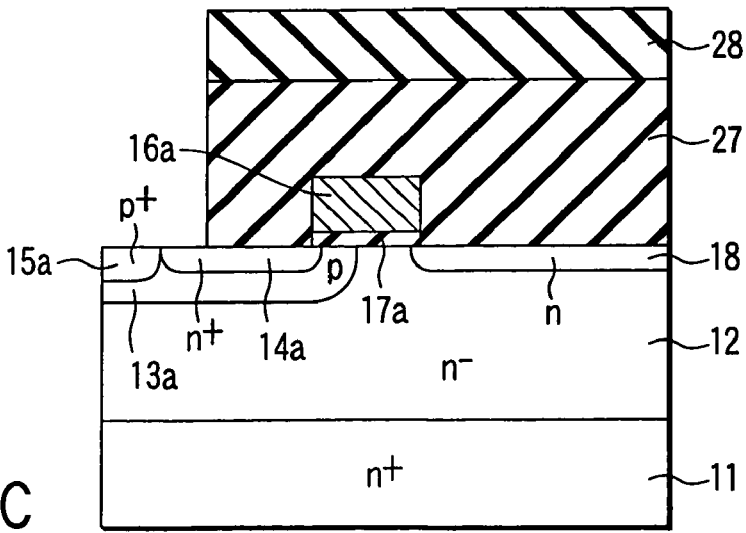

Then, as shown in FIG. 8B, an interlayer insulating film 27 is formed on the entire surface of the substrate to a predetermined height and subsequently, as shown in FIG. 8C, a resist pattern 28 having an opening for a region where a source electrode 19a is to be formed is prepared. Thereafter, the interlayer insulating film 27 is selectively etched by using the resist pattern 28 as a mask.

Figure 9A:
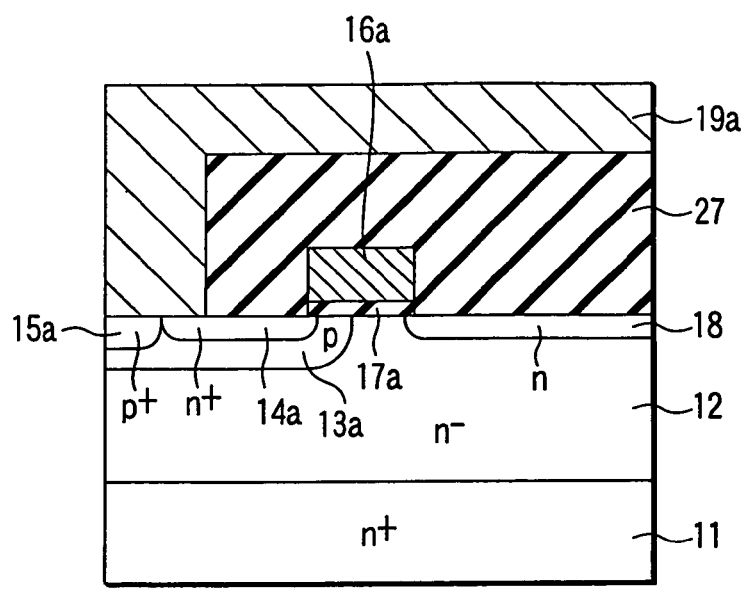
FIGS. 9A and 9B are schematic cross sectional views of the embodiment of FIGS. 6A through 6D, showing still further steps of the manufacturing process.

Subsequently, as shown in FIG. 9A, a source electrode 19a is formed in such a way that it is led out from the source region 14a and the p+layer 15a onto the interlayer insulating film 27.

Figure 9B:
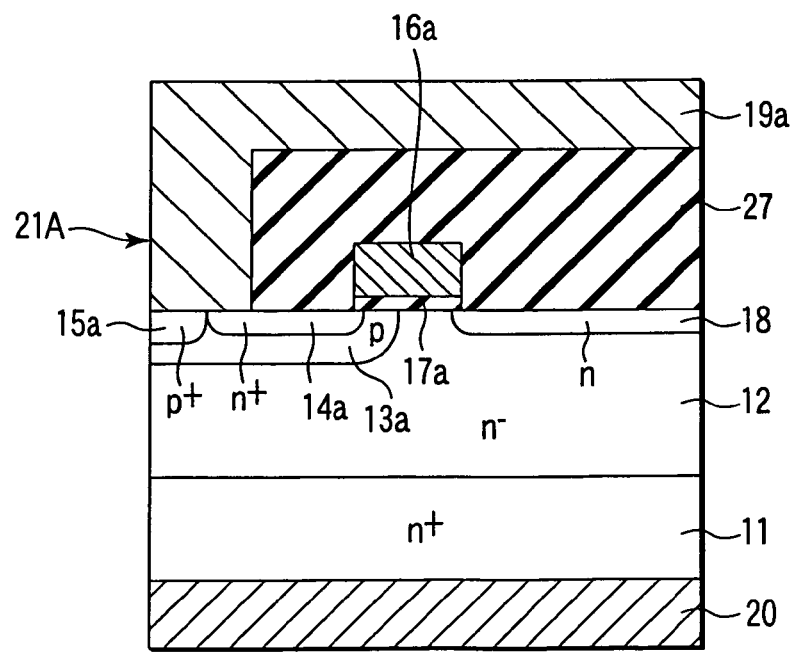

Finally, as shown in FIG. 9B, a drain electrode 20 is formed on the entire lower surface of the n+substrate 11 to complete the process of forming a power MOSFET element 21A shown in FIG. 1.

All the embodiments shown in FIGS. 2 through 5 can be produced by means of a manufacturing process substantially similar as the one for manufacturing the embodiment of FIG. 1.

Namely, in the case of the embodiment of FIG. 2, the thick LDD layer 18A can be formed by implanting n−ions to a position deeper than the case for forming the LDD layer 18 of FIG. 1 without significantly lengthing the heating time for the annealing step.

The embodiment structure of FIG. 3 can be produced by forming an epitaxial layer 12 and subsequently forming an n type layer 18B on the surface thereof. The remaining steps are the same as the corresponding ones in FIG. 6A through FIG. 9B.

In the case of the embodiment of FIG. 4, the ion implantation step for forming a deep current conducting layer 18C is followed by an ion implantation step for forming a shallow LDD layer 18. Subsequently, the deep current conducting layer 18C and the shallow LDD layer 18 are simultaneously produced in a heating and annealing step.

The embodiment of FIG. 5 can be produced by forming a thin epitaxial layer 12 on an n+substrate 11. The remaining steps are the same as the corresponding ones for producing the embodiment of FIG. 1.

Second Embodiment

Figure 13:
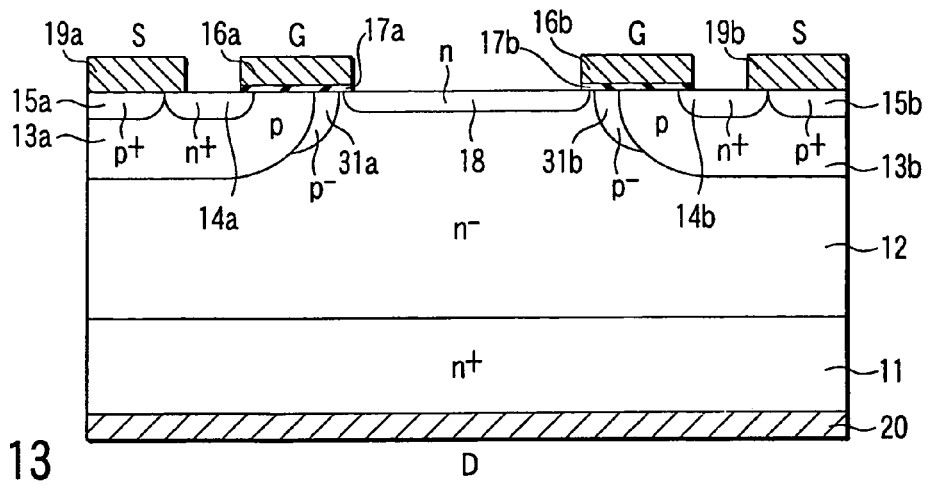
FIG. 13 is a schematic cross sectional view of still another embodiment of the invention.

The embodiment of FIG. 13 is realized by substantially entirely covering the surface areas of portions of the epitaxial layer 12 remaining between the channel region of the base layers 13a under the respective gate electrodes 16a, 16b with p-type extension layers 31a, 31b extending from the front ends of the p base layers 13a, 13b, respectively.

The extension layers 31a, 31b are respectively so formed as to extend from the corresponding sides of the base layers 13a, 13b facing the LDD layer 18 toward the latter. The lower ends of the extension layers 31a, 31b are located at positions shallower than the base layers 13a, 13b. Otherwise, this embodiment is identical with that of FIG. 1 and hence the components are denoted by the same reference symbols and will not be described any further.

With this second embodiment, the capacitance between the gate and the drain can be reduced further because the area over which the gate electrodes 16a, 16b and the n−epitaxial layer 12 are disposed oppositely is substantially reduced by arranging the p−extension layers 31a, 31b. Additionally, while the depletion layer formed in an OFF state is reduced right below the gate electrode 16a, it is extended from the pn junction between the extension layer 31a and the epitaxial layer 12 into the latter so that the effective distance between the source electrode 19a and the drain electrode 20 below the gate electrode 16a is extended and the arrangement of the second embodiment does not degrade the breakdown voltage.

FIGS. 14 through 22 illustrate different embodiments realized by modifying the embodiment of FIG. 13. The components of these embodiments that are the same as or similar to those of the embodiment of FIG. 13 are denoted respectively by the same reference symbols and will not be described any further.

Figure 14:
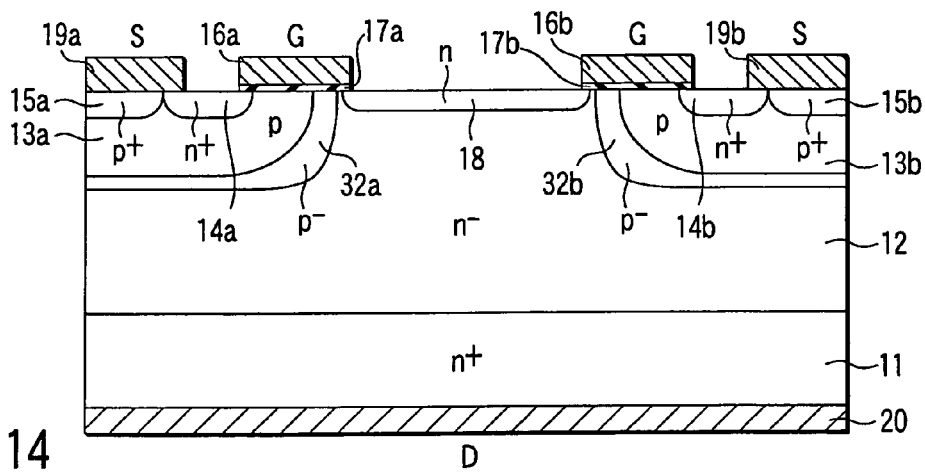
FIG. 14 is a schematic cross sectional view of still further embodiment of the invention.

In the embodiment of FIG. 14, the p−extension layers 32a, 32b completely covers the lower surfaces of the base layers 13a, 13b in addition to an area right below the gate electrode 16a. With this arrangement, the capacitance between the gate and the drain can be further reduced.

Figure 15:
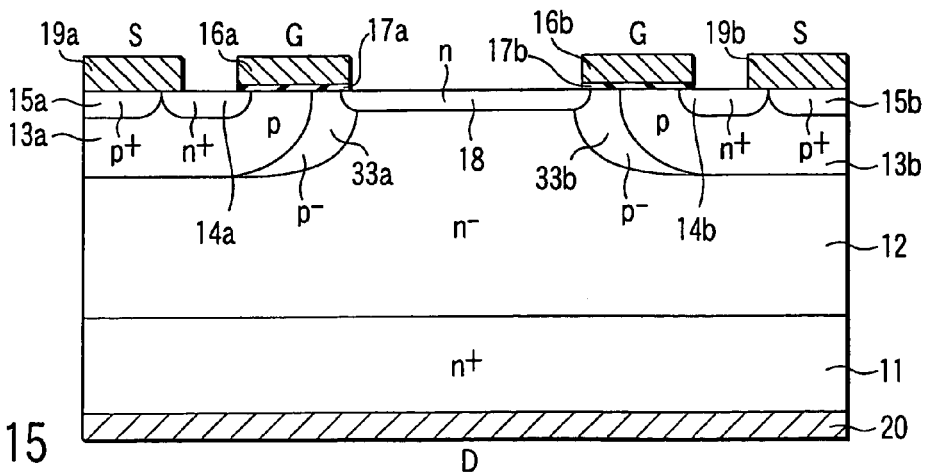
FIG. 15 is a schematic cross sectional view of still another embodiment of the invention.

In the embodiment of FIG. 15, the extension layers 33a, 33b differs from the extension layers 31a, 31b of the embodiment of FIG. 13 in that they are extended further to a depth substantially the same as that of the base layers 13a, 13b and the horizontal front ends thereof overlap the corresponding lateral sides of the LDD layer 18. As a result, the surface regions of the epitaxial layer 12 located below the gate electrodes 16a, 16b are completely covered by the extension layers 33a, 33b to further reduce the capacitance between the gate and the drain.

Figure 16:
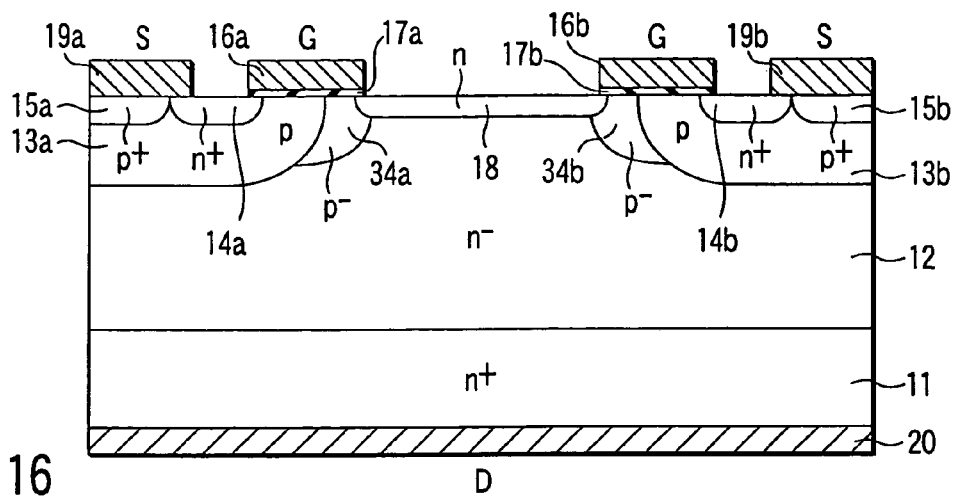
FIG. 16 is a schematic cross sectional view of still another embodiment of the invention.

In the embodiment of FIG. 16, the extension layers 34a, 34b are located at a slightly shallow level if compared with their counterparts of the embodiment of FIG. 15. Therefore, the capacitance between the gate and the drain of this embodiment may be slightly greater than that of the embodiment of FIG. 15, it is still much smaller than that of the embodiment of FIG. 13.

Figure 17:
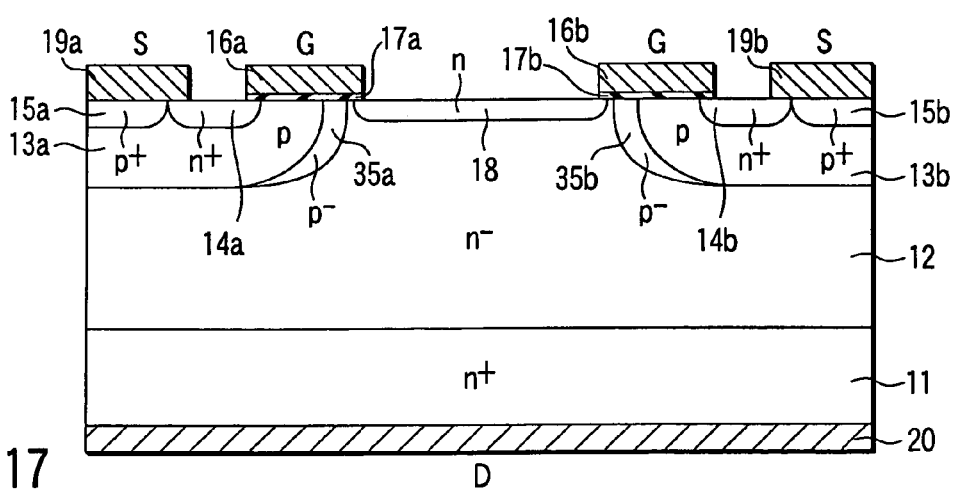
FIG. 17 is a schematic cross sectional view of still another embodiment of the invention.

In the embodiment of FIG. 17, the extension layers 35a, 35b differs from the extension layers 31a, 31b of the embodiment of FIG. 13 in that the bottom front ends thereof are extended to reach at the bottom level of the base layers 13a, 13b. The embodiments of FIGS. 17 and 18 are formed by using the manufacturing steps illustrated in FIGS. 24A through 27.

Figure 18:
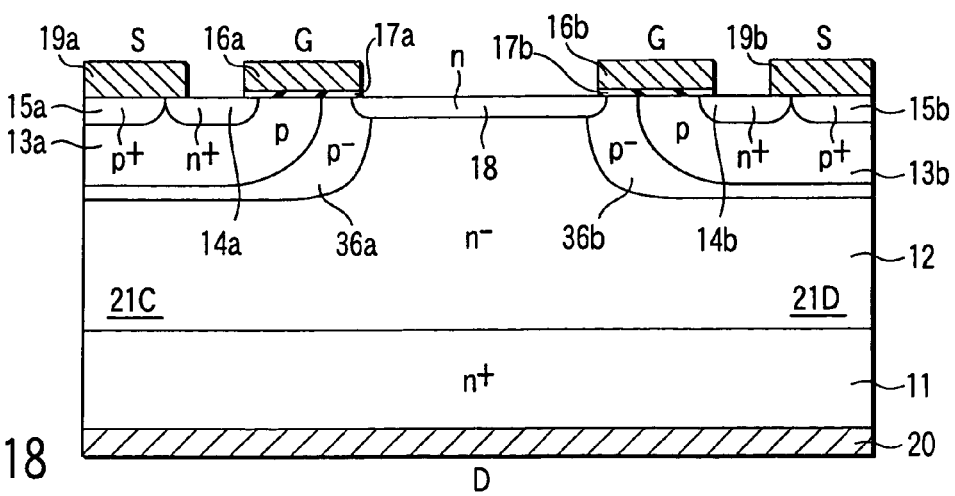
FIG. 18 is a schematic cross sectional view of still another embodiment of the invention.

In the embodiment of FIG. 18, the p−extension layers 36a, 36b completely cover the respective bottom surfaces of the base layers 13a, 13b and the horizontal front ends thereof overlaps the corresponding lateral sides of the LDD layer 18.

FIGS. 19 through 22 illustrate a variety of modified embodiments of the low voltage type power MOSFET element having the similar basic structure as shown in FIG. 5 by forming a thin n−epitaxial layer 12 on the n+substrate 11 and the bottom end of the p base layers 13a, 13b are extended to reach at the epitaxial layer 12.

Figure 19:
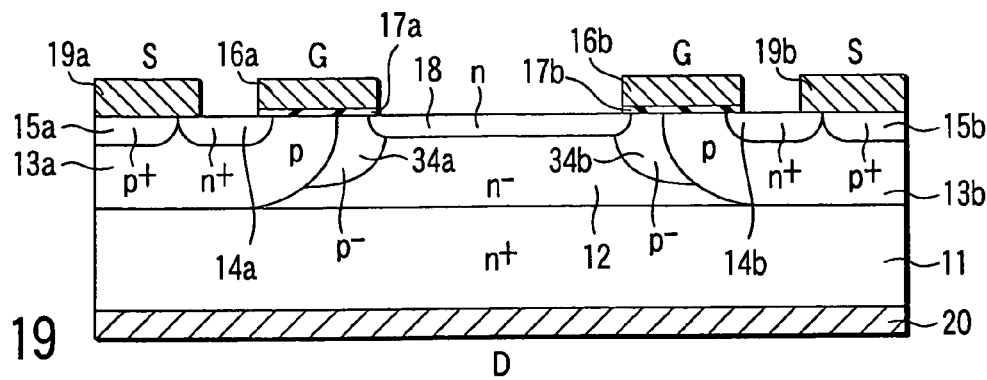
FIG. 19 is a schematic cross sectional view of still another embodiment of the invention.
Figure 20:
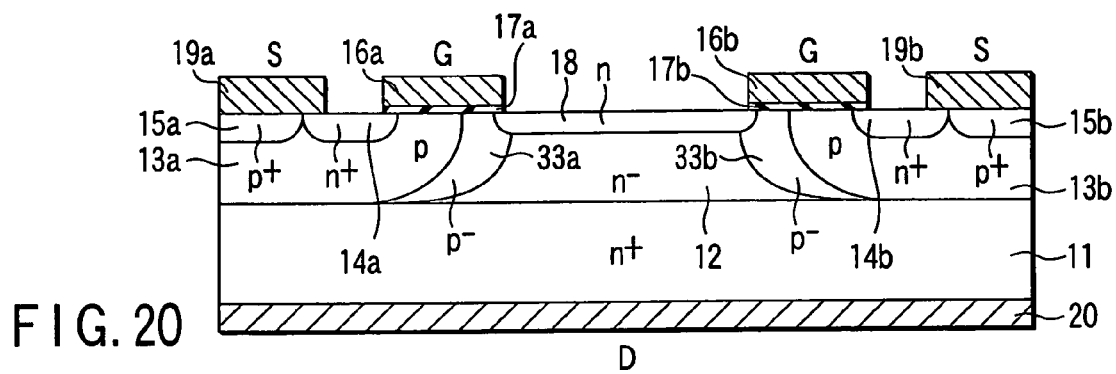
FIG. 20 is a schematic cross sectional view of still another embodiment of the invention.
Figure 21:
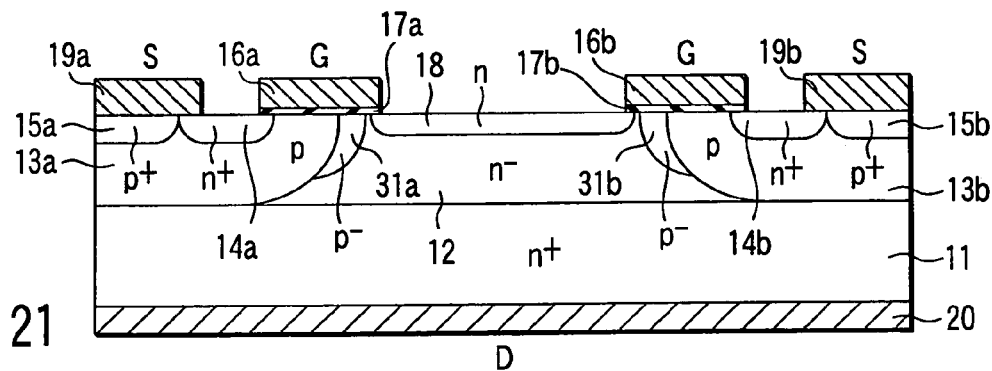
FIG. 21 is a schematic cross sectional view of still another embodiment of the invention.
Figure 22:
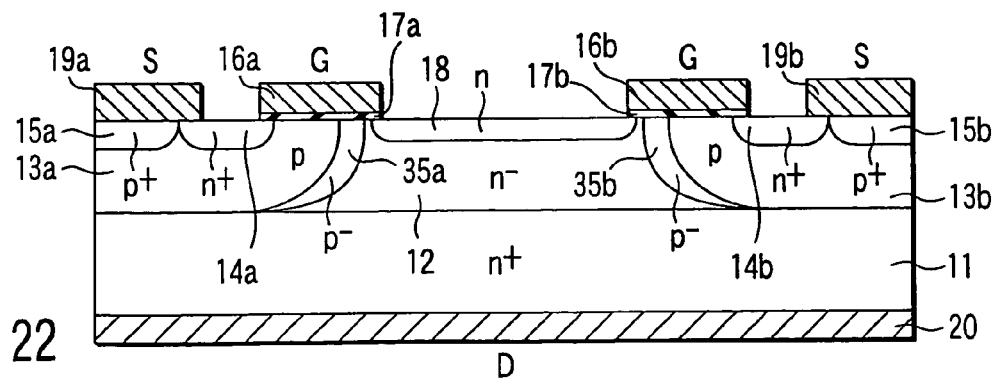
FIG. 22 is a schematic cross sectional view of still another embodiment of the invention.

The p-type extension layers 34a, 34b of the embodiment of FIG. 19 are formed in the similar manner as the extension layers 34a, 34b of the embodiment of FIG. 16 and those of the embodiment of FIG. 20 are the similar to that of the extension layers 33a, 33b of the embodiment of FIG. 15, whereas the extension layers of the embodiment of FIG. 21 are the same as the extension layers 31a, 31b of the embodiment of FIG. 13 and those of the embodiment of FIG. 22 are the same as the extension layers 35a, 35b of the embodiment of FIG. 17. While the embodiments of FIGS. 19 through 22 may have respective breakdown voltages that are slightly lower than those of the corresponding embodiments of FIGS. 16, 20, 15, 13 and 17, they show reduced respective ON resistances in addition to the effect of reducing the capacitance between the gate and the drain as described above by referring to the preceding embodiments.

Now, the manufacturing process of a power MOSFET element 21C as shown in FIG. 18 will be described below by referring to FIGS. 23A through 27. While the other power MOSFET element 21D of FIG. 18 is manufactured with the element 21C simultaneously, the manufacturing process will be described only in terms of the element 21C for the purpose of simplicity.

Figure 23A:
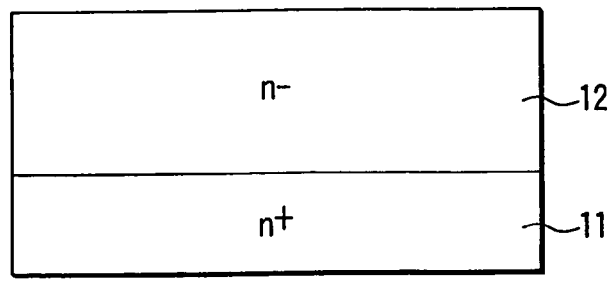
FIGS. 23A through 23D are schematic cross sectional views of the embodiment of FIG. 18, showing different steps of the manufacturing process.

Referring to FIG. 23A, an epitaxial layer 12 is formed on an n+silicon substrate 11 by epitaxial growth.

Figure 23B:
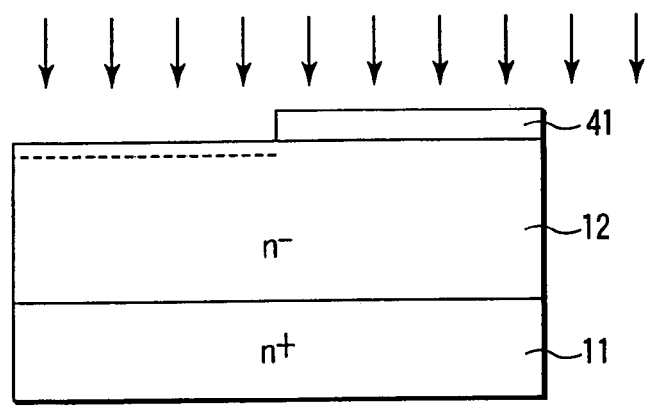

Then, as shown in FIG. 23B, the entire upper surface of the epitaxial layer 12 is covered with a resist film and exposed to light with an exposure mask placed thereon to produce a resist pattern 41 so that a region for forming a base layer 13a on the surface of the epitaxial layer 12 becomes exposed. Under this condition, p-type dopant ions are implanted into the epitaxial layer 12 to a predetermined depth indicated by a broken line in FIG. 23B by using the resist pattern 41 as a mask.

Figure 23C:
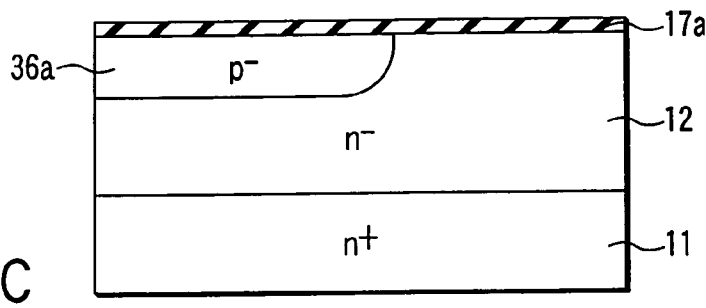

Thereafter, as shown in FIG. 23C, the implanted ions are heated to diffuse and produce a p-type extension layer 36a there. After removing the resist pattern 41, a gate oxide film 17a is formed on the entire surface of the epitaxial layer 12.

Figure 23D:
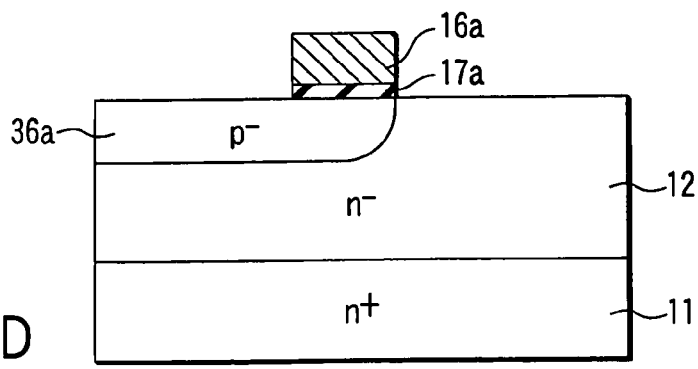

Then, a polysilicon film is formed on the entire surface of the gate oxide film 17a for the purpose of forming a gate electrode and, after forming resist film thereon, the resist film is subjected to a patterning operation with an exposure mask. As a result, a resist pattern is found only on the gate electrode 16a as shown in FIG. 23D. Then, the pattern of a gate electrode 16a and a gate insulating film 17a is formed by selective etching. The area where the gate electrode 16a and the gate insulating film 17a are formed corresponds to the area where the boundary of the extension layer 36a and the epitaxial layer 12 comes to agree with a front end of the gate electrode 16a.

Figure 24A:
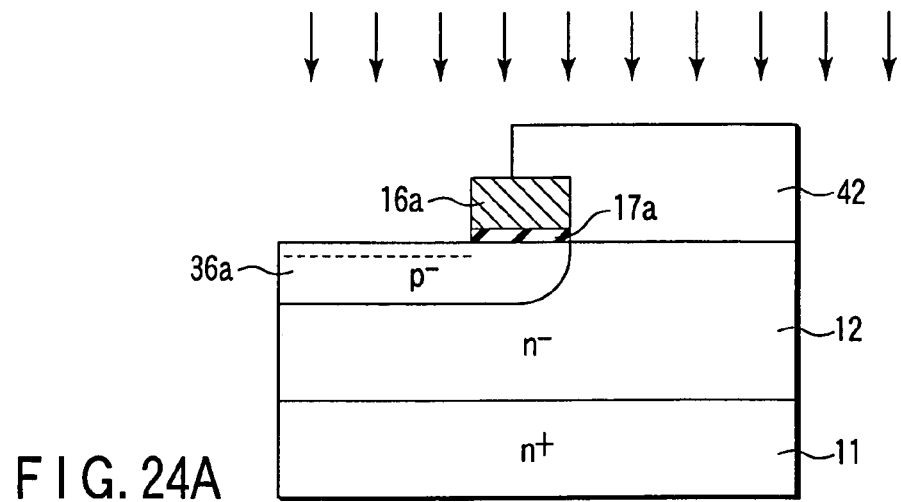
FIGS. 24A through 24C are schematic cross sectional views of the embodiment of FIG. 18, showing subsequent steps of the manufacturing process shown in FIGS. 23A through 23D.

Then, as shown in FIG. 24A, a resist pattern 42 having an opening corresponding to a region for forming a p−base layer 13a is formed and B+ions are implanted into an area in the p−layer 36a indicated by a broken line in FIG. 24A.

Figure 24B:
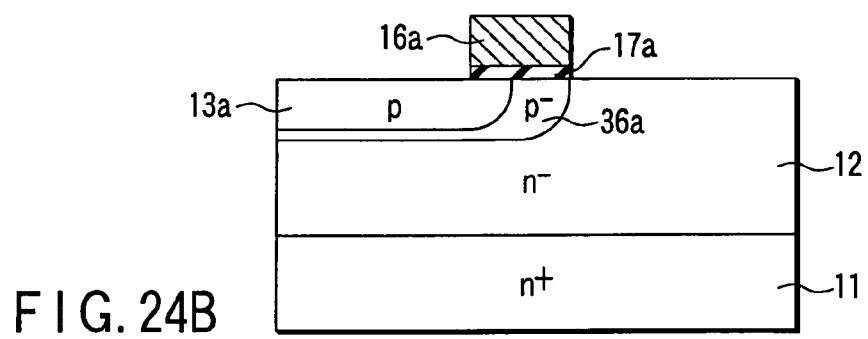

Thereafter, as shown in FIG. 24B, the resist pattern 42 is removed and an annealing operation is conducted to produce a p−base layer 13a.

Figure 24C:
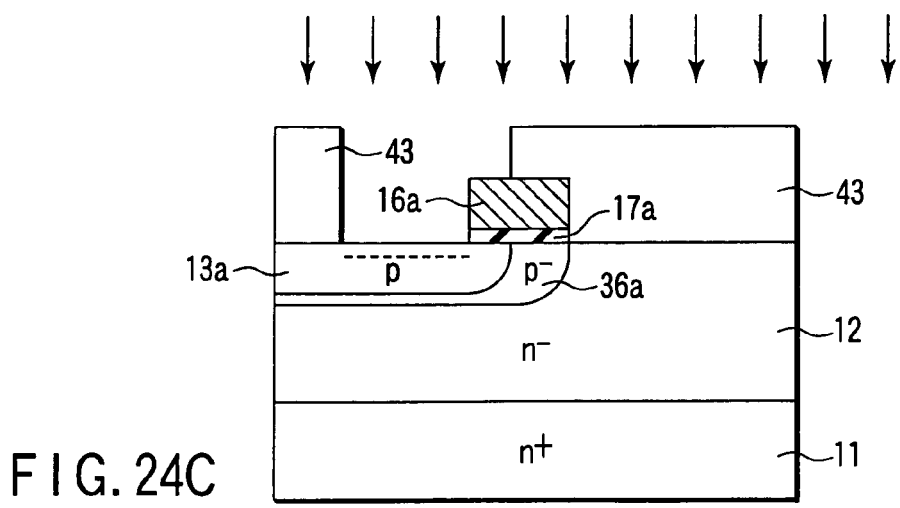

Then, as shown in FIG. 24C, a resist pattern 43 having an opening corresponding to a region for forming a source region 14a is formed and As+ions are implanted into an area indicated by a broken line in FIG. 24C.

Figure 25A:
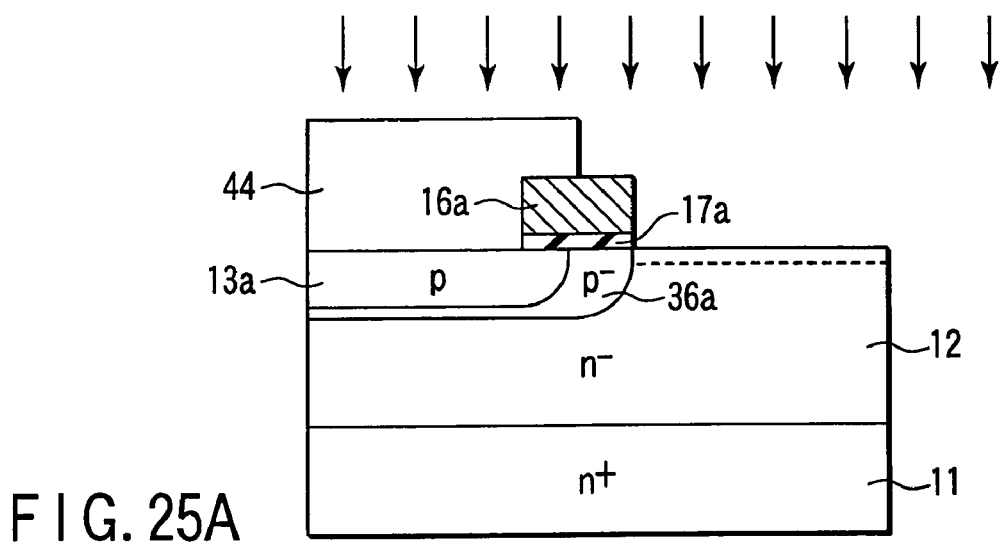
FIGS. 25A through 25C are schematic cross sectional views of the embodiment of FIG. 18, showing further steps of the manufacturing process shown in FIGS. 24A through 24C.
Figure 25B:
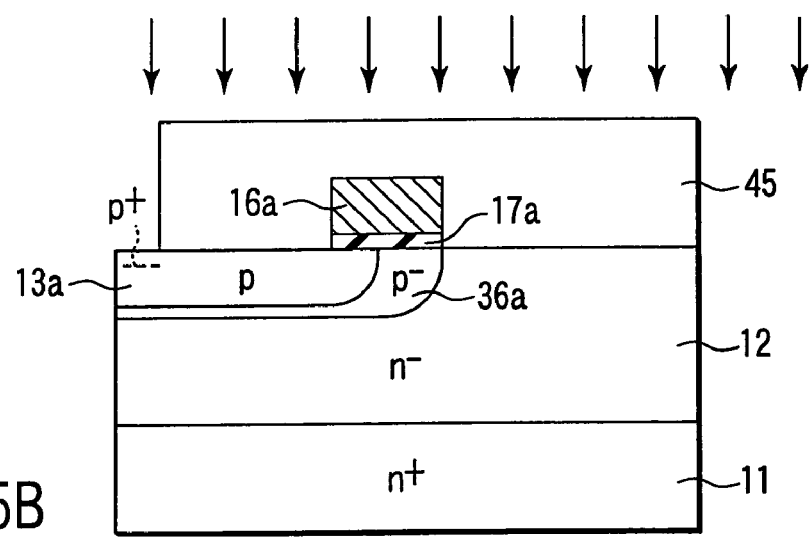

Subsequently, as shown in FIG. 25A, after the resist pattern 43 is removed, a still another resist pattern 44 is formed and P+(Phosphorus) ions are implanted into the area where an LDD layer 18 is to be formed in a self-aligning manner by using the gate electrode 16a as a mask. Furthermore, after removing the resist pattern 44, another resist pattern 45 having an opening corresponding to a region for forming a p+layer 15a is formed and B+ions are implanted into an area in the base layer 13a indicated by a broken line in FIG. 25B.

The rate at which P+ions are implanted, or the dose, for forming an LDD layer 18 needs to be not higher than $6 \times 10^{11}/cm^2$ when the power MOSFET element 21C is of the type showing a breakdown voltage of 30V as in the case of the first embodiment. Preferably, the dose is made equal to about $2.8 \times 10^{11}/cm^2$. Then, it is possible to provide a power MOSFET device whose capacitance between the gate and the drain and the ON resistance are excellent.

The length L of the LDD layer 18 needs to be between 0.7 μm and 0.8 μm also as in the case of the first embodiment. Again, a value close to 0.7 μm is preferably from the breakdown voltage point of view.

Figure 25C:
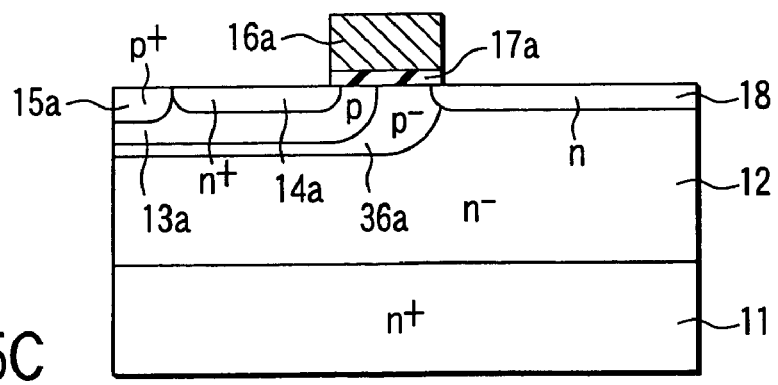

Thereafter, as shown in FIG. 25C, the work is annealed at predetermined temperature to diffuse the implanted ions and produce a source region 14a, a p+layer 15a and an LDD layer 18.

Figure 26A:
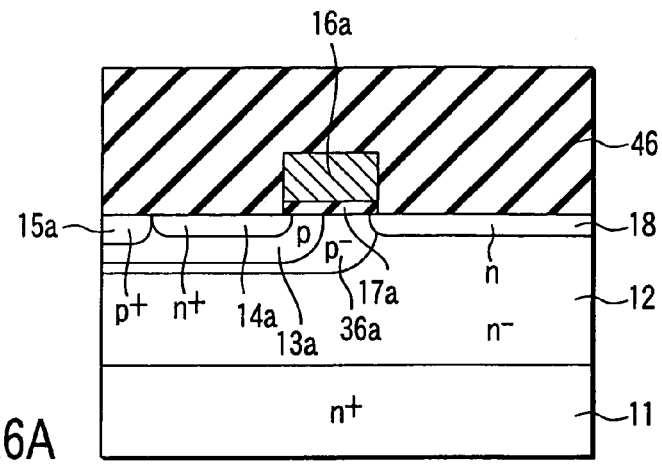
FIGS. 26A through 26C are schematic cross sectional views of the embodiment of FIG. 18, showing still further steps of the manufacturing process shown in FIGS. 25A through 25C.
Figure 26B:
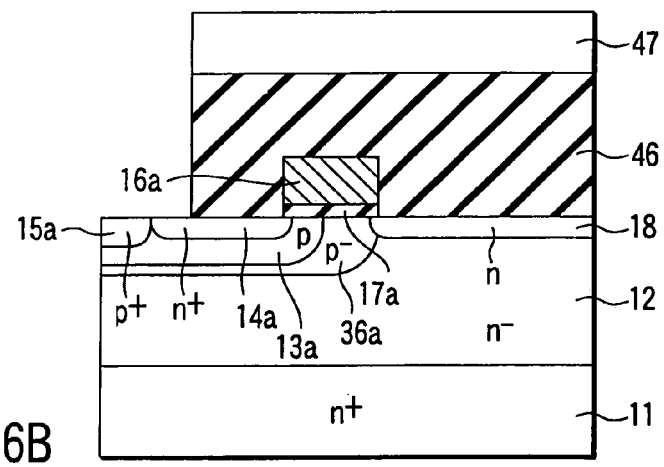
Figure 26C:
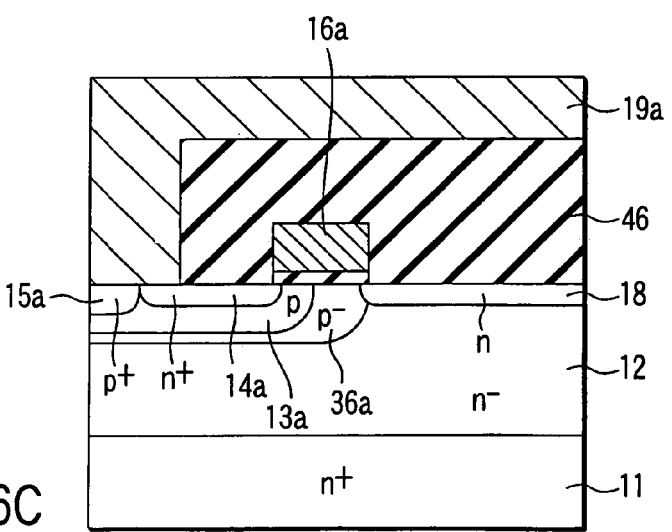

Then, as shown in FIG. 26A, an interlayer insulating film 46 is formed on the entire surface to a predetermined height by CVD and subsequently, as shown in FIG. 26B, a resist pattern 47 having an opening for a region where a source electrode 19a is to be formed is prepared. Thereafter, the interlayer insulating film 46 is selectively etched by using the resist pattern 47 as a mask. Subsequently, as shown in FIG. 26C, a source electrode 19a is formed in such a way that it is led out from the source region 14a onto the interlayer insulating film 46.

Figure 27:
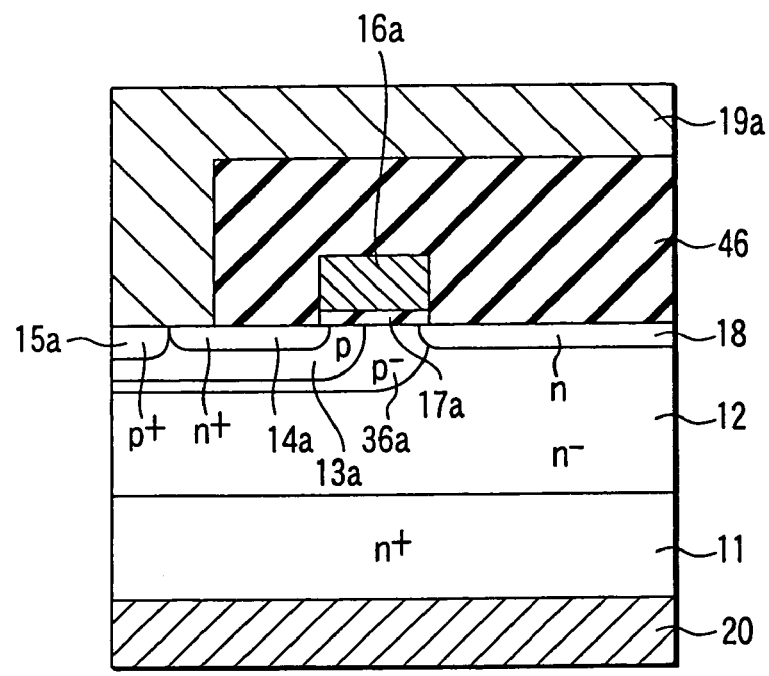
FIG. 27 is a schematic cross sectional view of the power MOSFET device manufactured by the steps of FIGS. 23A through 26C.

Finally, as shown in FIG. 27, a drain electrode 20 is formed on the entire lower surface of the n+substrate 11 to complete the process of forming a power MOSFET element 21C as shown in FIG. 18.

In the manufacturing process described above by referring to FIGS. 23A through 27, ions are implanted for forming a p type base layer 13a in a self-aligning manner by using the gate electrode 16a as a mask as shown in FIG. 24A after forming a gate oxide film 17a shown in FIG. 23C. However, the step of implanting ions for forming the p type base layer may alternatively be conducted before forming the gate oxide film.

Figure 29:
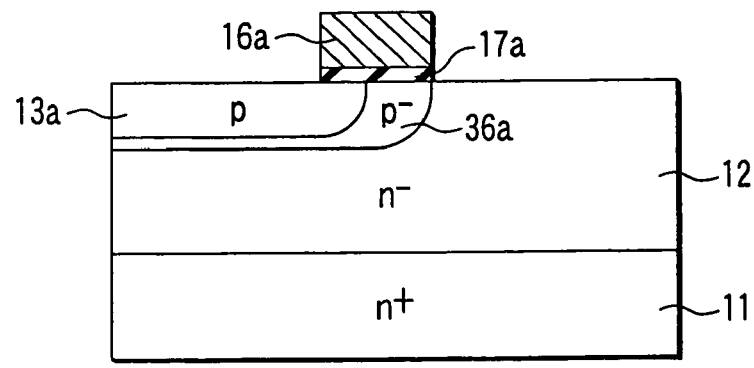
FIG. 29 is a schematic cross sectional view of the device manufactured by the steps of FIGS. 28A through 28D.
Figure 28A:
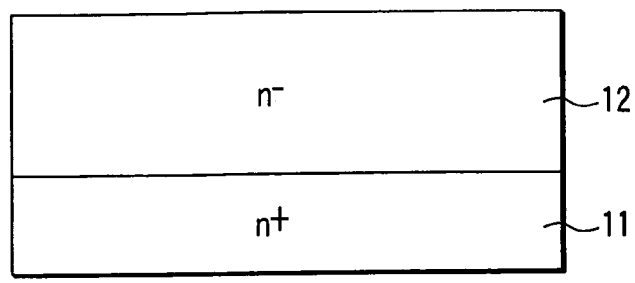
FIGS. 28A through 28D are schematic cross sectional views of the embodiment of FIG. 18, showing different steps of the manufacturing process.

FIGS. 28A through 29 illustrate such an alternative manufacturing process. Referring to FIG. 28A, an epitaxial layer 12 is formed on an n+silicon substrate 11 by epitaxial growth.

Figure 28B:
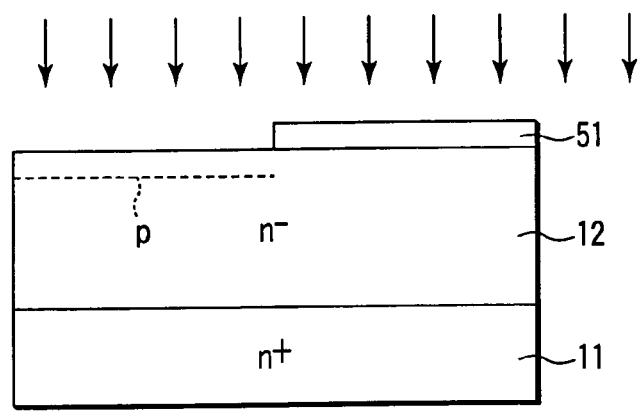

Then, as shown in FIG. 28B, the entire upper surface of the epitaxial layer 12 is covered with a resist film and exposed to light with an exposure mask placed thereon to produce a resist pattern 51 so that a region for forming an extension layer 36a on the surface of the epitaxial layer 12 becomes exposed. Under this condition, p type dopant ions are implanted to a predetermined depth indicated by a broken line in FIG. 28B by using the resist pattern 51 as a mask in order to form the extension layer 36a.

Figure 28C:
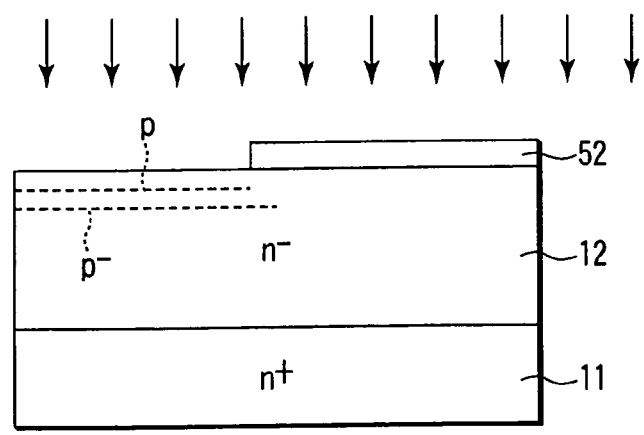

Thereafter, as shown in FIG. 28C, a resist pattern 52 having an opening corresponding to a region for forming a p type base layer 13a is formed and p ions are implanted into an area shallower than the p ions implanted to form the p extension layer 36a.

Figure 28D:
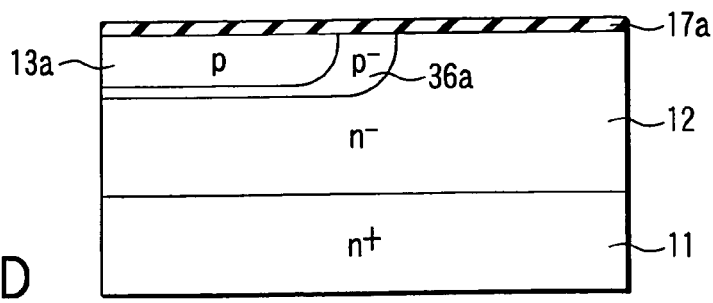

Subsequently, as shown in FIG. 28D, the resist pattern 52 is removed and a gate oxide film 17a is formed on the entire surface of the substrate. Then, the work is annealed to produce a p type base layer 13a and a p−type extension layer 36a located under the p type base layer 13a.

Then, a polysilicon film is formed on the entire surface of the gate oxide film 17a for the purpose of forming a gate electrode and, after forming a resist film thereon, the resist film is subjected to a patterning operation. As a result, a resist pattern is found only on the gate electrode 16a as shown in FIG. 29. Then, a gate electrode 16a and a gate insulating film 17a is formed by selective etching. The area where the gate electrode 16a and the gate insulating film 17a are formed corresponds to the area where the boundary between the extension layer or intermediary layer 36a and the epitaxial layer 12 comes to agree with a front end of the gate electrode 16a.

The manufacturing step shown in FIG. 29 corresponds to the step shown in FIG. 24B. All the subsequent steps of this alternative manufacturing process are identical with those illustrated in FIGS. 24C through 27.

The above described first and second embodiments are realized by applying the present invention to a vertical type power MOSFET device. However, the present invention can also be applied to a power MOSFET device having a horizontal type element structure.

Third Embodiment

Figure 30:
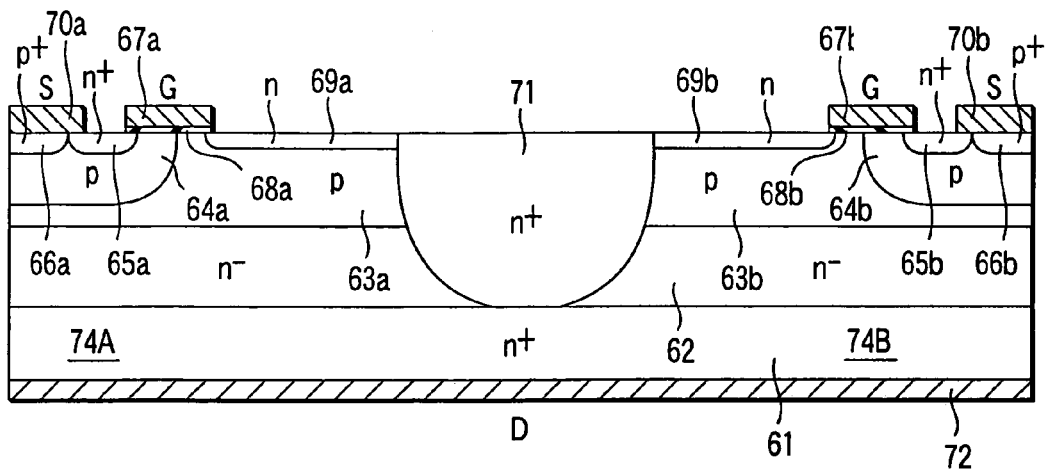
FIG. 30 is a schematic cross sectional view of still another embodiment of the invention.

Referring to FIG. 30, an n−epitaxial layer 62 is formed on an n+silicon substrate 61. Then, p type extension layers 63a, 63b are laid thereon.

A pair of p type base layers 64a, 64b is formed on respective surface regions of the extension layers 63a, 63b with a predetermined distance separating them.

Then, n+source regions 65a, 65b are formed respectively on surface regions of the p base layers 64a, 64b that are separated from the respective boundaries of the extension layers 63a, 63b by a distance so that they may be located adjacent to respective p+layers 66a, 66b. Subsequently, gate electrodes 67a, 67b are formed to cover the surfaces of the base layers 64a, 64b and also surface areas of the p type extension layers 63a, 63b respectively with gate insulating films 68a, 68b interposed between them.

N type LDD layers 69a, 69b are formed respectively on the surface areas of the extension layers 63a, 63b sandwiched between the gate electrodes 67a, 67b with an n+type sinker layer 71 interposed between them. The sinker layer 71 is formed to extend from the surfaces of the p-type extension layers 63a, 63b deeply to the surface of n+substrate 61 and contact the surface of the substrate 61 over a predetermined area. The lengths of the LDD layers 69a, 69b can be controlled accurately by controlling the profile of the horizontal diffusion of the dopant in the sinker layer 71.

Furthermore, source electrodes 70a, 70b are formed respectively on the surfaces of the p+layers 66a, 66b so as to partly cover the surfaces of the source regions 65a, 65b. A drain electrode 72 is formed on the entire lower surface of the n+substrate 61.

In this way, a pair of vertical type MOSFET elements 74A, 74B is formed. In reality, as described earlier by referring to the first embodiment, a number of MOSFET elements having a configuration same as the illustrated ones are formed in parallel on the surface of the p layers 63a, 63b along a direction perpendicular to FIG. 30 in order to obtain a desired current capacity. Thus, all the MOSFET elements are connected in parallel by means of a connecting section (not shown) to produce a large capacity power MOSFET device.

With this arrangement, in an ON state, for example, a voltage 5V is applied between the source electrode 70a and the drain electrode 72 from a 30V power source by way of a load in one of the elements, element 75A, for example, while an ON control voltage is applied to the gate electrode 67a. As a result, an inversion layer appears in the channel region on the surface of the base layer 64a right below the gate electrode 67a. Therefore, electrons that are injected as carriers from the source region 65a flow into the sinker layer 71 through the inversion layer, the surface region of the extension layer 63a and the LDD layer 69a and then reach at the drain electrode 72 from the sinker layer 71 by way of the n+substrate 61. As a result, an electric current flow from the drain electrode 72 toward the source electrode 70a.

Figure 80:
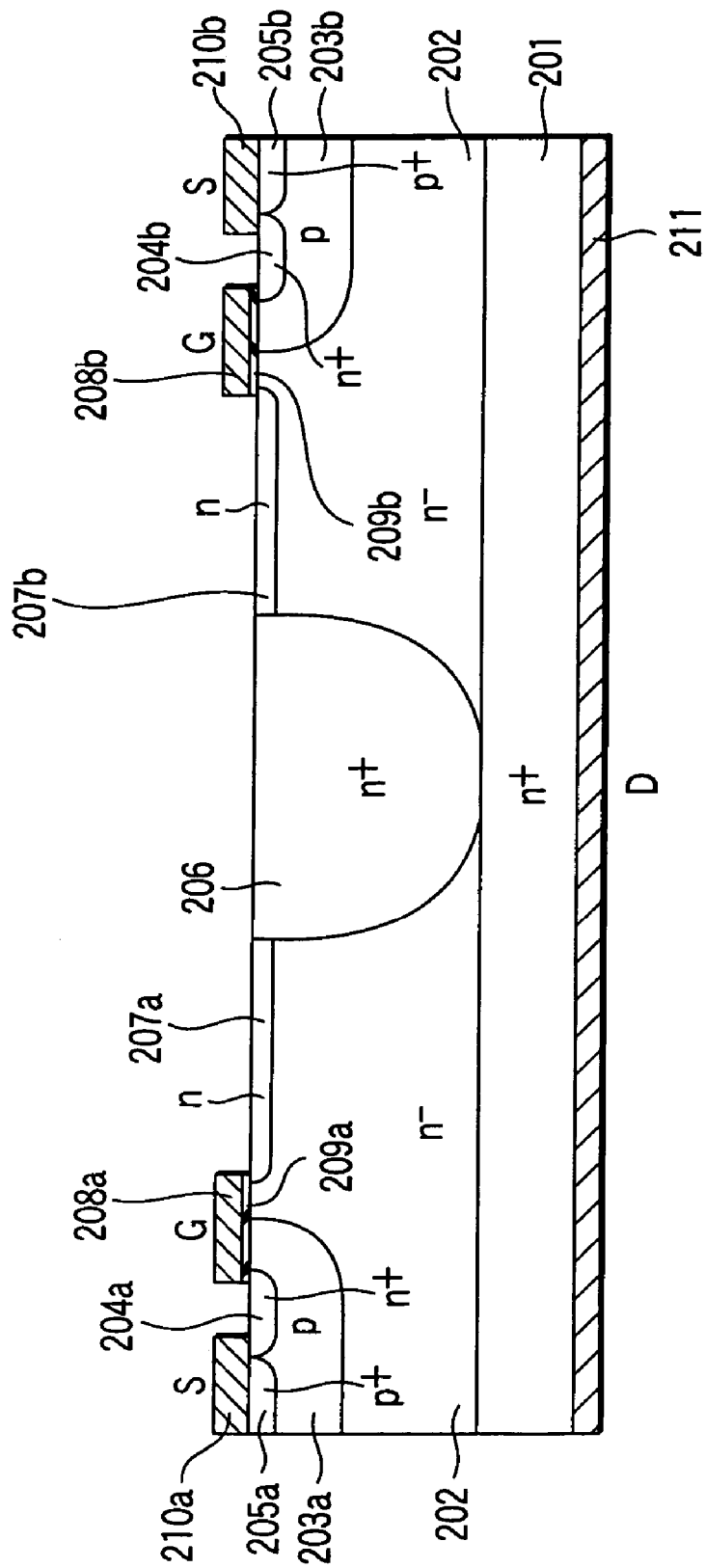
FIG. 80 is a schematic cross sectional view of a conventional horizontal type power MOSFET device.

While the known arrangement of FIG. 80 provides only a breakdown voltage of 20V, the embodiment of FIG. 30 shows a breakdown voltage of 30V as a result of arranging a p type extension layer 63a. Since the sinker layer 71 of FIG. 30 is formed by the diffusion of an n+type dopant, the breakdown voltage of the embodiment of FIG. 30 is greatly increased, although the horizontal dimension of the embodiment is substantially equal to the distance between the surface to the surface of the substrate 61 as in the case of the known arrangement of FIG. 80 and hence the embodiment does not realize any reduction in the horizontal dimension.

Figure 31:
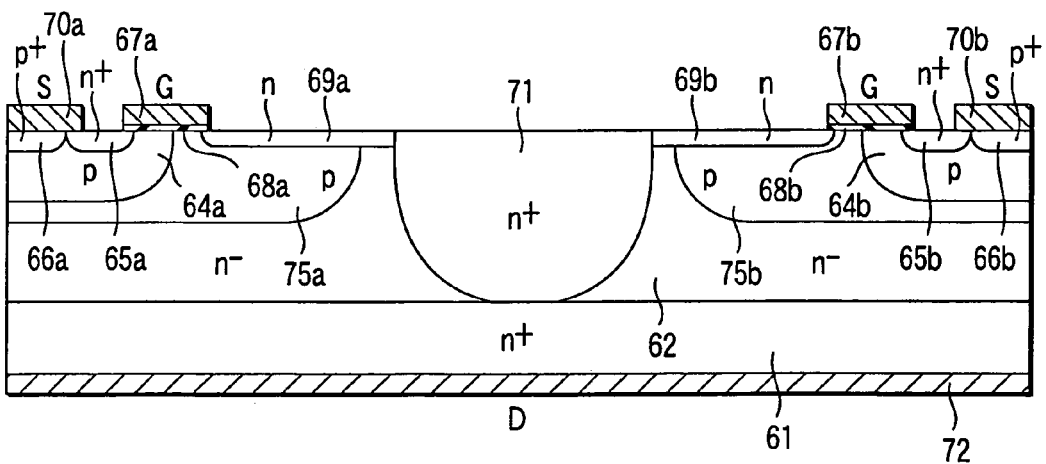
FIG. 31 is a schematic cross sectional view of still another embodiment of the invention.

While the front ends of the extension layers 63a, 63b of the embodiment of FIG. 30 contact the sinker layer 71, those of the extension layers 75a, 75b of the embodiment of FIG. 31 do not get to the sinker layer 71 but are separated from each other by a predetermined distance and contact the respective lower surfaces of the LDD layers 69a, 69b.

Since the front ends of the p type extension layers 75a, 75b of the embodiment of FIG. 31 do not reach at the sinker layer 71, it shows a breakdown voltage higher than that of the embodiment of FIG. 30. The capacitance between the gate and the drain in each of the elements 74A and 74B is substantially the same in the two embodiments.

Figure 32:
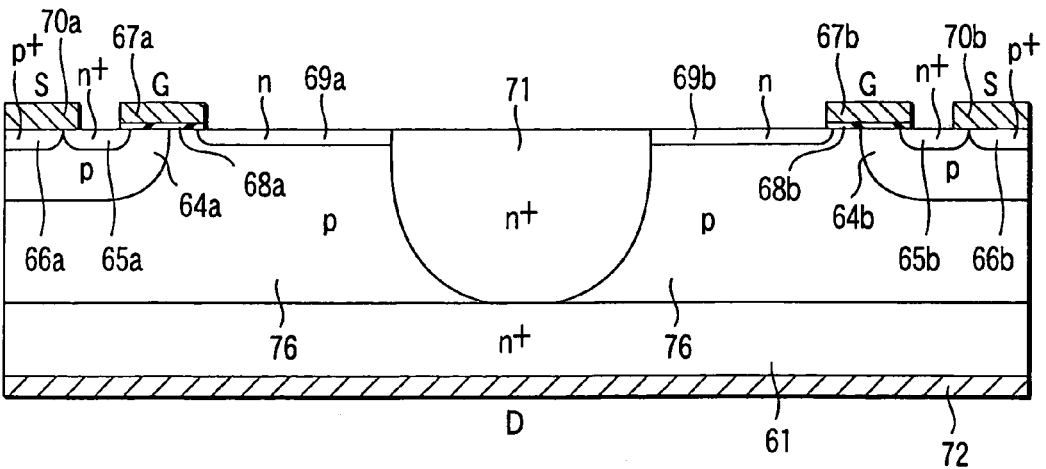
FIG. 32 is a schematic cross sectional view of still another embodiment of the invention.

In the embodiment of FIG. 32, a p type epitaxial layer 76 is formed on an n+substrate 61 and a sinker layer 71 is formed at the center of the p epitaxial layer 76, while a pair of p-type base layers 64a, 64b is formed on respective surface regions of the p epitaxial layer 76 with a predetermined distance separating them.

Then, n+source regions 65a, 65b are formed respectively on surface regions of the p base layers 64a, 64b that are separated from the boundaries of the epitaxial layer 76 by a predetermined distance so that they may be located adjacent to respective p+layers 66a, 66b. Then, gate electrodes 67a, 67b are formed to respectively cover the surfaces of the base layers 64a, 64b and the exposed surface areas of the p layer 76 with gate insulating films 68a, 68b interposed between them.

N type LDD layers 69a, 69b are formed respectively on the surface areas of the p layer 76 sandwiched between the gate electrodes 67a, 67b with the n+sinker layer 71 interposed between them. The sinker layer 71 is formed to extend from the surfaces of the p layer 76 deeply to the surface of n+substrate 61 and contact the surface of the substrate 61 over a predetermined area. The lengths of the LDD layers 69a, 69b can be controlled accurately by controlling the profile of the horizontal diffusion of the dopant in the sinker layer 71.

Furthermore, source electrodes 70a, 70b are formed respectively on the surfaces of the p+layers 66a, 66b so as to partly cover the surfaces of the source regions 65a, 65b. A drain electrode 72 is formed on the lower surface of the n+substrate 61.

In the embodiment of FIG. 32, the p layer 76 is formed directly on the low resistance n+substrate 61 without using an n–epitaxial layer like the n–epitaxial layers 62 of the embodiments of FIGS. 30 and 31 to reduce the capacitance between the gate and the drain.

Figure 33:
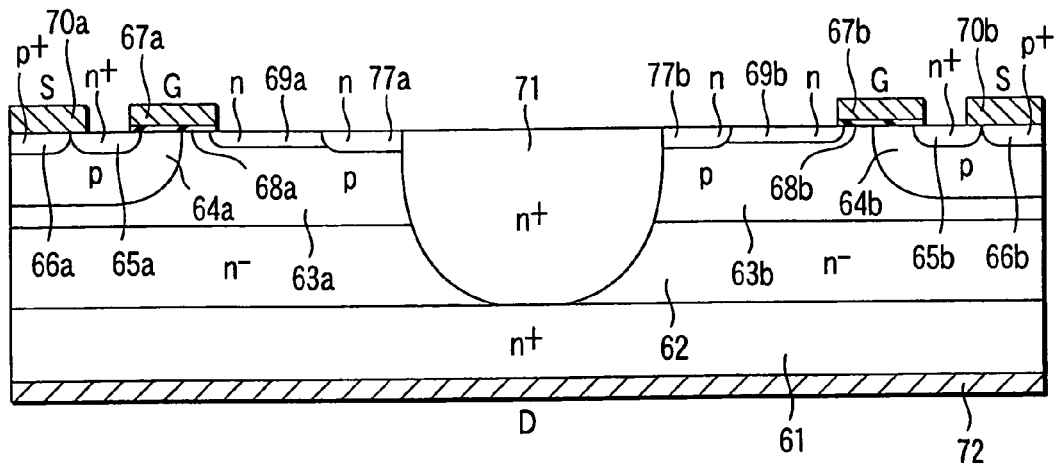
FIG. 33 is a schematic cross sectional view of still another embodiment of the invention.

In the embodiment of FIG. 33, auxiliary current conducting layers 77a, 77b are formed between the n type LDD layers 69a, 69b and the sinker layer 71, which are the same as their counterparts of the embodiment of FIG. 30, the auxiliary current conducting layers 77a, 77b being slightly deeper than the LDD layers 69a, 69b. Otherwise, the embodiment of FIG. 33 is identical with that of FIG. 30.

Thus, the carrier pathways from the LDD layers 69a, 69b to the sinker layer 71 are made to show a large cross section by arranging auxiliary current conducting layers 77a, 77b thicker than the LDD layers 69a, 69b.

Figure 34:
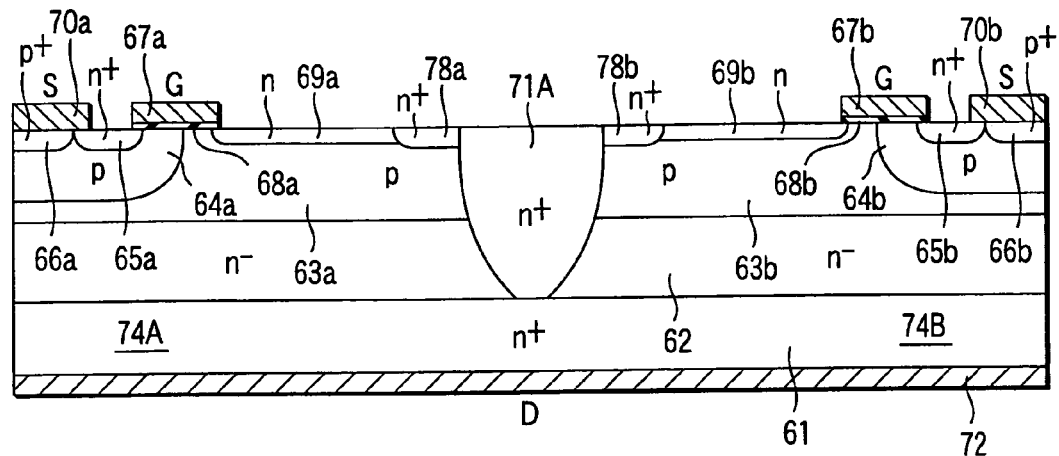
FIG. 34 is a schematic cross sectional view of still another embodiment of the invention.

In the embodiment of FIG. 34, the sinker layer 71A is made to have a narrow width and the n type auxiliary current conducting layers 77a, 77b of the embodiment of FIG. 33 are replaced by n+type auxiliary current conducting layers 78a, 78b and arranged between the LDD layers 69a, 69b and the sinker layer 71A, respectively.

With the embodiment of FIG. 34, the pitch of arrangement of the paired power MOSFET elements 74A, 74B can be reduced because the sinker layer 71A is made to have a narrow width compared with that of the embodiment of FIG. 33 and the ON resistance can be reduced if compared with the embodiment of FIG. 33 because of the use of n+auxiliary current conducting layers 78a, 78b.

Figure 35:
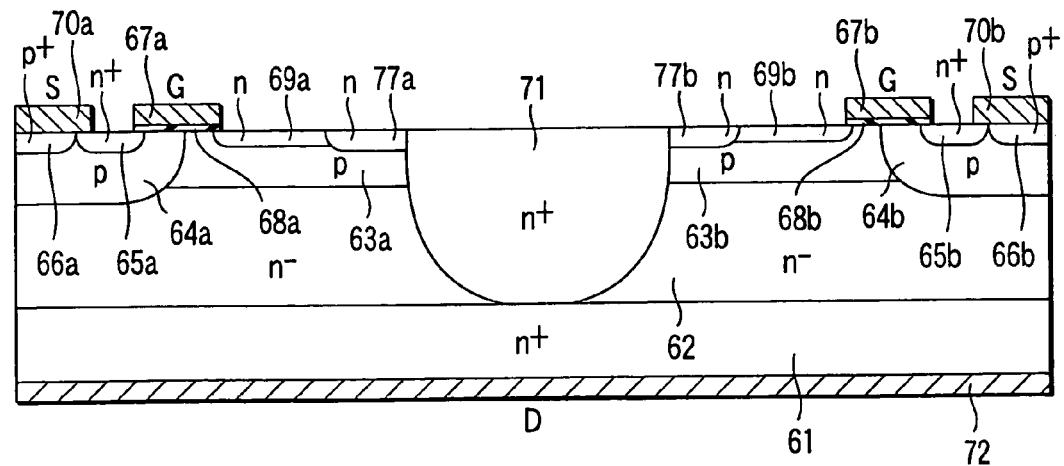
FIG. 35 is a schematic cross sectional view of still another embodiment of the invention.

In the embodiment of FIG. 35, the p type extension layers 63a, 63b are made shallow if compared with those of the embodiment of FIG. 33. More specifically, a thick n–epitaxial layer 62 is formed and the extension layers 63a, 63b are so arranged that their bottoms are located at a level shallower than the bottoms of the base layers 64a, 64b.

With this arrangement, the depletion layers expand to a large extent in the n-epitaxial layer 62 to improve the breakdown voltage of the embodiment.

Figure 36:
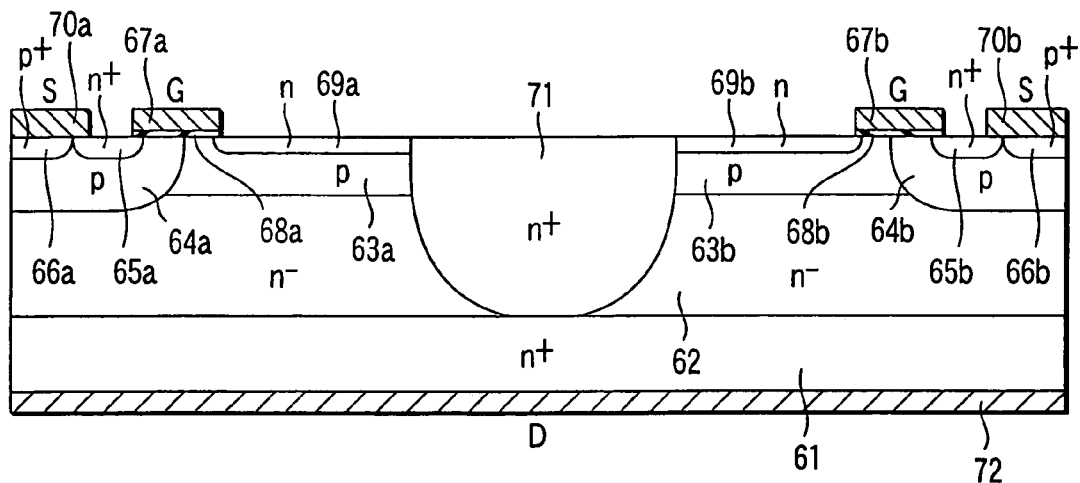
FIG. 36 is a schematic cross sectional view of still another embodiment of the invention.

The embodiment of FIG. 36 is obtained by modifying the embodiment of FIG. 35. In the embodiment of FIG. 36, the gate electrodes 67a, 67b and the sinker layer 71 are connected solely by the respective LDD layers 69a, 69b. With this arrangement, it is possible to provide a power MOSFET device that is improved relative to the known device of FIG. 80 in terms of breakdown voltage, the capacitance between the source and the drain and ON resistance.

Figure 37:
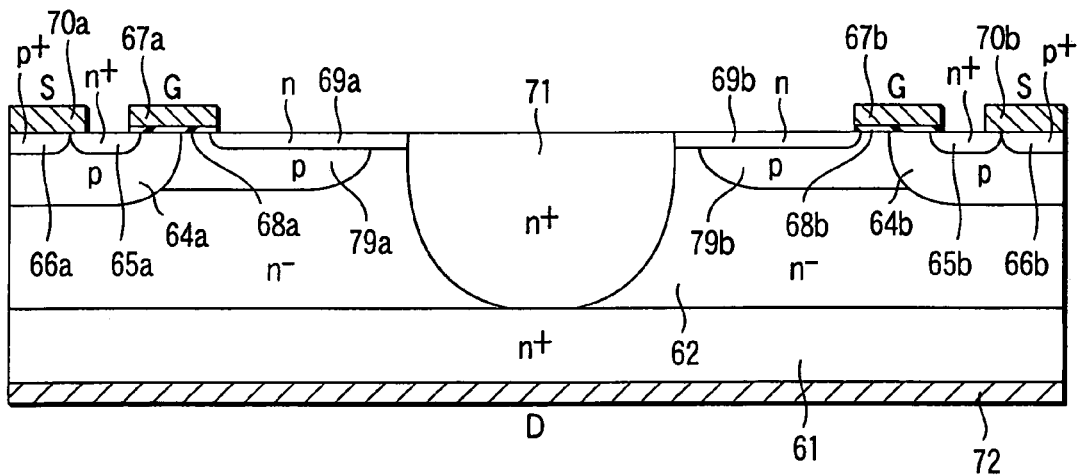
FIG. 37 is a schematic cross sectional view of still another embodiment of the invention.

In the embodiment of FIG. 37, the extension layer 63a, 63b of FIG. 35 are replaced by extension layers 79a, 79b whose front ends do not get to the sinker layer 71 but terminated somewhere on the lower surfaces of the LDD layers 69a, 69b. In this embodiment, since the n-epitaxial layer 62 is partly interposed between the extension layers 79a and the sinker layer 71, the breakdown voltage is further improved if compared with the embodiment of FIG. 36.

Figure 38:
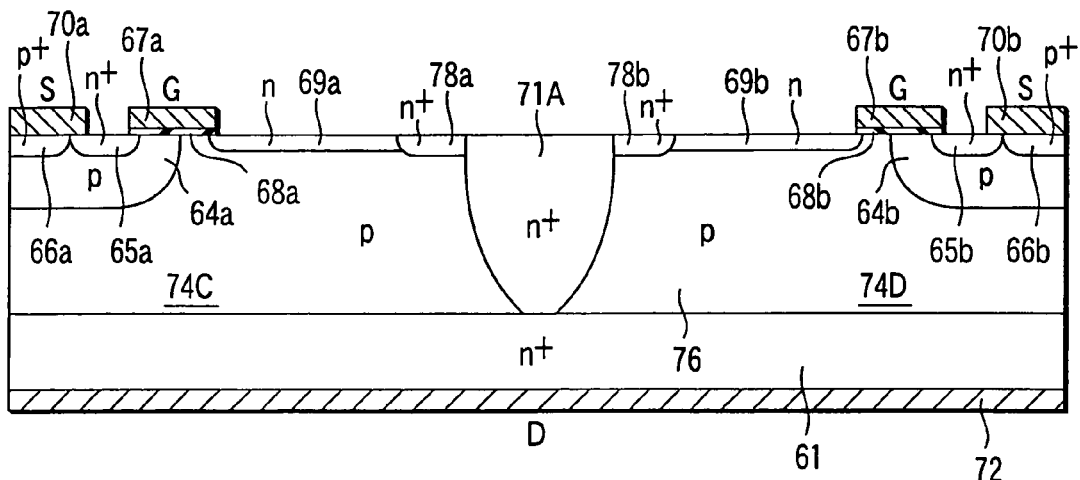
FIG. 38 is a schematic cross sectional view of still another embodiment of the invention.

In the embodiment of FIG. 38, a p-type epitaxial layer 76 is formed as in the case of the embodiment of FIG. 32. Additionally, a narrow sinker layer 71A like that of the embodiment of FIG. 34 is formed and n+auxiliary current conducting layers 78a, 78b are formed respectively between the LDD layers 69a, 69b and the sinker layers 71A. With this arrangement, the pitch of arrangement of the elements 74C, 74D is reduced and the ON resistance is also reduced due to the provision of the auxiliary current conducting layers 78a, 78b.

Figure 39:
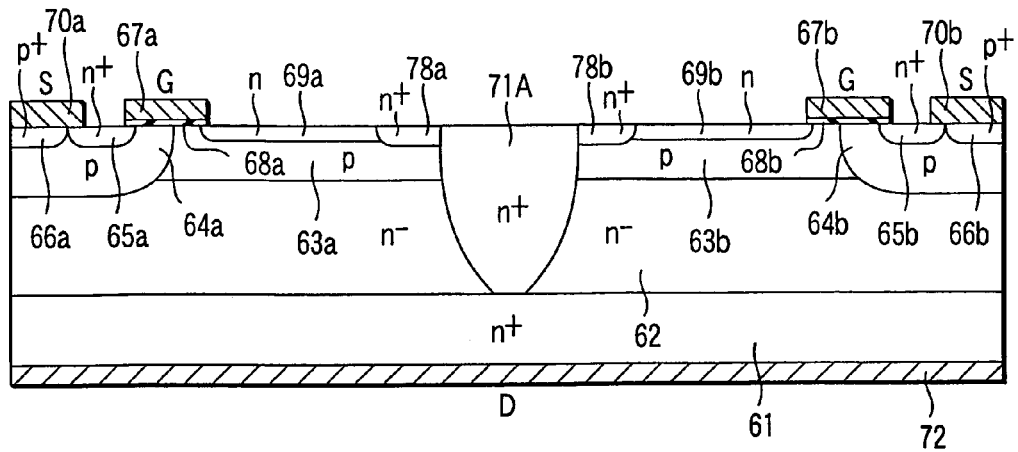
FIG. 39 is a schematic cross sectional view of still another embodiment of the invention.
Figure 40:
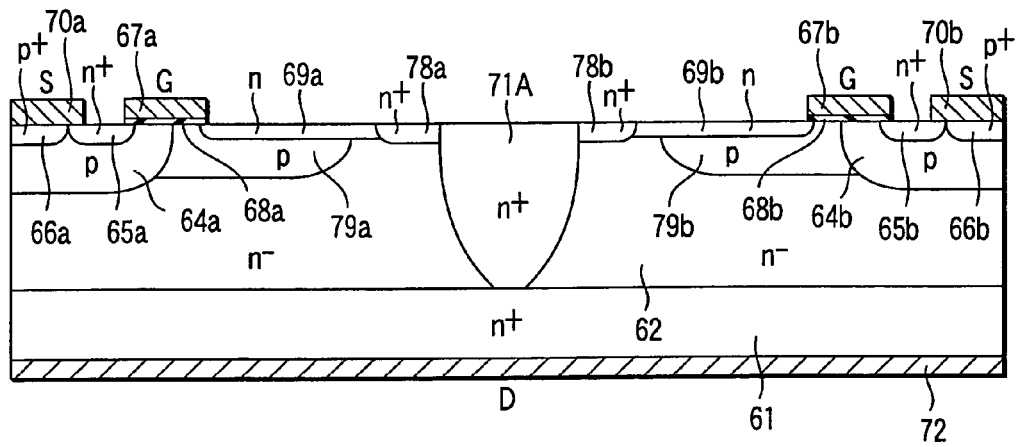
FIG. 40 is a schematic cross sectional view of still another embodiment of the invention.

In the embodiment of FIG. 39, a narrow sinker layer 71A and n+auxiliary current conducting layers 78a, 78b are combined. In the embodiment of FIG. 40, the p-type extension layers 63a, 63b of the embodiment of FIG. 39 are replaced by extension layers 79a, 79b that are not extending to the sinker layer 71A as in the case of FIG. 37. The net result is that the breakdown voltage of the embodiment of FIG. 40 is better than that of the embodiment of FIG. 39.

Figure 41:
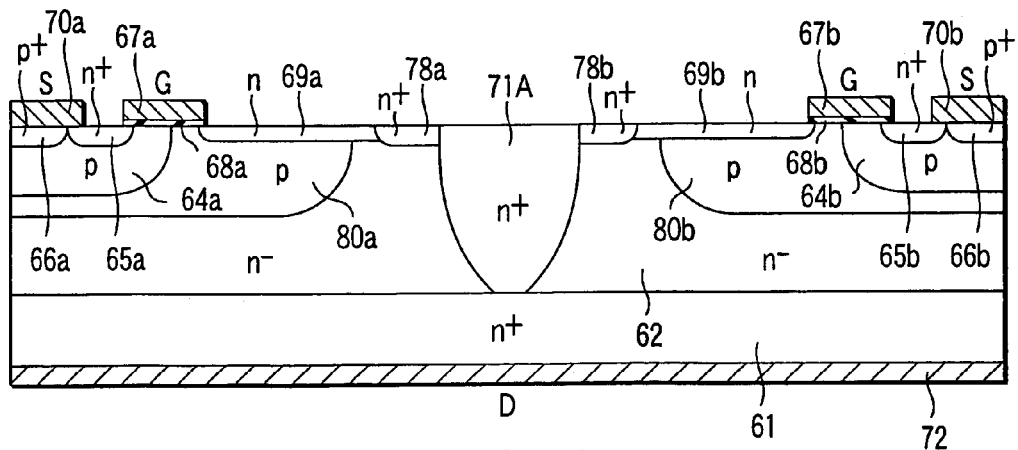
FIG. 41 is a schematic cross sectional view of still another embodiment of the invention.

The embodiment of FIG. 41 differs from that of FIG. 40 in that the p type extension layers 79a, 79b of FIG. 40 are replaced by p type extension layers 80a, 80b that are formed to a deep level so as to completely cover the respective base layers 64a, 64b.

The embodiments that will be described below by referring to FIGS. 42 through 47 are so many power MOSFET elements showing a breakdown voltage that is lower than 20V.

Figure 42:
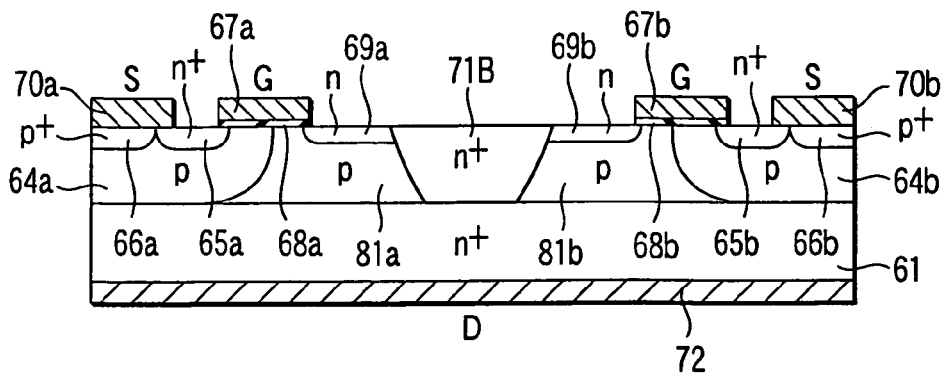
FIG. 42 is a schematic cross sectional view of still another embodiment of the invention.

In the embodiment of FIG. 42, a drain electrode 72 is formed on the lower surface of an n+substrate 61 and then p type epitaxial layers 81a, 81b are formed on the upper surface of the substrate 61. Then, an n+sinker layer 71B is formed between the epitaxial layers 81a, 81b in such a way that its bottom contacts the substrate 61. Thereafter, LDD layers 69a, 69b are formed on surface regions of the respective epitaxial layers 81a, 81b to show a predetermined length at the opposite sides of the sinker layer 71B.

Then, base layers 64a, 64b are formed in the respective epitaxial layers 81a, 81b until they contact the substrate 61. Source regions 65a, 65b and p+regions 66a, 66b are formed on surface regions of the respective base layers 64a, 64b. Note that the source regions 65a, 65b contact the respective p+regions 66a, 66b.

Source electrodes 70a, 70b are formed to respectively cover the source regions 65a, 65 and the p+regions 66a, 66b. Then, gate insulating films 68a, 68b and gate electrodes 67a, 67b are formed respectively between the source regions 65a, 65b and the LDD layers 69a, 69b so as to partly cover both the base layers 64a, 64b and the epitaxial layers 81a, 81b.

With the arrangement of FIG. 42, in an ON state, carriers flow typically from the source region 65a to the drain electrode 72 by way of the inversion layer formed in a surface region of the base layer 64a, a surface region of the epitaxial layer 81a, the LDD layer 69a, the sinker layer 71B and the substrate 61.

The ON resistance is low because the sinker layer 71B is held in contact with the n+substrate 61. The capacitance between the gate and the drain is also low.

Figure 43:
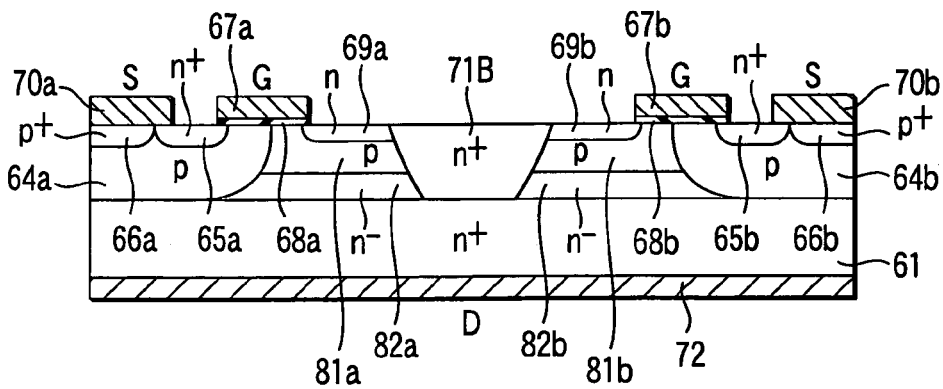
FIG. 43 is a schematic cross sectional view of still another embodiment of the invention.

In the embodiment of FIG. 43, n-layers 82a, 82b are formed respectively between the epitaxial layers 81a, 81b and the substrate 61 so as to contact the latter. Otherwise, this embodiment has a configuration same as that of FIG. 42.

Figure 44:
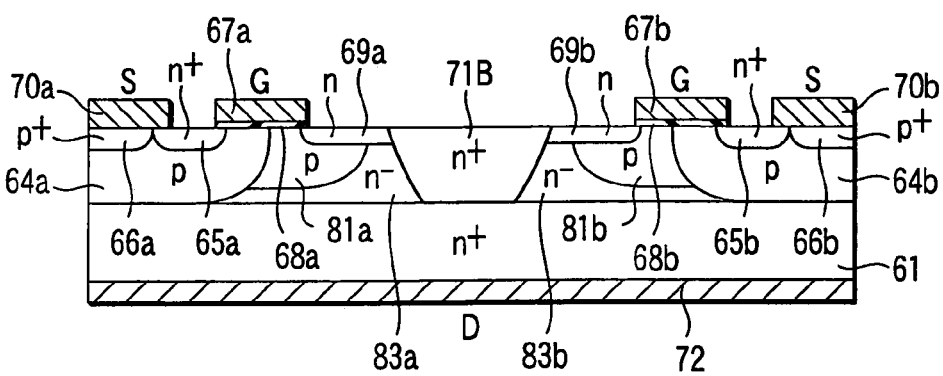
FIG. 44 is a schematic cross sectional view of still another embodiment of the invention.

In the embodiment of FIG. 44, the p type layers 81a, 81b are partly covered by the lower surfaces of the respective LDD layers 69a, 69b. With this arrangement, the breakdown voltage of a low breakdown voltage element can be improved.

Figure 45:
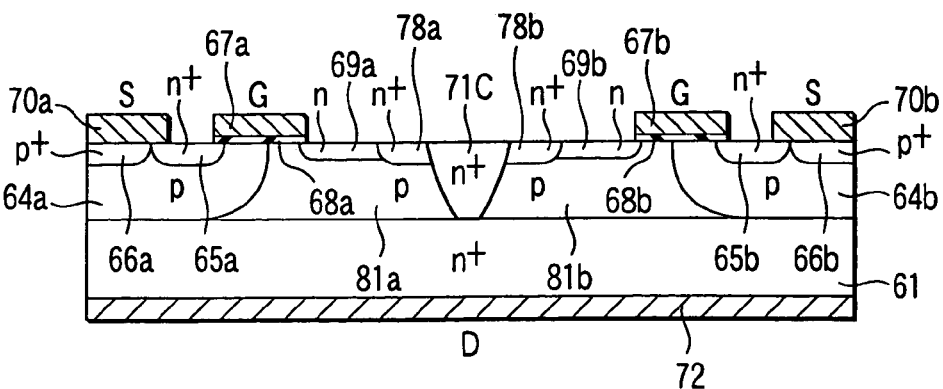
FIG. 45 is a schematic cross sectional view of still another embodiment of the invention.

The embodiment of FIG. 45 differs from the embodiment of FIG. 42 in that n+auxiliary current conducting layers 78a, 78b are formed respectively between the LDD layers 69a, 69b and the narrow sinker layer 71C and the width of the sinker layer 71C is reduced accordingly. This embodiment provides an advantage same as that of the embodiment of FIG. 44.

Figure 46:
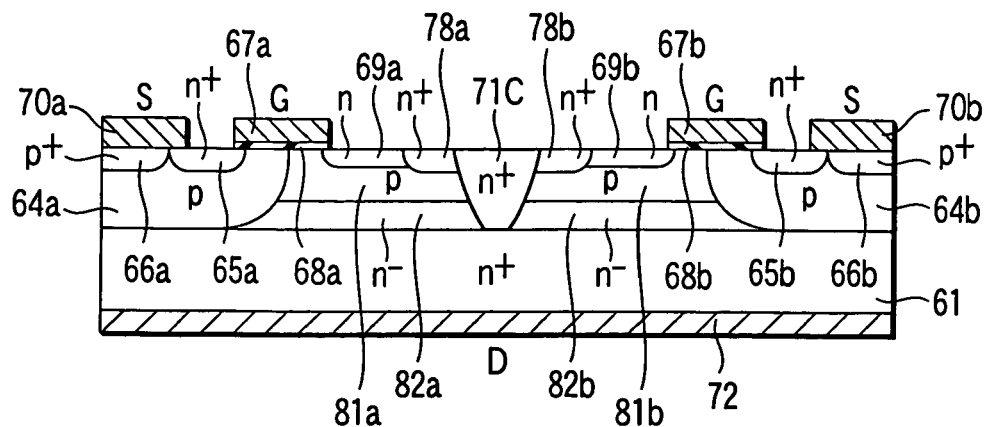
FIG. 46 is a schematic cross sectional view of still another embodiment of the invention.

The embodiment of FIG. 46 is obtained by modifying the embodiment of FIG. 43. In this embodiment, a sinker layer 71C is used and n+auxiliary current conducting layers 78a, 78b are arranged between the respective LDD layers 69a, 69b and the sinker layer 71C. Since the n+layers 78a, 78b can be formed accurately by using masks, the length of the LDD layers 69a, 69b can be made highly accurate.

Figure 47:
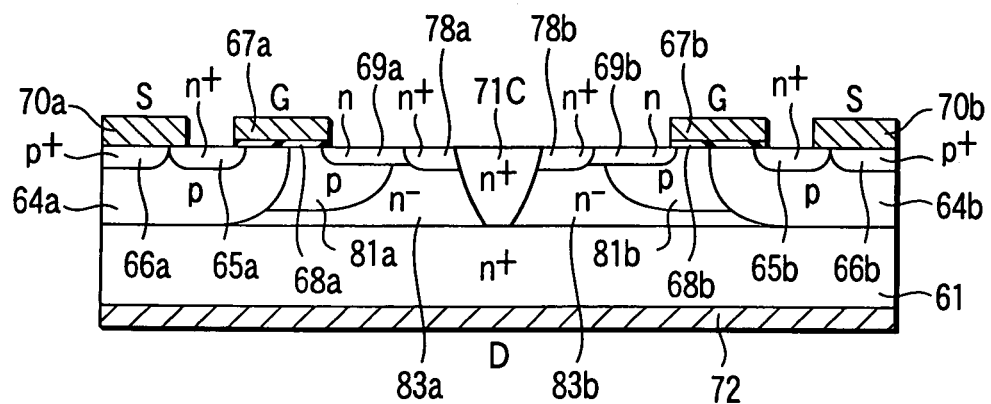
FIG. 47 is a schematic cross sectional view of still another embodiment of the invention.

The embodiment of FIG. 47 is obtained by modifying the embodiment of FIG. 44. As in the case of the embodiment of FIG. 46, a sinker layer 71C is used and n+auxiliary current conducting layers 78a, 78b are arranged between the respective LDD layers 69a, 69b and the sinker layer 71C in this embodiment. The n+layers 78a, 78b can be formed accurately by using masks.

Figure 48:
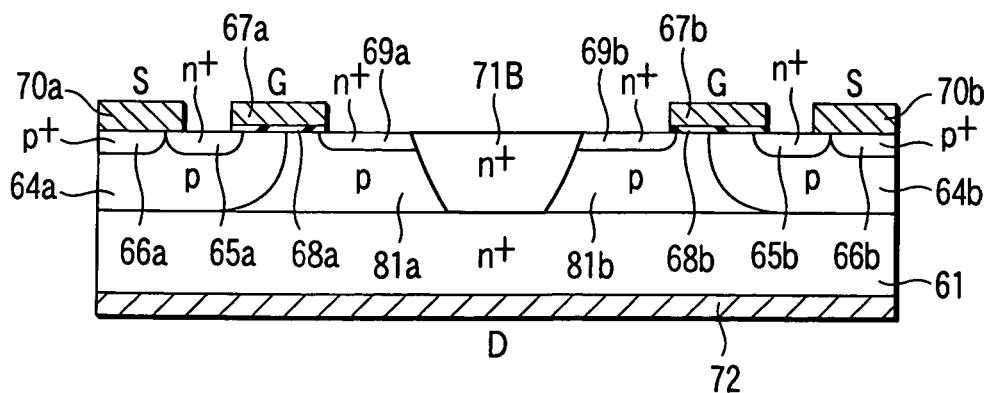
FIG. 48 is a schematic cross sectional view of still another embodiment of the invention.

The embodiment of FIG. 48 has a configuration substantially the same as that of the embodiment of FIG. 42 and differs from the latter only in that the conductive type of the LDD layers 69a, 69b are changed from n type to n+type. The LDD layers 69a, 69b can be formed by implanting an n+type dopant in a self-aligning manner using the gate electrodes 67a, 67b as masks. As a result, a power MOSFET element showing a very low ON resistance can be realized.

Now, the manufacturing process of the embodiment of power MOSFET element 74A shown in FIG. 30 will be described below by referring to FIGS. 49A through 54.

Figure 49A:
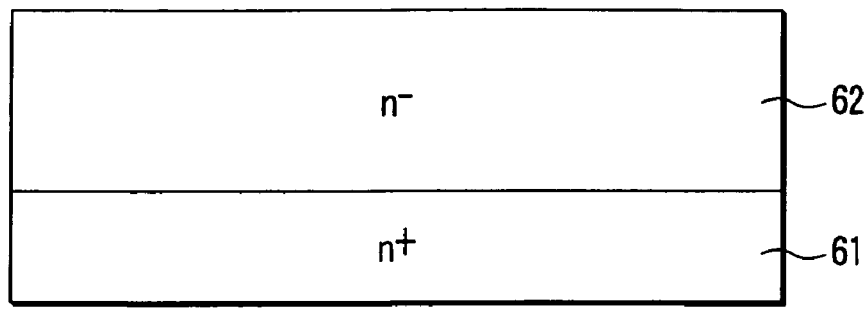
FIGS. 49A through 49C are schematic cross sectional views of the embodiment of FIG. 30, showing different steps of the manufacturing process.

Referring to FIG. 49A, an epitaxial layer 62 is formed on an n+silicon substrate 61 by epitaxial growth.

Figure 49B:
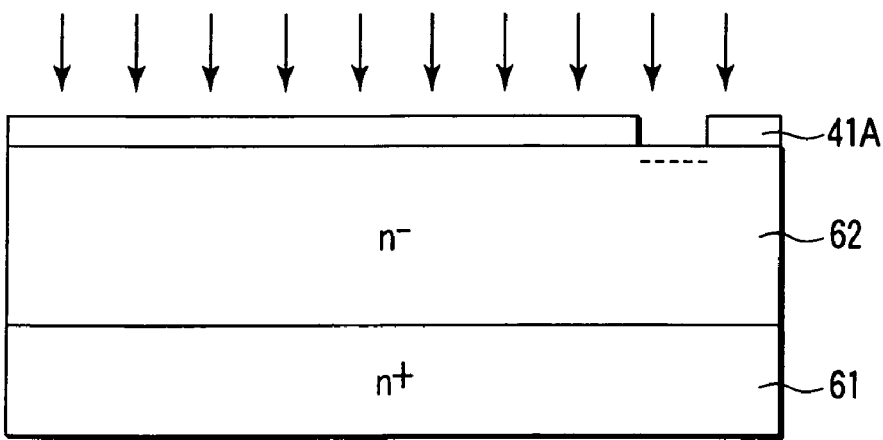

Then, as shown in FIG. 49B, the entire upper surface of the epitaxial layer 62 is covered with resist film and exposed to light with an exposure mask placed thereon to produce a resist pattern 41A having an opening corresponding to a region for forming a sinker layer 71 in the epitaxial layer 62. Under this condition, P+(Phosphorus) ions are implanted to a predetermined area corresponding to the formed opening indicated by a broken line in FIG. 49B.

Figure 49C:
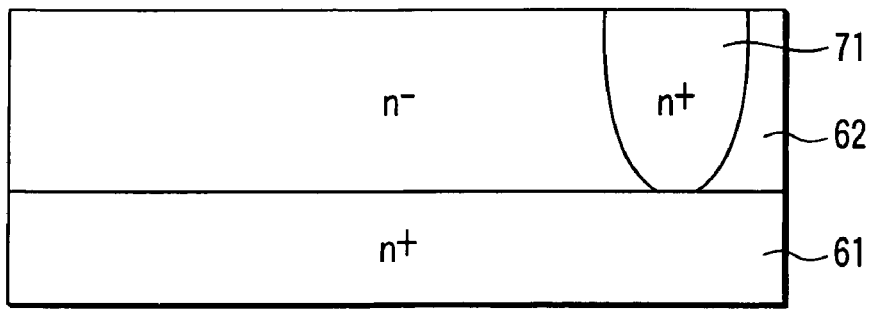

Thereafter, as shown in FIG. 49C, the work is annealed to produce an n+sinker layer 71 by diffusion.

Figure 50A:
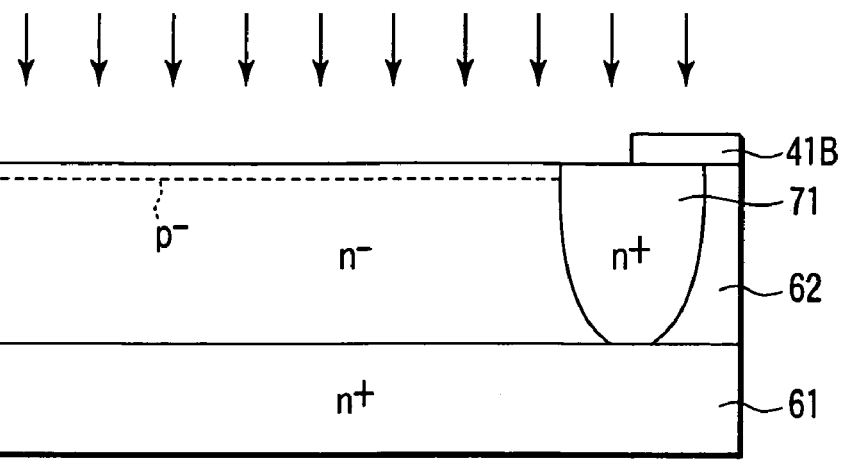
FIGS. 50A through 50C are schematic cross sectional views of the embodiment of FIG. 30, showing subsequent steps of the manufacturing process of FIG. 49C.
Figure 50B:
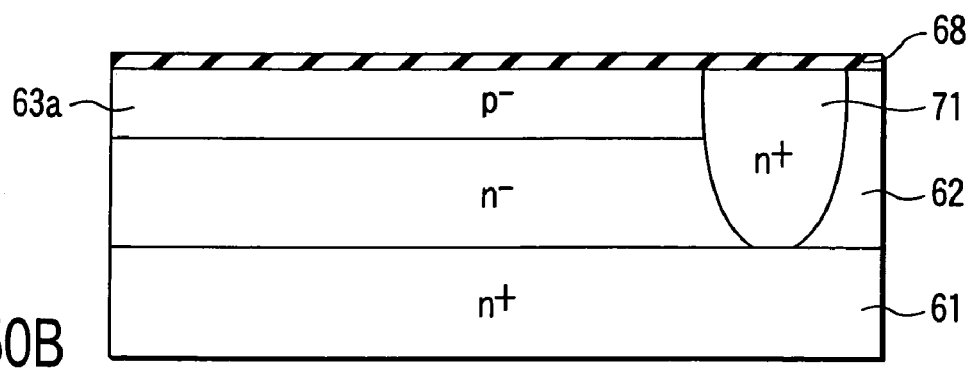

Then, as shown in FIG. 50A, a resist pattern 41B having an opening corresponding to an area for forming a p type extension layer 63a is formed and p type ions are implanted to an area indicated by a broken line.

Figure 50C:
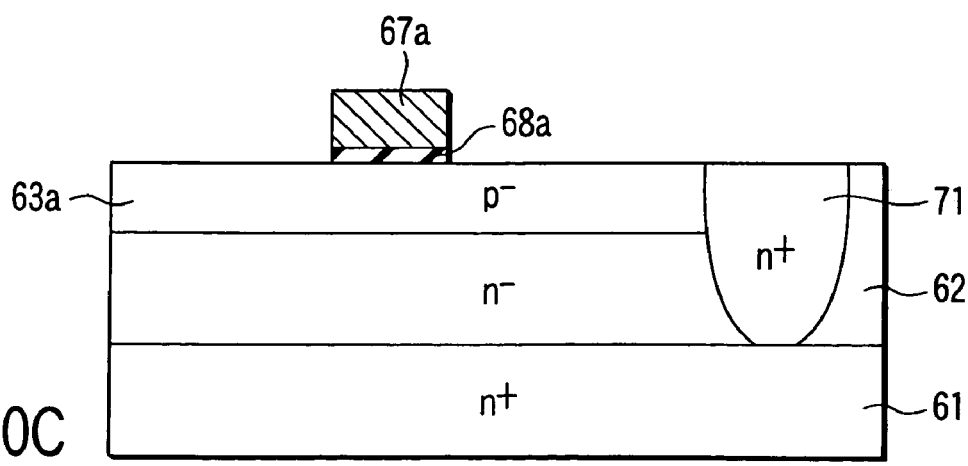

After removing the resist pattern 41B, a gate oxide film 68 is formed on the entire surface and an electrode layer (not shown) is formed by deposition of a polysilicon layer, for example, in order to produce a gate electrode 67a as shown in FIG. 50C. At this time, the implanted p type ions are diffused to produce a p-extension layer 63a at the same time as the work is heated to form the gate oxide layer 68.

Then, a resist pattern (not shown) is formed and the gate electrode layer and the gate insulating film 68 are selectively etched to produce a gate electrode 67a and a gate insulating film 68a as shown in FIG. 50C.

Figure 51A:
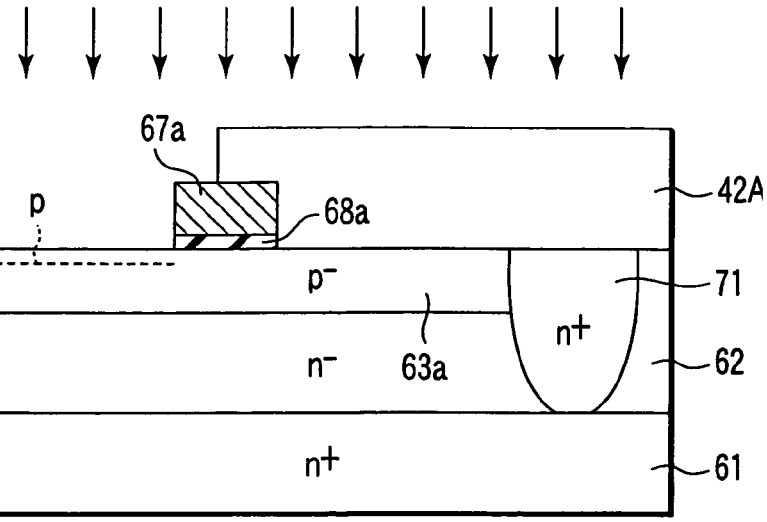
FIGS. 51A through 51C are schematic cross sectional views of the embodiment of FIG. 30, showing further steps of the manufacturing process of FIG. 50C.

Thereafter, as shown in FIG. 51A, a resist pattern 42A is formed to expose a region for forming a base layer 64a on the surface of the p-extension layer 63a. Under this condition, p type dopant ions are implanted by using the resist pattern 42A as a mask to produce a p type ion-implanted section as indicated by a broken line in FIG. 51A.

Figure 51B:
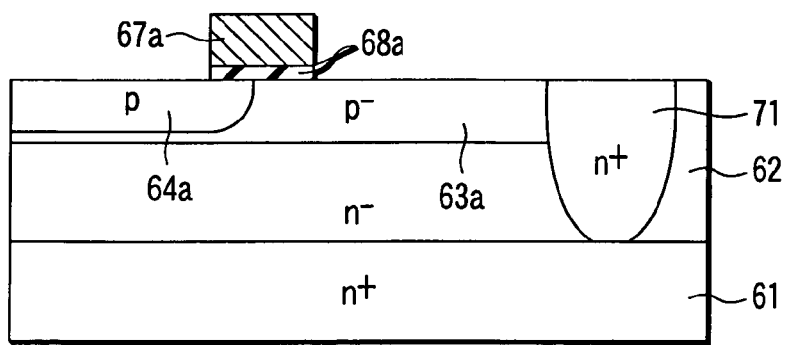

Then, as shown in FIG. 51B, the implanted ions are heated and diffused to produce a base layer 64a.

Figure 51C:
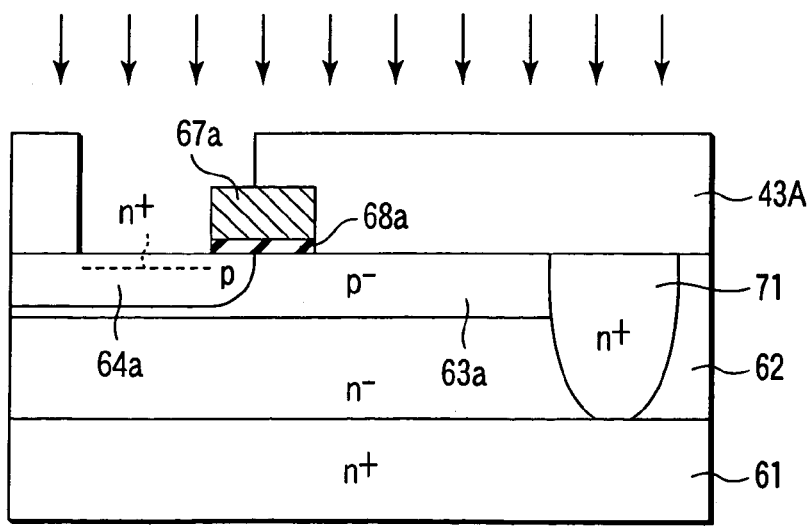

Subsequently, as shown in FIG. 51C, a resist pattern 43A having an opening corresponding to an area for forming a source region 65a is formed and As ions are implanted to an area indicated by a broken line in FIG. 51C.

Figure 52A:
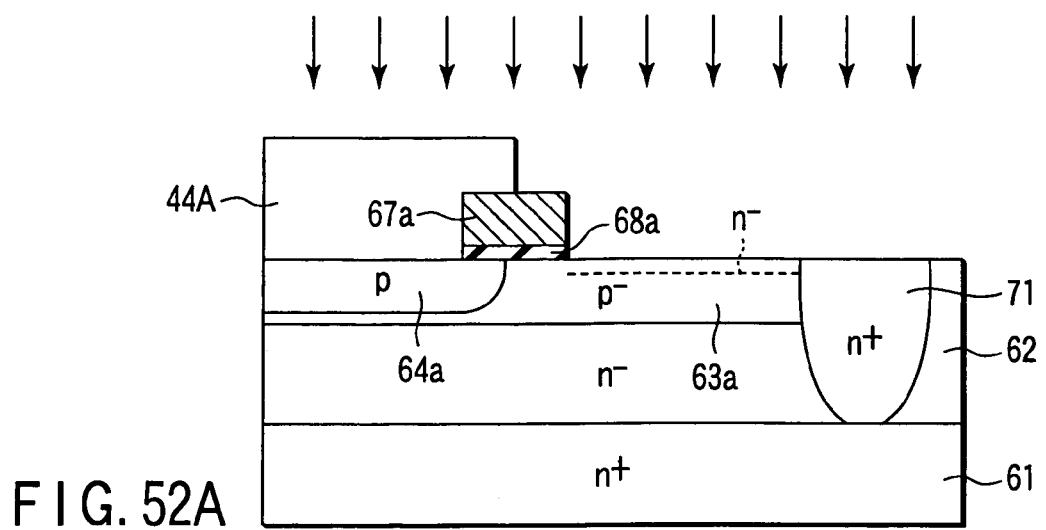
FIGS. 52A through 52C are schematic cross sectional views of the embodiment of FIG. 30, showing still further steps of the manufacturing process of FIG. 51C.
Figure 52B:
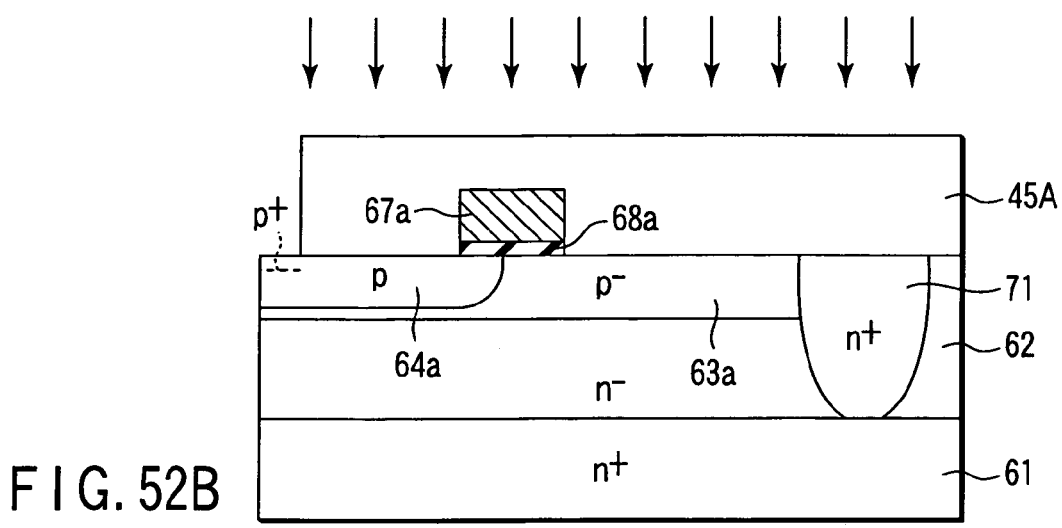

Furthermore, as shown in FIG. 52A, another resist pattern 44A is formed and P+(Phosphorus) ions are implanted in an area for forming an LDD layer 69a as indicated by broken line in FIG. 52A in a self-aligning manner by using the gate electrode 67a as a mask. After removing the resist pattern 44A, another resist pattern 45A having an opening corresponding to an area for forming a p+layer 66a is formed and B+ions are implanted into an area in the base layer 64a as indicated by a broken line in FIG. 52B.

Figure 52C:
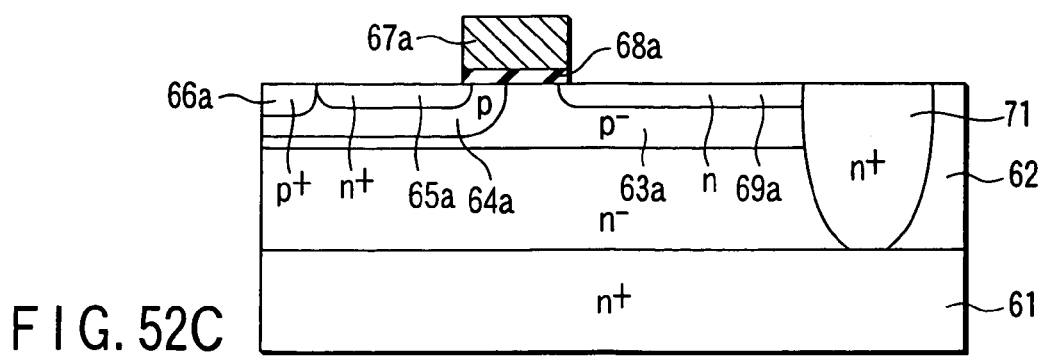

Thereafter, as shown in FIG. 52C, the work is annealed at a predetermined temperature to diffuse the implanted ions and produce the source region 65a, the p+layer 66a and the LDD layer 69a.

Figure 53A:
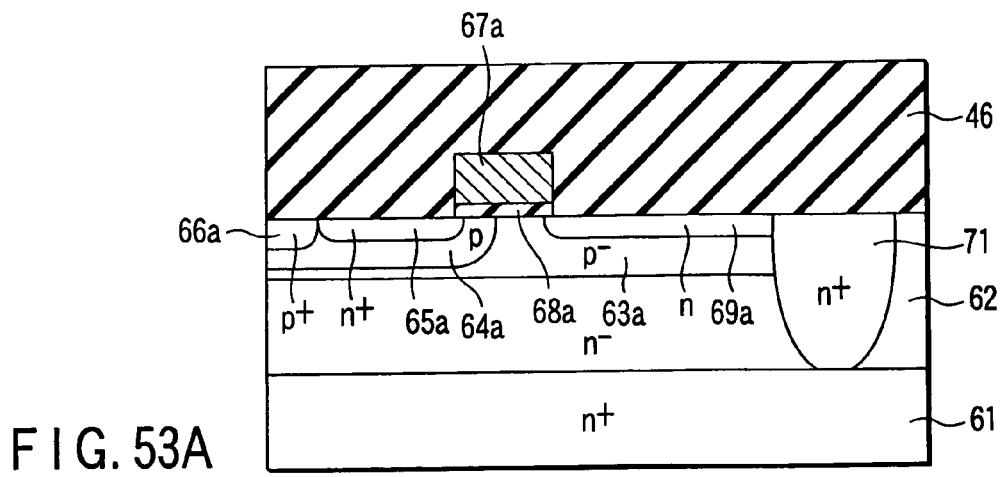
FIGS. 53A through 53C are schematic cross sectional views of the embodiment of FIG. 30, showing still further steps of the manufacturing process of FIG. 52C.
Figure 53B:
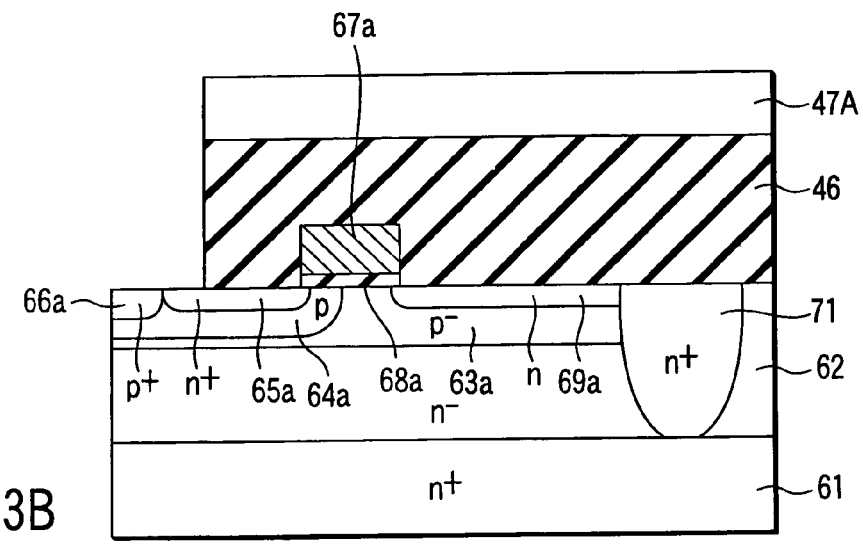
Figure 53C:
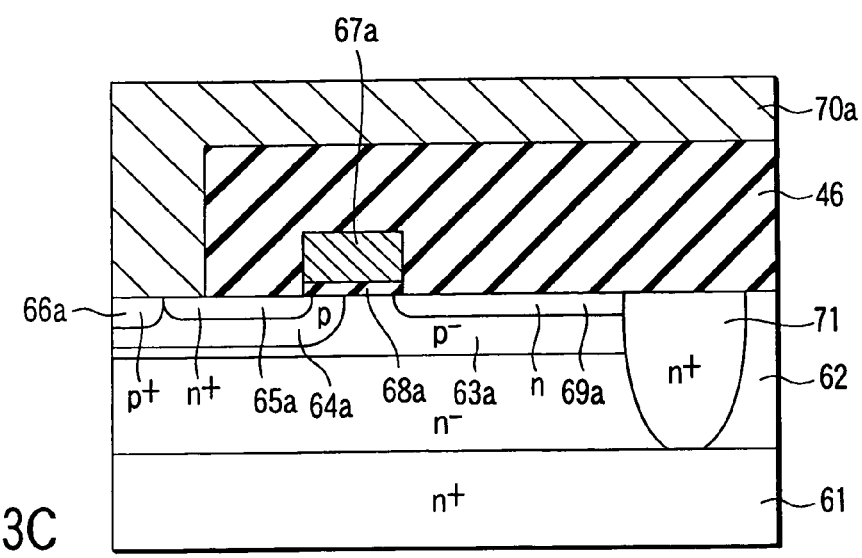

Then, as shown in FIG. 53A, an interlayer insulating film 46 is deposited on the entire surface of the substrate to a predetermined height by the CVD method and subsequently, as shown in FIG. 53B, a resist pattern 47A having an opening for a region where a source electrode 70a is to be formed is prepared. Thereafter, the interlayer insulating film 46 is selectively etched by using the resist pattern 47A as a mask. Subsequently, as shown in FIG. 53C, a source electrode 70a is formed in such a way that it is led out from the source region 65a onto the interlayer insulating film 46.

Figure 54:
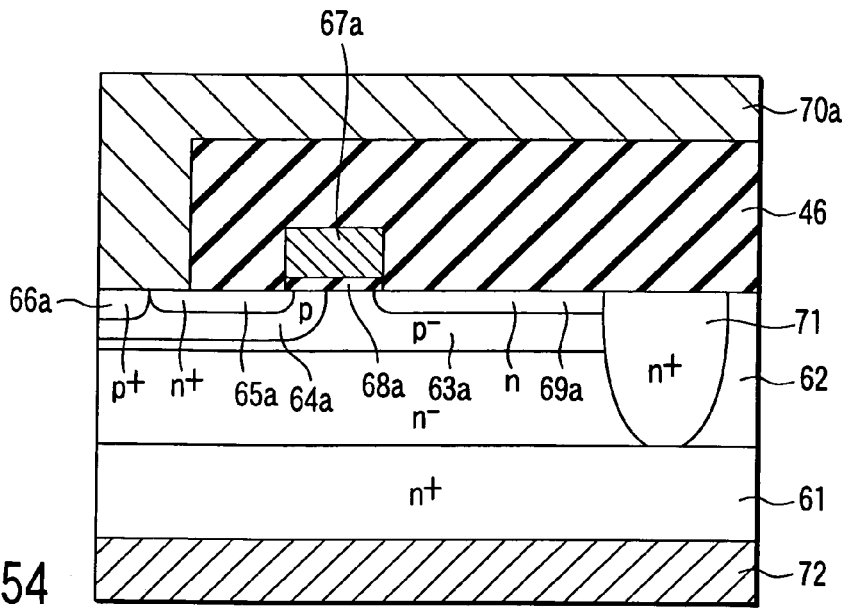
FIG. 54 is a schematic cross sectional view of the embodiment of FIG. 30, showing a still further step of the manufacturing process of FIG. 53C.

Finally, as shown in FIG. 54, a drain electrode 72 is formed on the entire lower surface of the n+substrate 61 to complete the process of forming a power MOSFET element 74A shown in FIG. 30.

Fourth Embodiment

Now, a number of other embodiments obtained by applying the present invention to lateral type elements will be described by referring to FIGS. 55 through 59.

Figure 55:
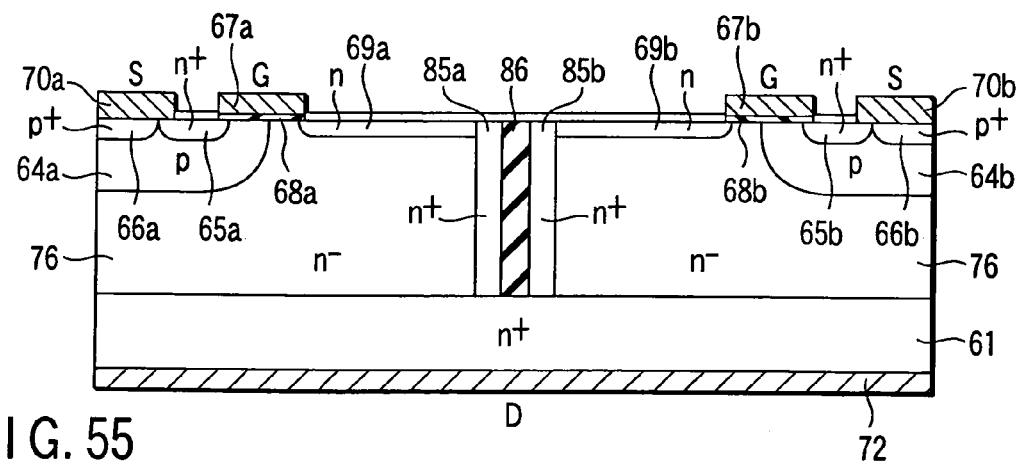
FIG. 55 is a schematic cross sectional view of still another embodiment of the invention.

The embodiment of FIG. 55 is substantially identical with that of FIG. 32 and differs from the latter only in that it has a narrow column-shaped sinker layer 85a that is clearly different from the broad sinker layer 71 shown in FIG. 32 and formed by diffusion. The components of the embodiment same as or similar to those of the embodiment of FIG. 32 are denoted respectively by the same reference symbols and will not be described any further.

Referring to FIG. 55, a trench is formed in the n-epitaxial layer 76. It extends from the surface of the n-epitaxial layer 76 to the surface of the n+substrate 61. A pair of n+layers 85a, 85b, or a pair of sinker layer, is formed on the lateral surfaces of the trench groove in the inside thereof with an insulating layer 86 interposed therebetween. The n+layers 85a, 85b are connected to the respective LDD layers 69a, 69b at upper lateral surface areas thereof and to the n+substrate 61 at the bottom surfaces thereof.

With this arrangement, in an ON state, electrons that are injected as carriers from the source region 65a flow to the drain electrode 72 through the inversion layer formed in the channel region on a surface region of the base layer 64a, the LDD layer 69a and the sinker layer 85a. If the sinker layers 85a, 85b contain the insulating layer 86 therein, the distance between the gate electrodes 67a, 67b can be remarkably reduced to 4 µm in this embodiment from 6 µm of the embodiment of power MOSFET element of FIG. 32 having the sinker layer 71 formed by diffusion and showing a breakdown voltage of 30V.

Figure 56:
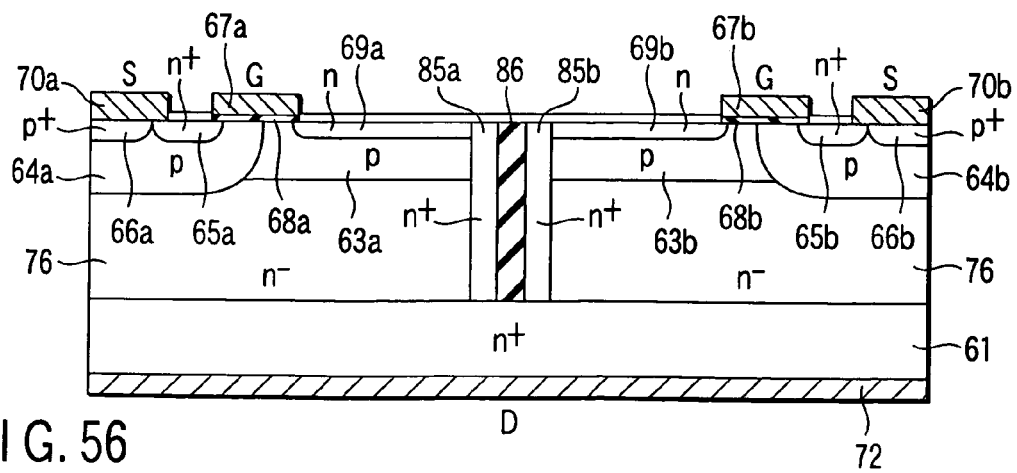
FIG. 56 is a schematic cross sectional view of still another embodiment of the invention.

Shallow p-type extension layers 63a, 63b may be formed under the n-type LDD layers 69a, 69b as shown in FIG. 56 in order to reduce the capacitance between the gate and the drain.

Figure 57:
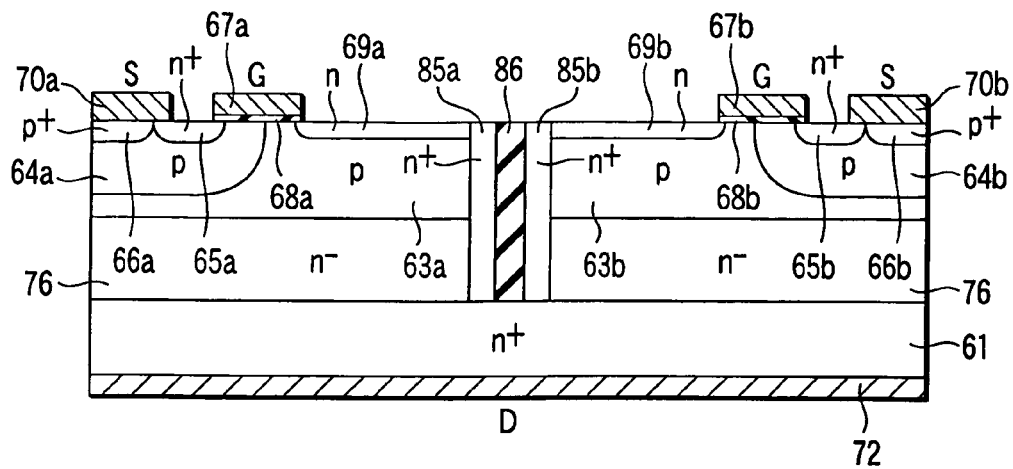
FIG. 57 is a schematic cross sectional view of still another embodiment of the invention.

Furthermore, the p-type extension layers 63a, 63b may be made relatively thick so as to completely cover the base layers 64a, 64b as shown in FIG. 57 in order to further reduce the capacitance between the gate and the drain.

Figure 58:
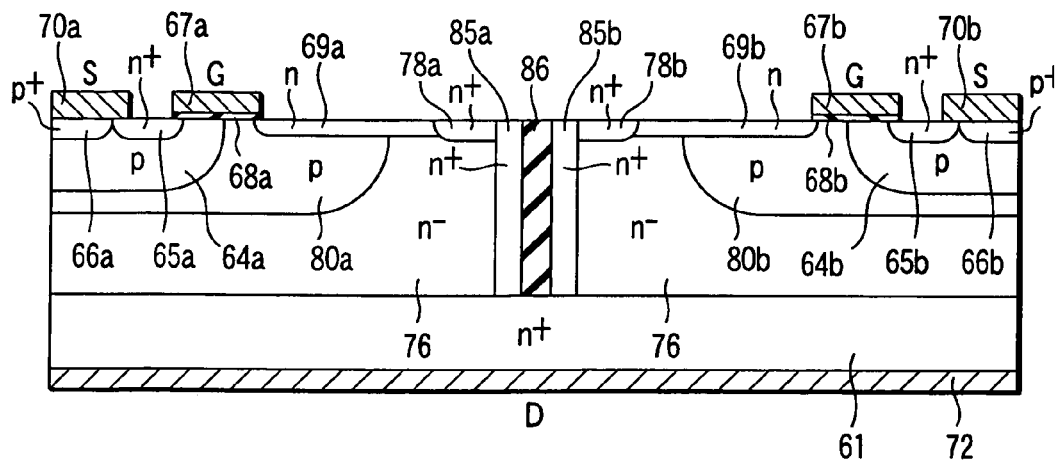
FIG. 58 is a schematic cross sectional view of still another embodiment of the invention.

In the embodiment of FIG. 58, the front ends of the p-type extension layers 80a, 80b are made to terminate somewhere at the bottom of the respective LDD layers 69a, 69b and n+auxiliary current conducting layers 78a, 78b are formed respectively between the LDD layers 69a, 69b and the sinker layers 85a, 85 as in the case of the embodiment of FIG. 41. With this arrangement, this embodiment shows a breakdown voltage higher than that of the embodiment of FIG. 57.

Figure 59:
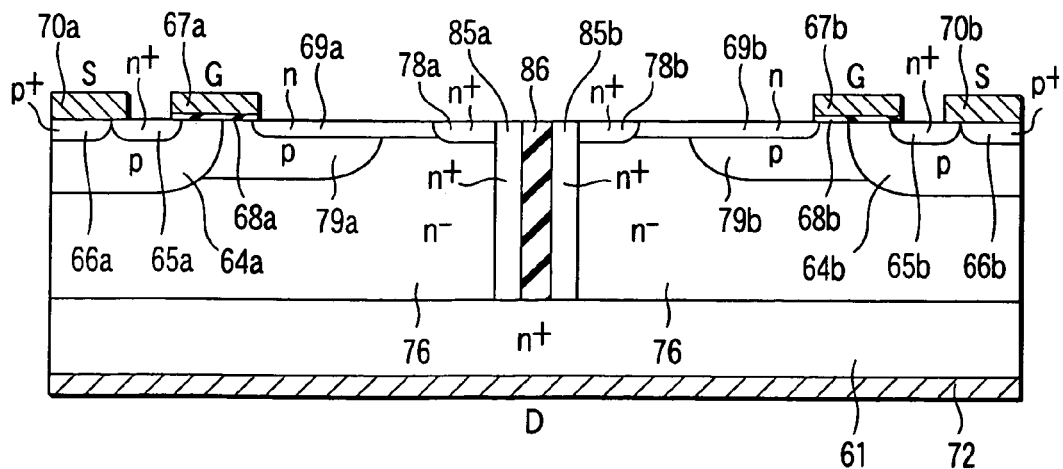
FIG. 59 is a schematic cross sectional view of still another embodiment of the invention.

The embodiment of FIG. 59 is realized by replacing the sinker layer 71A of the embodiment of FIG. 40 by n+sinker layers 85a, 85. Then, the pitch of arrangement of elements can be reduced and the embodiment shows an improved breakdown voltage as in the case of the embodiment of FIG. 40.

Now, the process of manufacturing the embodiment of power MOSFET element illustrated in FIG. 58 will be described below by referring to FIGS. 60A through 65. Note that, in the following description, it is assumed that the embodiment does not comprise n+auxiliary current conducting layers 78a, 78b and the LDD layers 69a, 69b are directly connected to the n+sinker layers 85a, 85b respectively. While only the left power MOSFET element of FIG. 58 is described below, it will be appreciated that the two or more elements are manufactured simultaneously in the real manufacturing process.

Figure 60A:
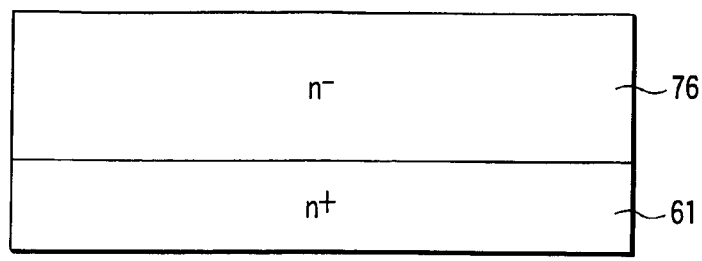
FIGS. 60A through 60E are schematic cross sectional views of a modification of the embodiment of FIG. 58, showing different steps of the manufacturing process thereof.

Referring to FIG. 60A, an epitaxial layer 76 is formed to a predetermined height on an n+substrate 61 by epitaxial growth.

Figure 60B:
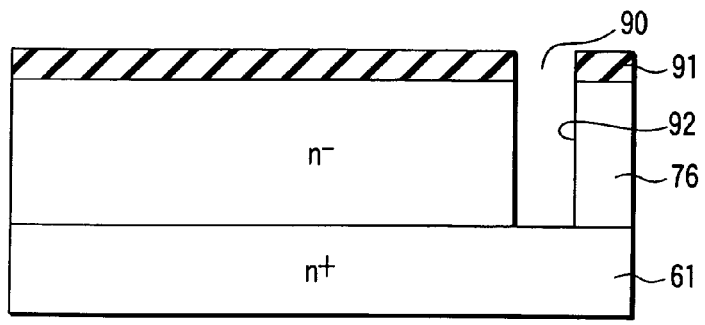
Figure 60C:
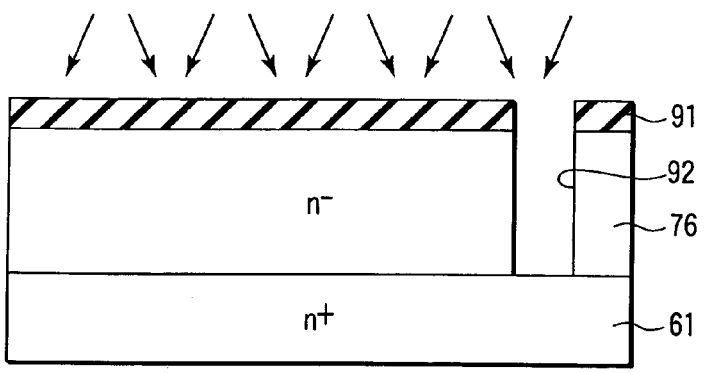

Then, as shown in FIG. 60B, the entire surface of the epitaxial layer 12 is covered with a resist film to form a resist pattern 91 having an opening 90 for exposing the surface of the epitaxial layer 76 in a region for forming sinker layers. Thereafter, the epitaxial layer 76 is etched to produce a trench 92 by using the resist pattern 91 as a mask.

Figure 60D:
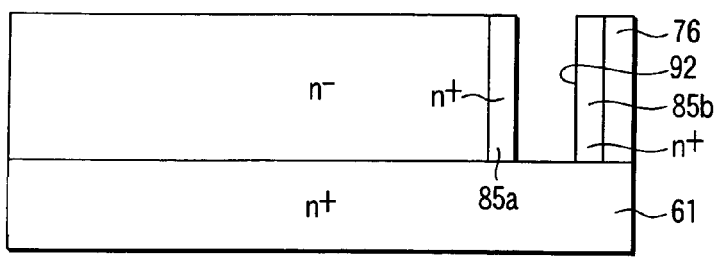

Subsequently, n+dopant ions are implanted from a side inclined relative to the substrate surface to produce a pair of n+ion-implanted layers 85a, 85b along the side surfaces of the trench 92 as shown in FIG. 60D.

Figure 60E:
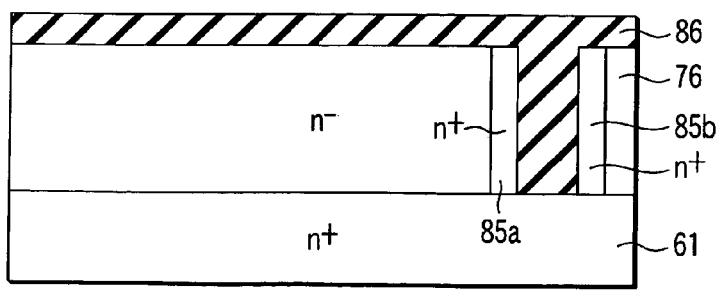
Figure 61A:
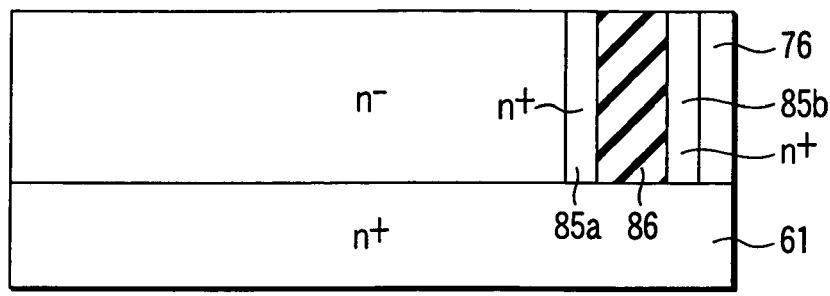
FIGS. 61A through 61D are schematic cross sectional views of the modification of the embodiment of FIG. 58, showing subsequent steps of the manufacturing process of FIG. 60E.

Under this condition, an insulating oxide film 86 is deposited on the entire surface of the work including the trench 92 as shown in FIG. 60E. Then, the oxide film 86 is etched and formed in the trench 92 together with the sinker layers 85a, 85b as shown in FIG. 61A.

Figure 61B:
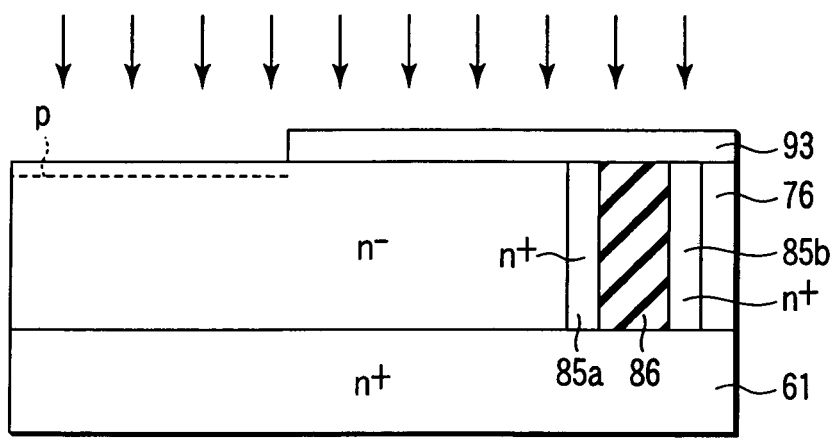

Thereafter, as shown in FIG. 61B, the entire upper surface of the epitaxial layer 76 is covered by a resist film and subsequently a resist pattern 93 is formed by using an exposure mask. Then, a region for forming a p-extension layer 80a is exposed on the surface of the epitaxial layer 76.

Figure 61C:
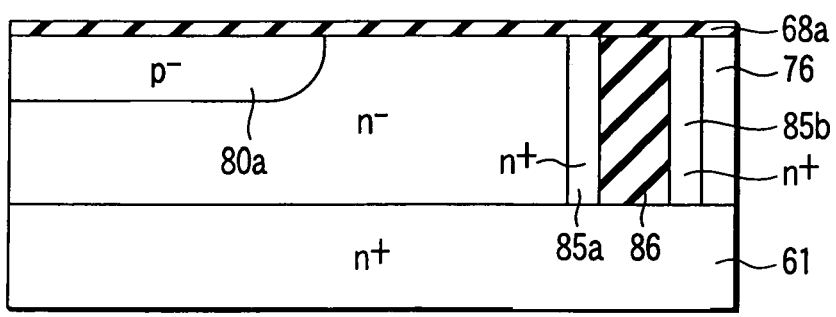

Under this condition, p type dopant ions are implanted into the epitaxial layer 76 to a predetermined area indicated by a broken line in FIG. 61B. Thereafter, as shown in FIG. 61C, the implanted ions are heated to diffuse and produce a p-type base layer 80a there. After removing the resist pattern 93, a gate oxide film 68a is formed on the entire surface of the epitaxial layer 76 as shown in FIG. 61C.

Figure 61D:
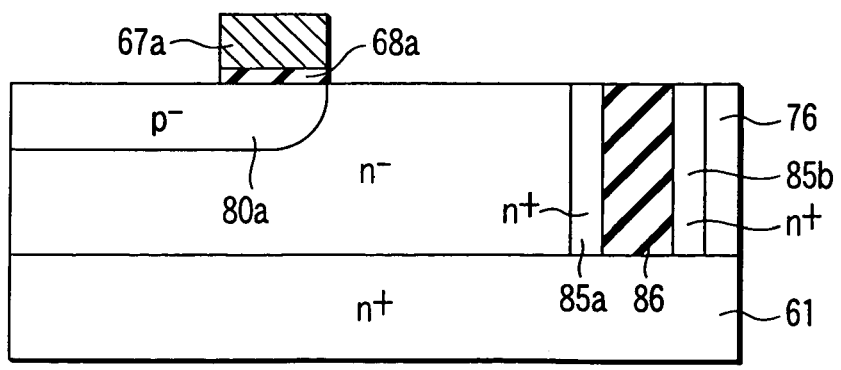

A polysilicon film for forming a gate electrode is deposited on the entire surface of the gate oxide film 68a and a resist film is formed thereon. Subsequently, the resist film is subjected to a patterning operation using an exposure mask so as to leave the resist pattern only on a region for forming a gate electrode 67a as shown in FIG. 61D. Then, a gate electrode 67a and a gate insulating film 68a are actually produced by selective etching. The area where the gate electrode 67a and the gate insulating film 68a are formed corresponds to the area where the boundary of the p layer 80a and the epitaxial layer 76, from which the gate electrode 67a extends toward the side of the p-type extension layer 80a.

Figure 62A:
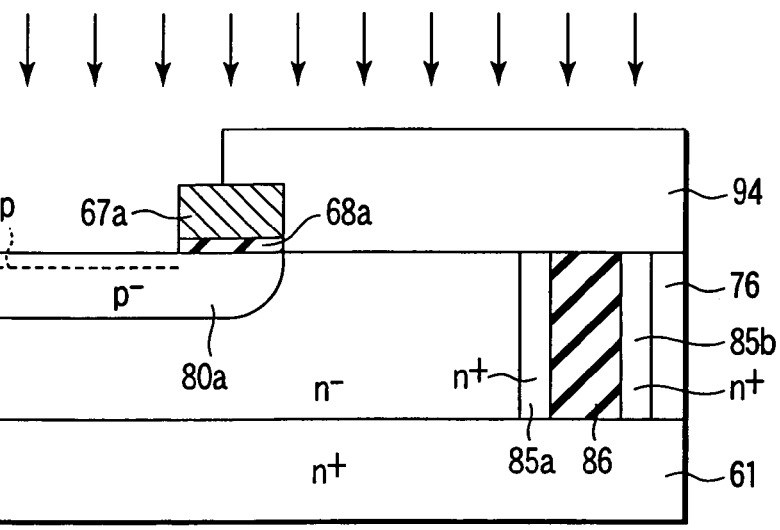
FIG. 62A through 62C are schematic cross sectional views of the modification of the embodiment of FIG. 58, showing further steps of the manufacturing process of FIG. 61D.

Then, as shown in FIG. 62A, a resist pattern 94 having an opening corresponding to a region for forming a base layer 64a is formed and B+ions are implanted into an area indicated by a broken line in FIG. 62A.

Figure 62B:
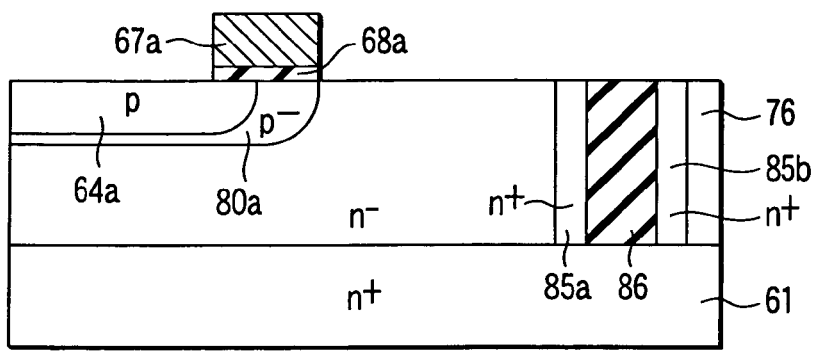

Thereafter, as shown in FIG. 62B, the resist pattern 94 is removed and the work is subjected to an annealing operation to produce a base layer 64a in the layer 80a.

Figure 62C:
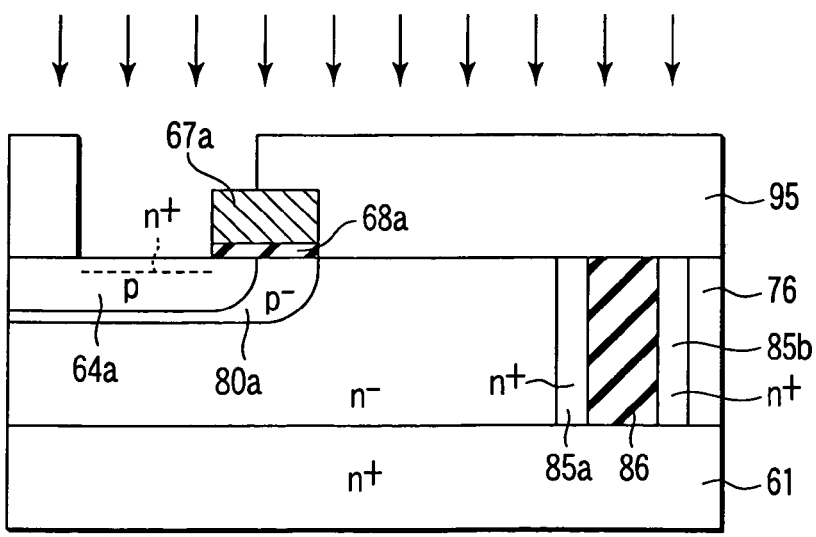
Figure 63A:
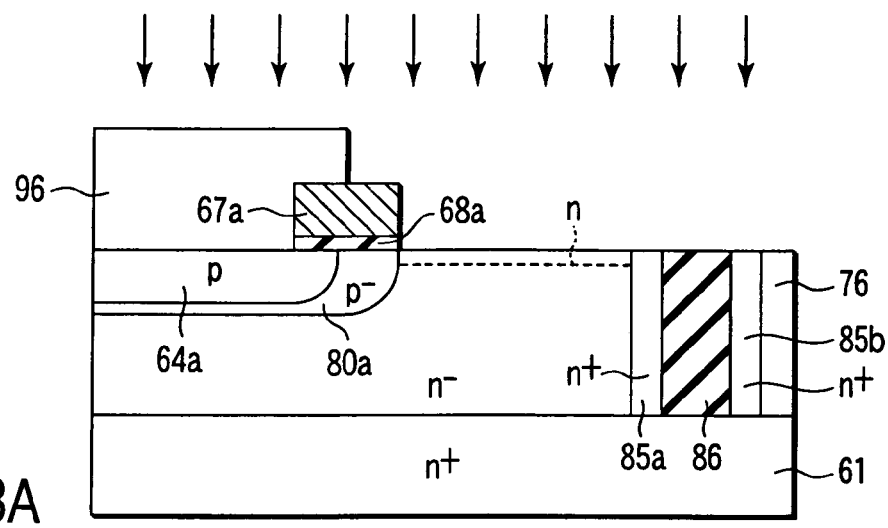
FIGS. 63A through 63C are schematic cross sectional views of the modification of the embodiment of FIG. 58, showing still further steps of the manufacturing process of FIG. 62C.
Figure 63B:
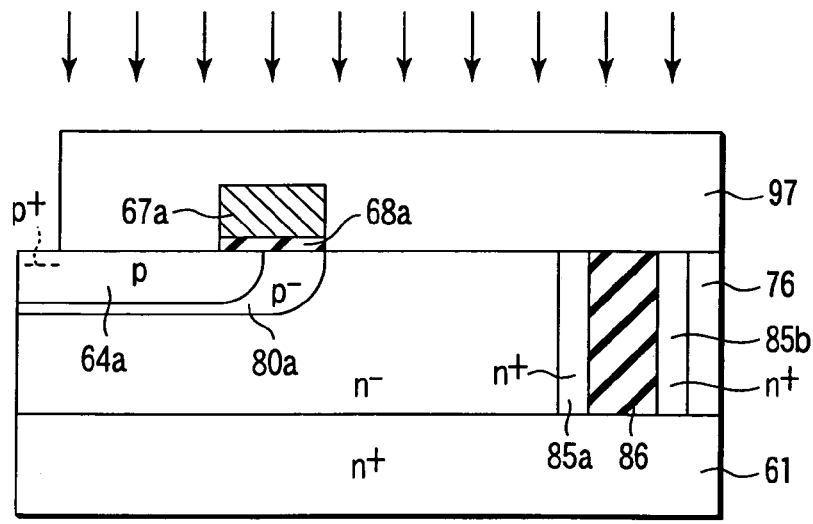

Then, as shown in FIG. 62C, another resist pattern 95 having an opening corresponding to a region for forming a source region is formed on the surface of the base layer 64a and As+ions are implanted into an area indicated by a broken line in FIG. 62C. Thereafter, as shown in FIG. 63A, a resist pattern 96 having an opening corresponding to a region for forming an LDD layer 69a is formed on the surface of the epitaxial layer 76 and P+(Phosphorus) ions are implanted into an area indicated by a broken line in FIG. 63A in a self-aligning manner by using the gate electrode 67a as a mask. Then, as shown in FIG. 63B, a resist pattern 97 having an opening corresponding to a region for forming a p+layer 66a is formed on the surface of the base layer 64a and B+ions are implanted into an area indicated by a broken line in FIG. 63B.

Figure 63C:
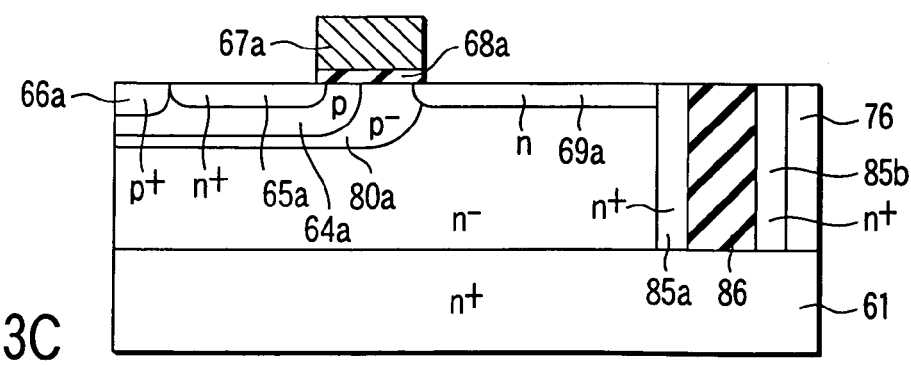

Thereafter, as shown in FIG. 63C, the work is annealed at a predetermined temperature to diffuse the injected ions and produce a source region 65a, a p+layer 66a and an LDD layer 69a.

Figure 64A:
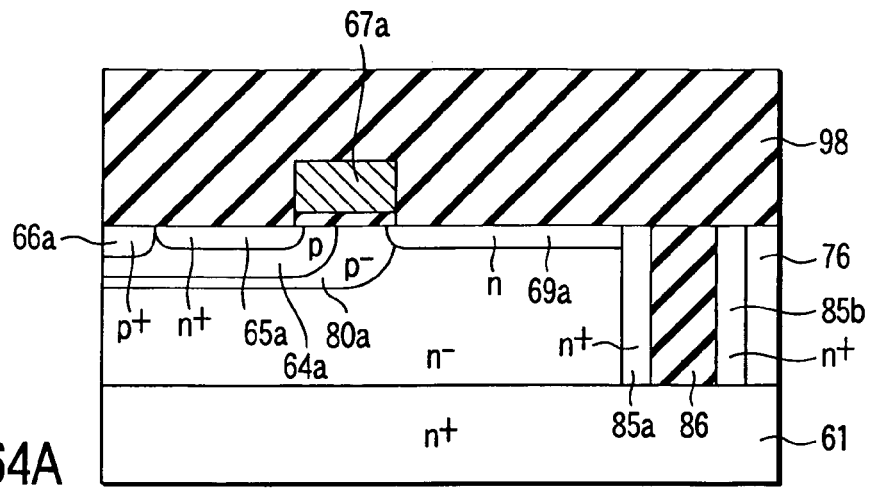
FIGS. 64A through 64C are schematic cross sectional views of the modification of the embodiment of FIG. 58, showing still further steps of the manufacturing process of FIG. 63C.
Figure 64B:
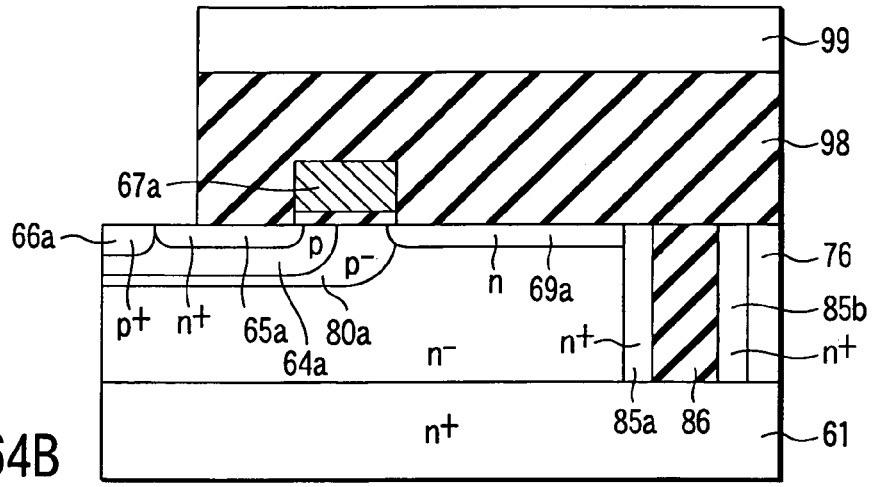
Figure 64C:
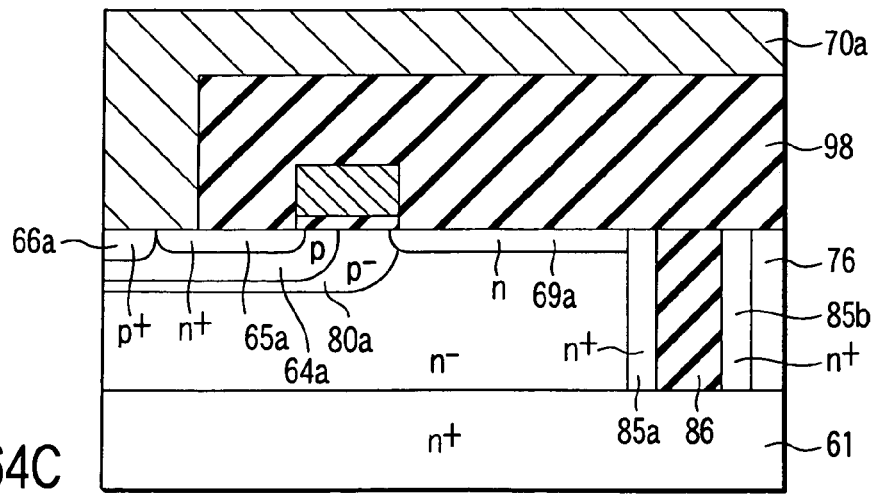

Then, as shown in FIG. 64A, an interlayer insulating film 98 is formed on the entire surface to a predetermined height by a CVD method and subsequently, as shown in FIG. 64B, a resist pattern 99 having an opening for a region where a source electrode 70a is to be formed is prepared. Thereafter, the interlayer insulating film 98 is etched by using the resist pattern 99 as a mask. Subsequently, as shown in FIG. 64C, a source electrode 70a is formed in such a way that it is led out from the source region 65a onto the interlayer insulating film 98.

Figure 65:
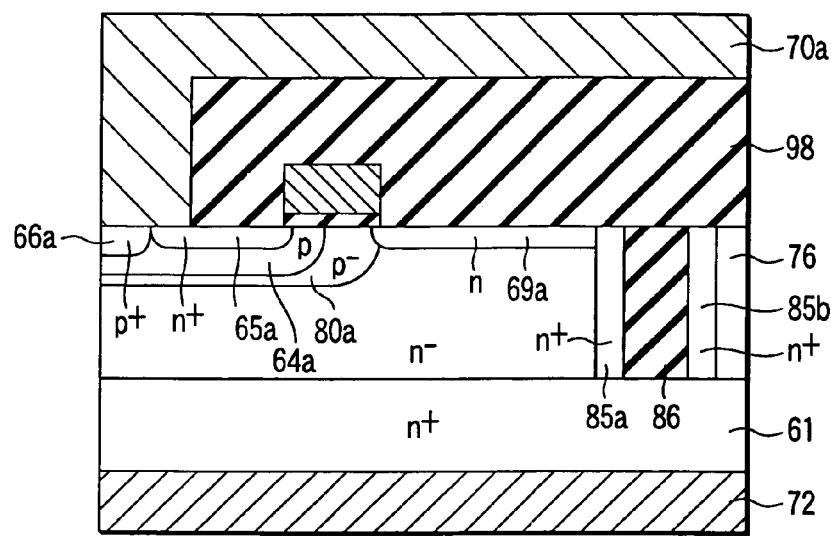
FIG. 65 is a schematic cross sectional view of the modification of the embodiment of FIG. 58, showing a still further step of the manufacturing process following the step of FIG. 64C.

Finally, as shown in FIG. 65, a drain electrode 72 is formed on the entire lower surface of the n+substrate 61 to complete the process of forming a power MOSFET element having a configuration similar to the one illustrated in FIG. 58.

Fifth Embodiment

Now, a number of other embodiments of the present invention will be described by referring to FIGS. 66 through 71, which are obtained by modifying the embodiments of FIGS. 55 through 59 respectively.

Figure 66:
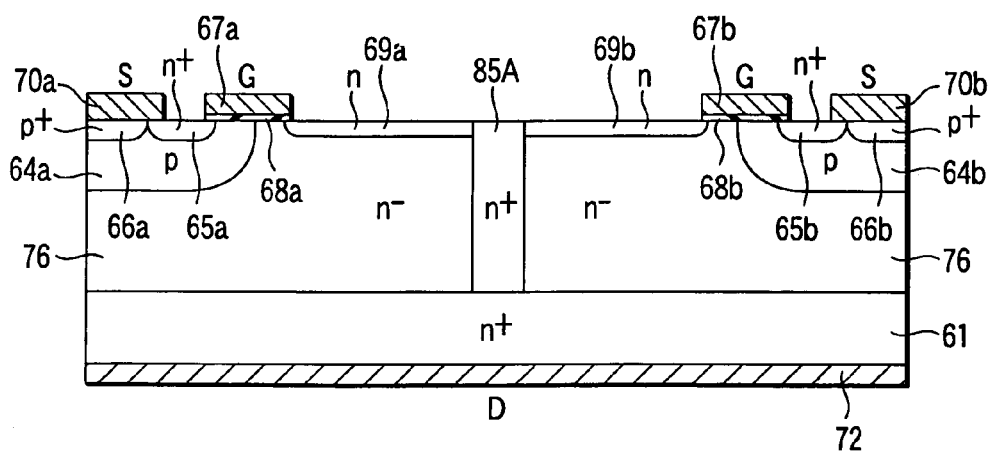
FIG. 66 is a schematic cross sectional view of still another embodiment of the invention.

In the embodiment of FIG. 66, a trench for forming a sinker layer 85A is formed in the n-layer 76. It extends from the surface of the n-layer 76 to the surface of the n+substrate 61. An n+polysilicon layer 85A, or the sinker layer 85A, is formed in the inside of the trench. The n+polysilicon layer 85A is connected to the n type LDD layers 69a, 69b at an upper lateral surface area thereof and to the n+substrate 61 at the bottom surface thereof.

With this arrangement, in an ON state, carriers from the source region 65a flow to the drain electrode 72 through the inversion layer formed in the channel region on a surface region of the base layer 64a, the LDD layer 69a and the sinker layer 85A. The pitch or arrangement of elements, or the distance between the gate electrodes 67a, 67b can be remarkably reduced to 4 µm in this embodiment from 6 µm of the embodiment of power MOSFET element of FIG. 32 having a sinker layer 71 formed by diffusion and showing a breakdown voltage of 30V.

Figure 67:
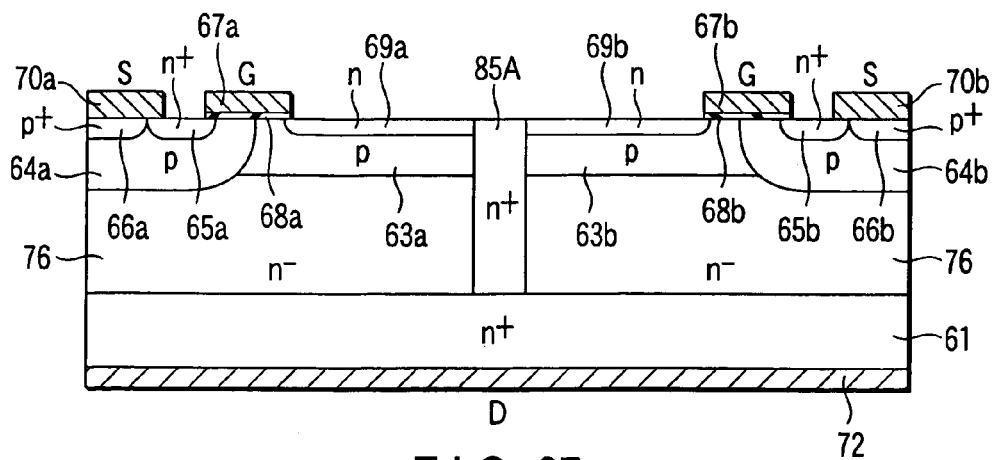
FIG. 67 is a schematic cross sectional view of still another embodiment of the invention.
Figure 68:
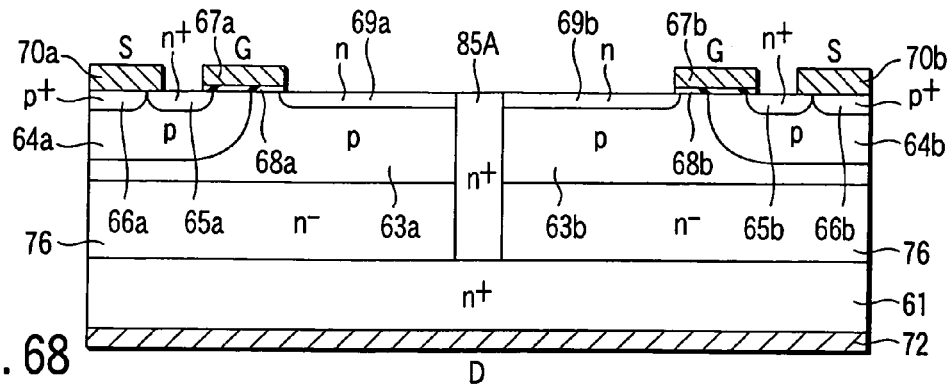
FIG. 68 is a schematic cross sectional view of still another embodiment of the invention.

Shallow p type extension layers 63a, 63b may be formed under the n type LDD layers 69a, 69b as shown in FIG. 67 in order to reduce the capacitance between the gate and the drain. Furthermore, the p type extension layers 63a, 63b may be made relatively thick so as to completely cover the base layers 64a, 64b as shown in FIG. 68 in order to further reduce the capacitance between the gate and the drain.

Figure 69:
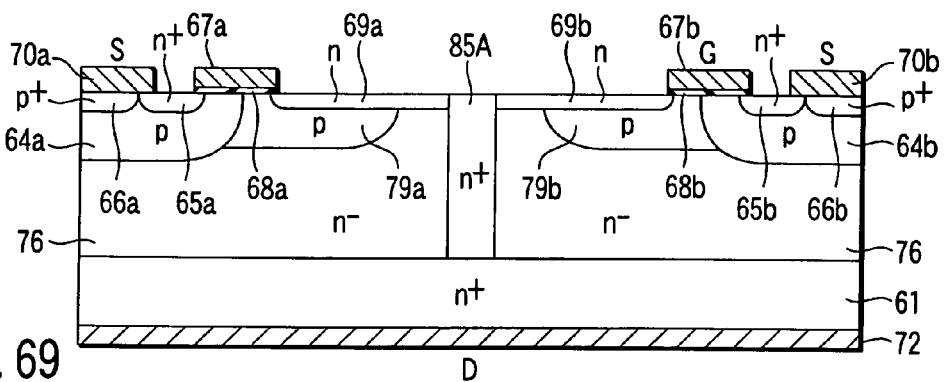
FIG. 69 is a schematic cross sectional view of still another embodiment of the invention.

The embodiment of FIG. 69 is realized by replacing the sinker layer 71 of the embodiment of FIG. 37 with an n+polysilicon layer 85A. This embodiment provides an advantage that the pitch of arrangement of elements can be reduced in addition to an improved breakdown voltage as in the case of the embodiment of FIG. 37.

Figure 70:
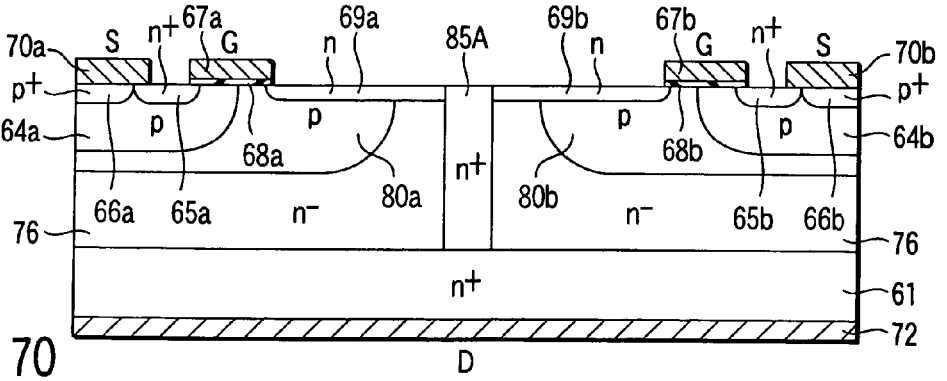
FIG. 70 is a schematic cross sectional view of still another embodiment of the invention.

In the embodiment of FIG. 70, the front ends of the p type extension layers 80a, 80b are made to terminate somewhere at the bottom of the respective LDD layers 69a, 69b as in the case of the embodiment of FIG. 58. With this arrangement, the embodiment shows an improved breakdown voltage.

Figure 71:
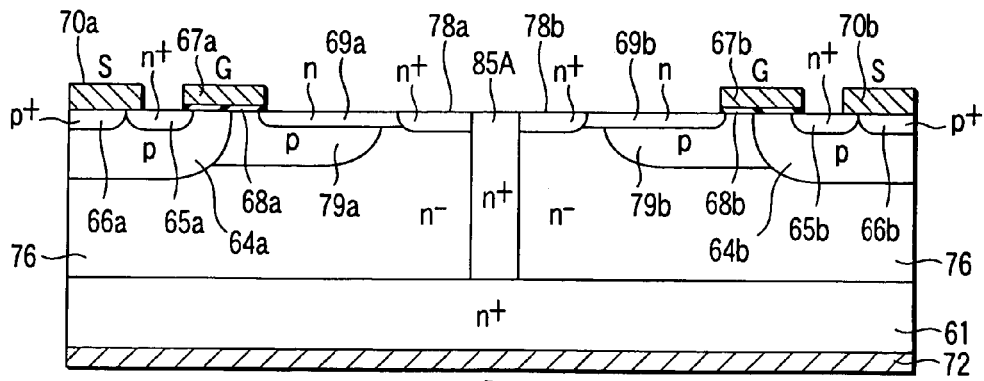
FIG. 71 is a schematic cross sectional view of still another embodiment of the invention.

The embodiment of FIG. 71 differs from that of FIG. 69 in that n+auxiliary current conducting layers 78a, 78b are formed between the respective LDD layers 69a, 69b and the sinker layer 85A. With this arrangement, the embodiment shows a reduced ON resistance if compared with the embodiment of FIG. 69.

Now, the process of manufacturing the embodiment of power MOSFET element illustrated in FIG. 70 will be described below by referring to FIGS. 72A through 77. While only the left power MOSFET element of FIG. 70 is described below, it will be appreciated that the two or more elements are manufactured simultaneously in the real manufacturing process.

Figure 72A:
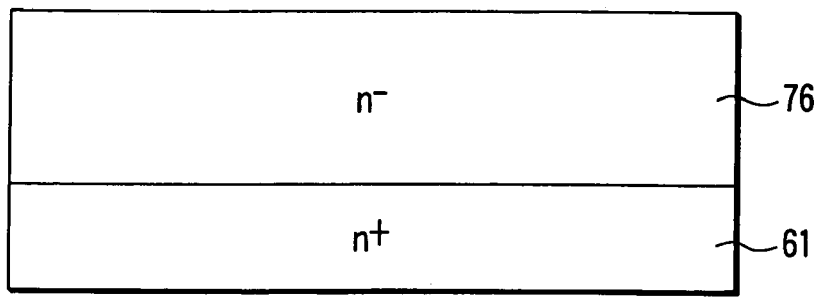
FIGS. 72A through 72D are schematic cross sectional views of a modification of the embodiment of FIG. 70, showing different steps of the manufacturing process.

Referring firstly to FIG. 72A, an epitaxial layer 76 is formed to a predetermined height on an n+substrate 61 by epitaxial growth.

Figure 72B:
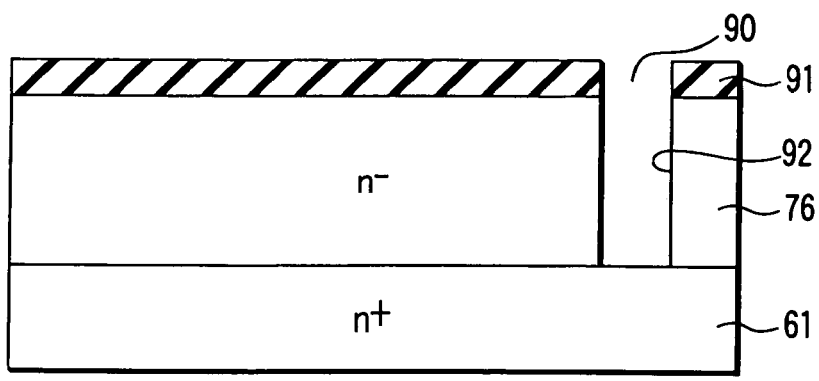

Then, as shown in FIG. 72B, the entire surface of the epitaxial layer 76 is covered with resist film to form a resist pattern 91 having an opening 90 for exposing the surface of the epitaxial layer 76 in a region for forming a sinker layer. Thereafter, the epitaxial layer 76 is etched to produce a trench 92 by using the resist pattern 91 as a mask.

Figure 72C:
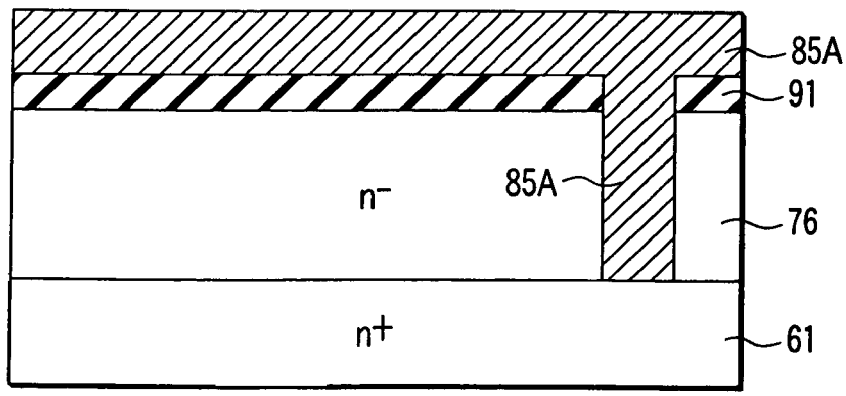

Then, as shown in FIG. 72C, a polysilicon film 85A containing an n+dopant is deposited in the trench 92 and on the resist pattern 91.

Figure 72D:
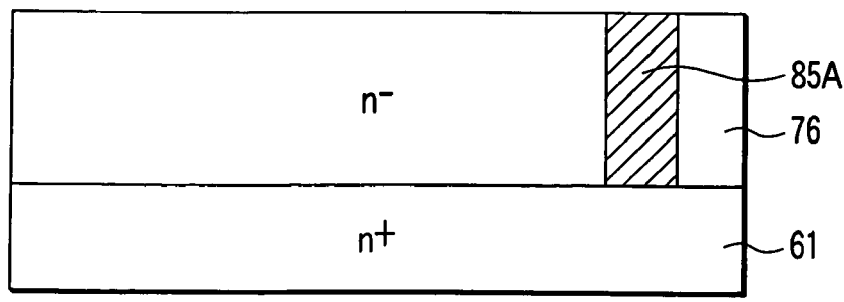

Under this condition, the deposited polysilicon film 85A is etched back to leave a polysilicon sinker layer 85A only in the trench 92 as shown in FIG. 72D.

Figure 73A:
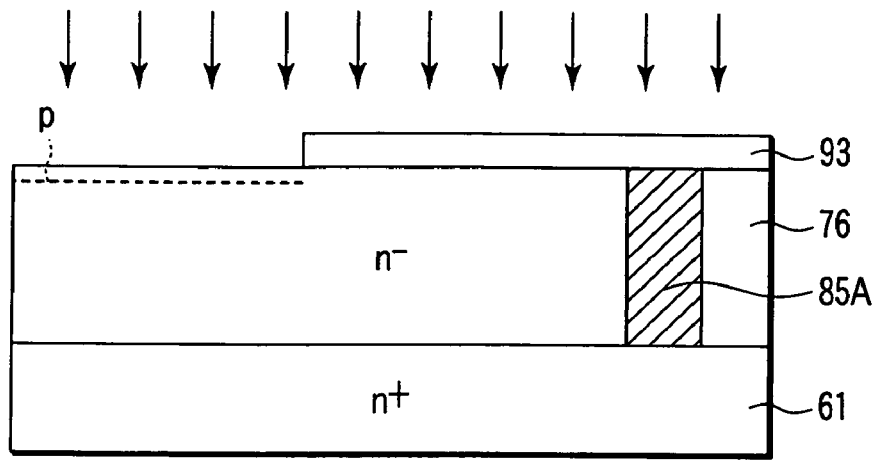
FIGS. 73A through 73C are schematic cross sectional views of the modification of the embodiment of FIG. 70, showing subsequent steps of the manufacturing process of FIG. 72D.

Thereafter, as shown in FIG. 73A, the entire upper surface of the epitaxial layer 76 is covered by a resist film and subsequently a resist pattern 93 is formed by using an exposure mask. Then, a region for forming a p type extension layer 80a is exposed on the surface of the epitaxial layer 76.

Figure 73B:
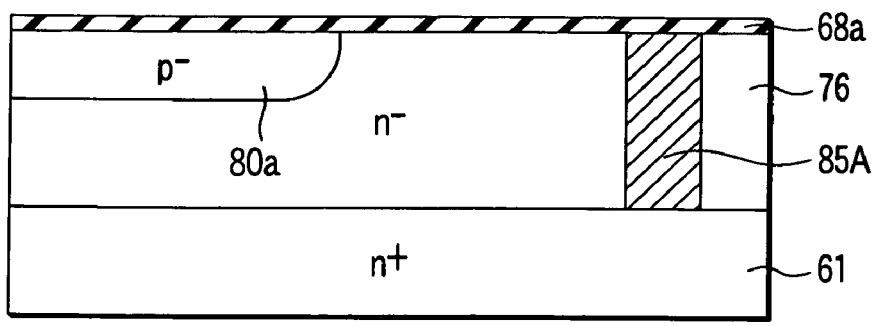

Under this condition, p type dopant ions are implanted into a predetermined area using the resist pattern 93 as a mask as indicated by a broken line in FIG. 73A. Thereafter, as shown in FIG. 73B, the implanted ions are heated to diffuse and produce a p type extension layer 80a there. After removing the resist pattern 93, a gate oxide film 68a is formed on the entire surface of the epitaxial layer 76 as shown in FIG. 73B.

Figure 73C:
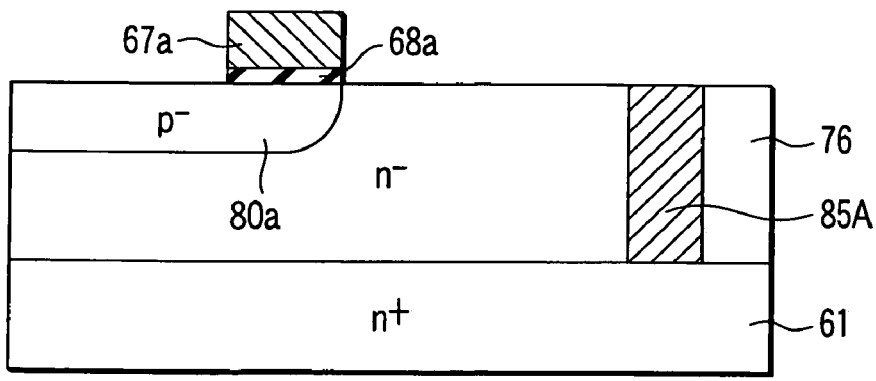

A polysilicon film for forming a gate electrode is produced on the entire surface of the gate oxide film 68a and a resist film is formed thereon. Subsequently, the resist film is subjected to a patterning operation using an exposure mask so as to leave the resist pattern only on a region for forming a gate electrode 67a as shown in FIG. 73C. Then, a gate electrode 67a and a gate insulating film 68a are actually produced by selective etching. The area where the gate electrode 67a and the gate insulating film 68a are formed corresponds to the area where the boundary of the p type extension layer 80a and the epitaxial layer 76, from which the gate electrode 67a extends toward the side of the p type extension layer 80a.

Figure 74A:
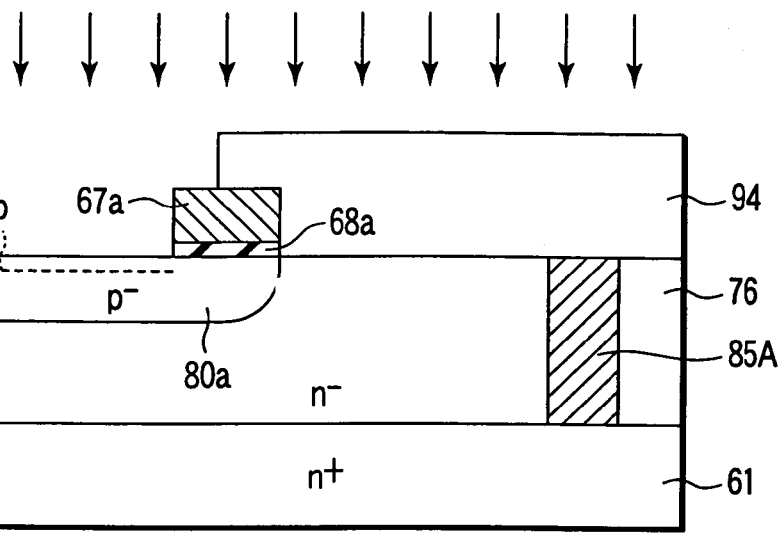
FIGS. 74A through 74C are schematic cross sectional views of the modification of the embodiment of FIG. 70, showing further steps of the manufacturing process of FIG. 73C.

Then, as shown in FIG. 74A, a resist pattern 94 having an opening corresponding to a region for forming a base layer 64a is formed and B+ions are implanted into an area indicated by a broken line in FIG. 74A.

Figure 74B:
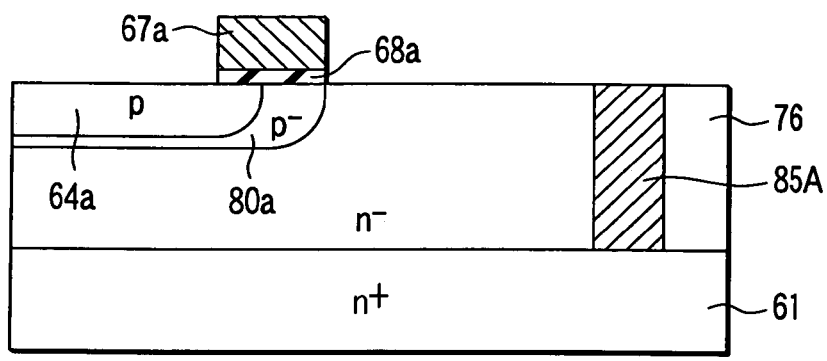

Thereafter, as shown in FIG. 74B, the resist pattern 94 is removed and the work is subjected to an annealing operation to produce a base layer 64a in the extension layer 80a.

Figure 74C:
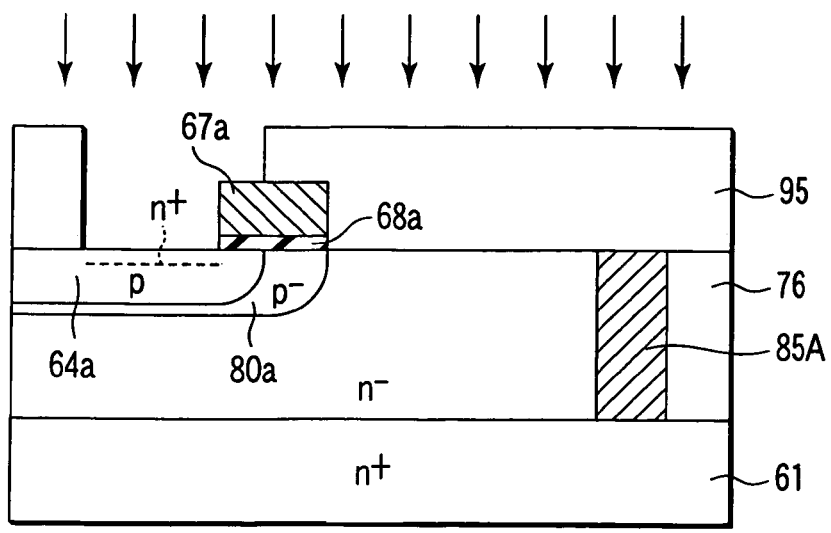
Figure 75A:
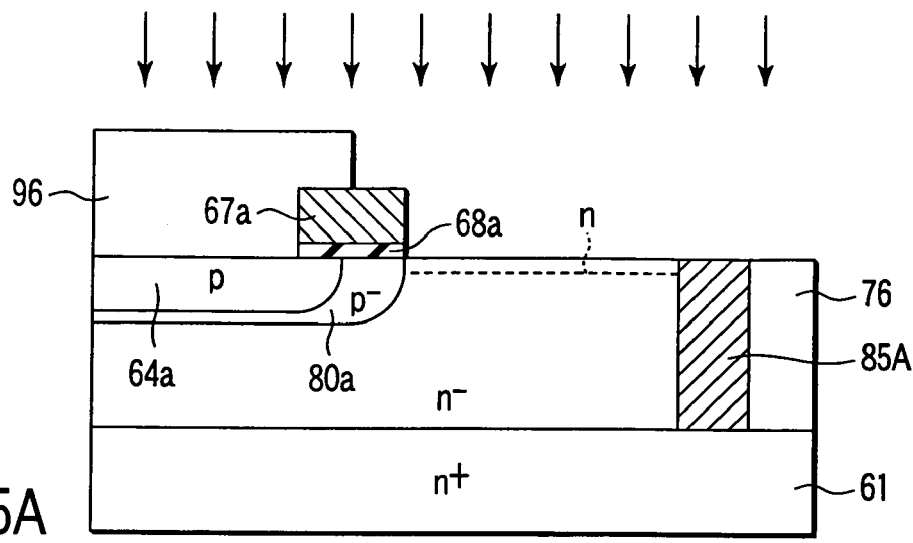
FIGS. 75A through 75C are schematic cross sectional views of the modification of the embodiment of FIG. 70, showing still further steps of the manufacturing process of FIG. 74C.
Figure 75B:
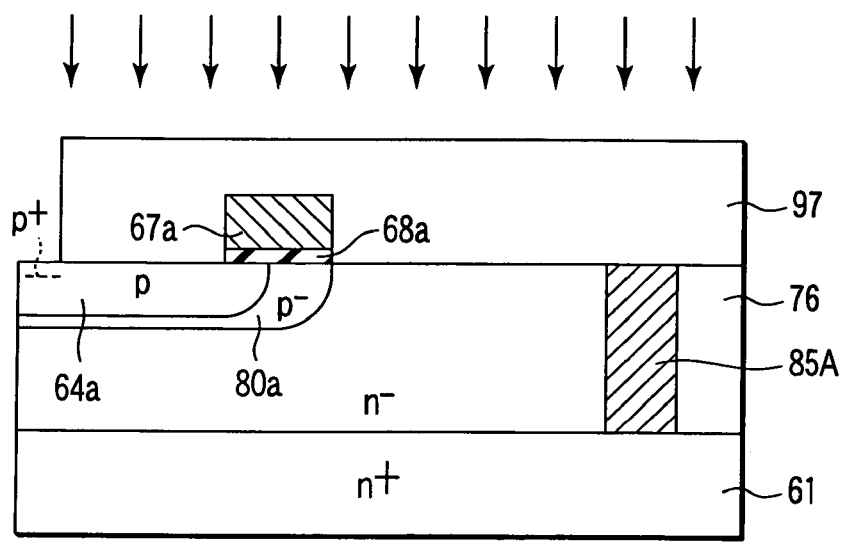

Then, as shown in FIG. 74C, another resist pattern 95 having an opening corresponding a region for forming a source region is formed on the surface of the base layer 64a and As+ions are implanted into an area indicated by a broken line in FIG. 74C. Thereafter, as shown in FIG. 75A, a resist pattern 96 having an opening corresponding to a region for forming an LDD layer 69a is formed on the surface of the epitaxial layer 76 and As+ions are implanted into an area indicated by a broken line in FIG. 75A in a self-aligning manner by using the gate electrode 67a as a mask. Then, as shown in FIG. 75B, a resist pattern 97 having an opening corresponding to a region for forming a p+layer 66a is formed on the surface of the base layer 64a and p+ions are implanted into an area indicated by a broken line in FIG. 75B.

Figure 75C:
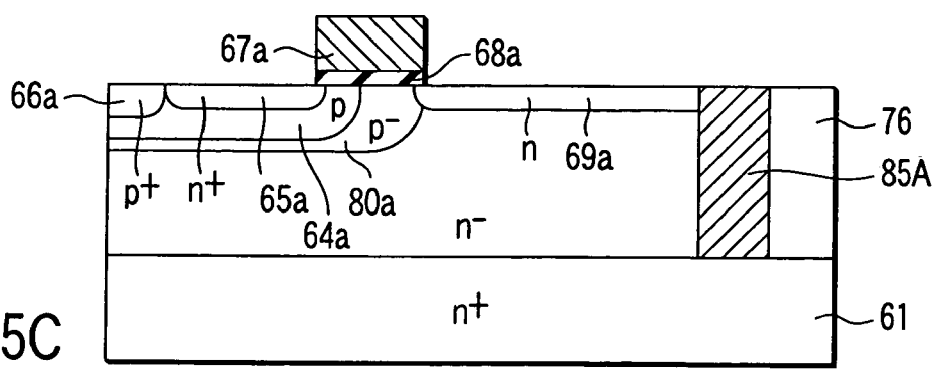

Thereafter, as shown in FIG. 75C, the work is annealed at a predetermined temperature to diffuse the injected ions for producing a source region 65a, a p+layer 66a and an LDD layer 69a.

Figure 76A:
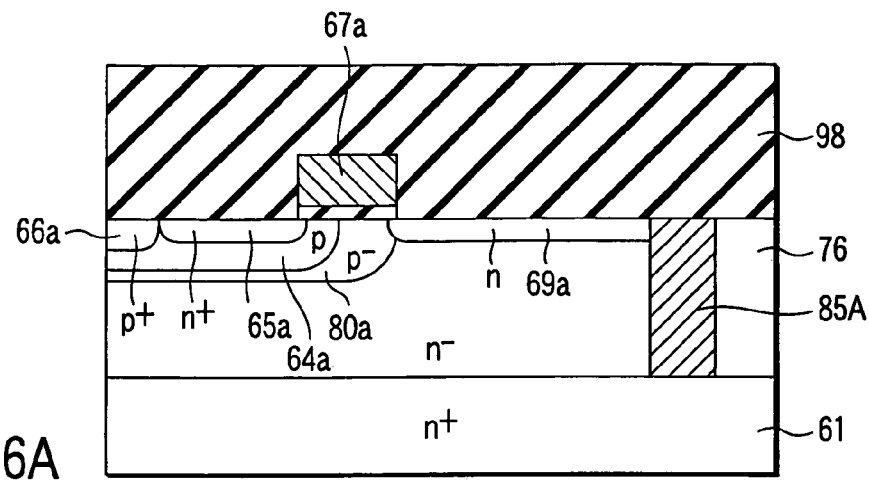
FIGS. 76A through 76C are schematic cross sectional views of the modification of the embodiment of FIG. 70, showing still further steps of the manufacturing process of FIG. 75C.
Figure 76B:
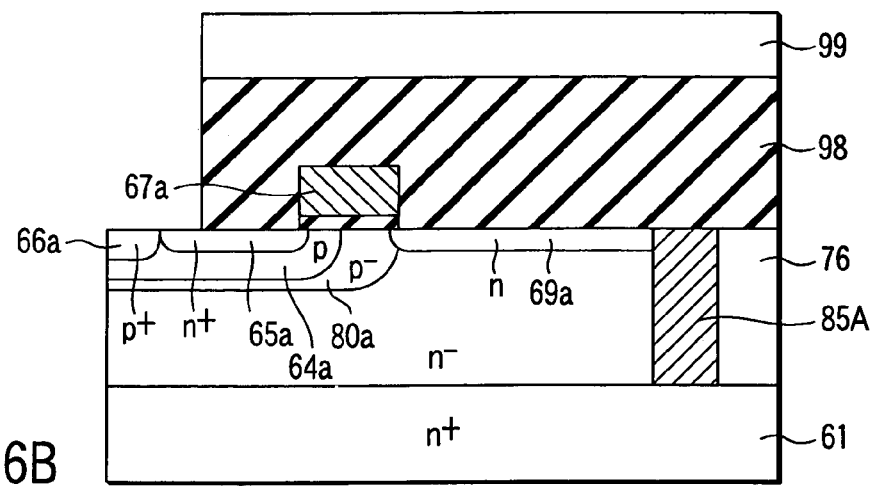
Figure 76C:
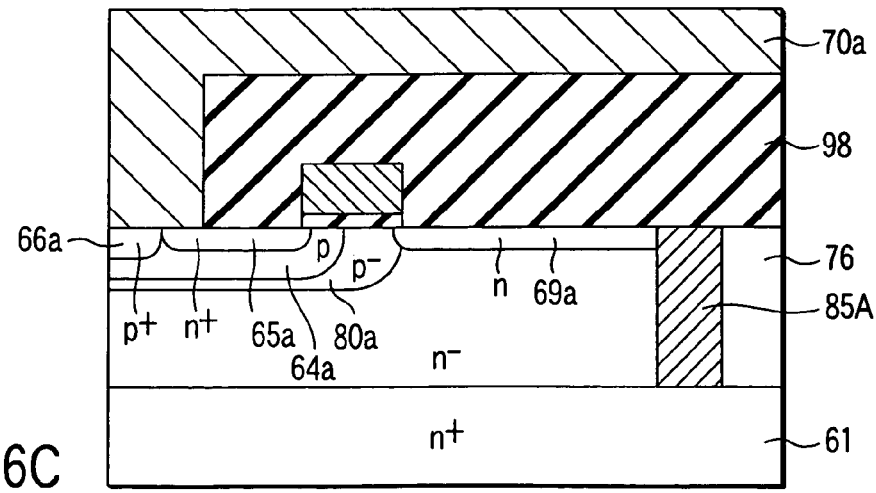

Then, as shown in FIG. 76A, an interlayer insulating film 98 is formed on the entire surface to a predetermined height by a CVD method and subsequently, as shown in FIG. 76B, a resist pattern 99 having an opening for a region where a source electrode 70a is to be formed is prepared. Thereafter, the interlayer insulating film 98 is etched by using the resist pattern 99 as a mask. Subsequently, as shown in FIG. 76C, a source electrode 70a is formed in such a way that it is led out from the source region 65a onto the interlayer insulating film 98.

Figure 77:
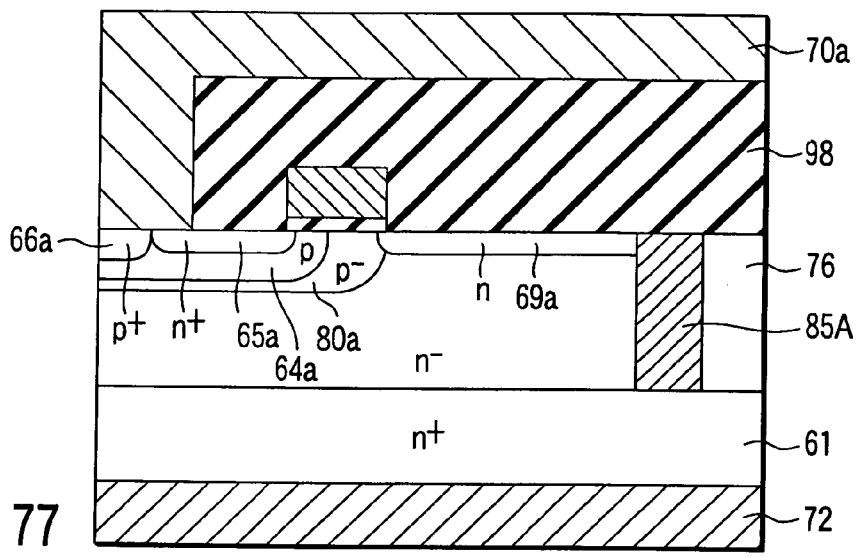
FIG. 77 is a schematic cross sectional view of the modification of the embodiment of FIG. 70, showing a still further step of the manufacturing process of FIG. 76C.

Finally, as shown in FIG. 77, a drain electrode 72 is formed on the entire lower surface of the n+substrate 61 to complete the process of forming a power MOSFET element having a configuration similar to the one illustrated in FIG. 70.

Sixth Embodiment

Figure 78:
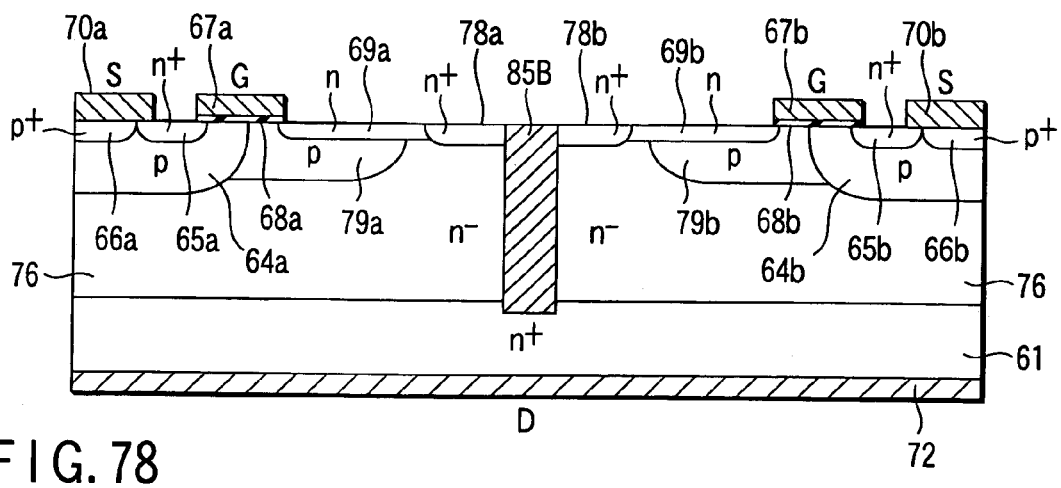
FIG. 78 is a schematic cross sectional view of still another embodiment of the invention.

The embodiment shown in FIG. 78 is realized by burying a metal layer 85B into the trench formed in the epitaxial layer 76 in place of the polysilicon layer 85A of the embodiment of FIG. 71. All the remaining components of this embodiment is identical with the embodiment of FIG. 71 and hence will not be described any further. However, while the lower end of the metal layer 85B is held in contact with the n+substrate 61 in a condition where it is partly buried in the substrate 61 in the embodiment of FIG. 78, the lower end of the metal layer 85B may simply be held in contact with the surface of the n+substrate 61. The metal layer 85B may be made of tungsten, for example, and can be buried into the trench by a known deposition method as in the case of forming an ordinary contact plug. When this embodiment is used as a 30V type power MOSFET element, the pitch of arrangement of elements can be reduced to 4 μm if compared with known elements comprising a sinker layer formed by diffusion that shows a pitch of arrangement of 6 μm or more.

As described above in detail, according to the embodiments of the present invention, there is provided a power MOSFET device showing a small capacitance between the source and the drain, a high breakdown voltage and a low ON resistance.

Additional advantages and modifications will readily occur to those skilled in the art. Therefore, the invention in its broader aspects is not limited to the specific details and representative embodiments shown and described herein. Accordingly, various modification may be made without departing from the spirit or scope of the general inventive concept as defined by the appended claims and their equivalents.

What is claimed is:

1. A power MOSFET device comprising:
   a low resistance substrate of the first conductivity type;
   a high resistance epitaxial layer of the first conductivity type formed on the low resistance substrate;
   a base layer of the second conductivity type formed in a surface region of said high resistance epitaxial layer;
   a source region of the first conductivity type formed in a surface region of the base layer;
   a gate insulating film formed on the surface of said base layer so as to contact said source region;
   a gate electrode formed on said gate insulating film; and
   an LDD layer of the first conductivity type formed on the surface of said high resistance epitaxial layer oppositely relative to said source region and said gate electrode;
   wherein said LDD layer and said low resistance substrate are connected to each other by said high resistance epitaxial layer.

2. The device according to claim 1, wherein
   said LDD layer has a bottom section formed at a level shallower than said base layer.

3. The device according to claim 2, wherein
   said LDD layer is formed in a self-aligning manner by using said gate electrode as mask.

4. The device according to claim 1, wherein
   said LDD layer has a bottom section formed at a level deeper than said base layer.

5. The device according to claim 4, wherein said LDD layer is formed in a self-aligning manner by using said gate electrode as mask.

6. The device according to claim 1, further comprising:
a low resistance intermediate layer of the first conductivity type formed in a lateral section of said base layer facing said LDD layer and a region of said epitaxial layer held in contact with said LDD layer and having an impurity density higher than said epitaxial layer.

7. The device according to claim 6, wherein said LDD layer is formed in a self-aligning manner by using said gate electrode as mask.

8. The device according to claim 1, further comprising:
a current conducting layer formed in said epitaxial layer to directly continue from said LDD layer so as to project toward said low resistance substrate.

9. The device according to claim 8, wherein said LDD layer is formed in a self-aligning manner by using said gate electrode as mask.

10. The device according to claim 1, wherein the bottom of said base layer is held in contact with said low resistance substrate.

11. The device according to claim 10, wherein said LDD layer is formed in a self-aligning manner by using said gate electrode as mask.

12. The device according to claim 1, wherein said LDD layer is formed in a self-aligning manner by using said gate electrode as mask.

13. The device according to claim 1, further comprising:
an extension layer of the second conductivity type formed in a lateral section of said base layer facing said LDD layer and a surface region of said epitaxial layer and at least held in contact with said LDD layer, said extension layer having an impurity concentration lower than that of said base layer.

14. The device according to claim 13, wherein said extension layer of the second conductivity type is formed in said epitaxial layer so as to cover the periphery of said base layer.

15. The device according to claim 14, wherein the bottom of said base layer is held in contact with said low resistance substrate.

16. The device according to claim 13, wherein said extension layer of the second conductivity type is formed in said epitaxial layer between said base layer and said LDD layer.

17. The device according to claim 16, wherein said extension layer of the second conductivity type is formed in said epitaxial layer so as to cover the periphery of said base layer.

18. The device according to claim 16, wherein the bottom of said base layer is held in contact with said low resistance substrate.

19. The device according to claim 13, wherein the bottom of said base layer is held in contact with said low resistance substrate.

20. The device according to claim 19, wherein said LDD layer is formed in a self-aligning manner by using said gate electrode as a mask.

21. The device according to claim 13, wherein said LDD layer has a length between about 0.7 μm and about 0.8 μm.

22. The device according to claim 21, wherein the dose of said LDD layer is not higher than $6.0 \times 10^{11}$/cm$^2$.

23. The device according to claim 1, wherein said LDD layer has a length between about 0.7 μm and about 0.8 μm.

24. The device according to claim 23, wherein the dose of said LDD layer is not higher than $6.0 \times 10^{11}$/cm$^2$.

25. A power MOSFET device comprising:
a low resistance substrate of the first conductivity type;
a high resistance epitaxial layer of the first conductivity type formed on the low resistance substrate;
a base layer of the second conductivity type formed in a surface region of said high resistance epitaxial layer;
a source region of the first conductivity type formed in a surface region of the base layer;
an LDD layer of the first conductivity type formed in a surface region of said high resistance epitaxial layer at a position separated from said base layer by a predetermined distance;
a gate insulating film formed to bridge said source region and an end of said LDD layer;
a gate electrode formed on said gate insulating film;
a sinker layer of the first conductivity type formed between the other end of said LDD layer and said low resistance substrate; and
an extension layer of the second conductivity type formed between the lateral side of said base layer facing said LDD layer being at least held in contact with said base layer;
wherein said sinker layer has a trench formed so as to extend from said LDD layer to said low resistance substrate.

26. The device according to claim 25, wherein said sinker layer further has a low resistance layer of the first conductivity type formed on a lateral surface of said trench and an insulating film buried in said trench.

27. The device according to claim 26, wherein said extension layer of the second conductivity type is formed so as to extend to said sinker layer and cover the periphery of said base layer.

28. The device according to claim 26, wherein the bottom of said base layer is held in contact with said low resistance substrate.

29. The device according to claim 25, wherein said sinker layer further has a low resistance semiconductor layer of the first conductivity type buried in said trench.

30. The device according to claim 29, wherein said extension layer of the second conductivity type is formed so as to extend to said sinker layer and cover the periphery of said base layer.

31. The device according to claim 29, wherein the bottom of said base layer is held in contact with said low resistance substrate.

32. The device according to claim 25, wherein said sinker layer further has a metal layer buried in said trench.

33. The device according to claim 32, wherein said extension layer of the second conductivity type is formed so as to extend to said sinker layer and cover the periphery of said base layer.

34. The device according to claim 32, wherein the bottom of said base layer is held in contact with said low resistance substrate.

* * * * *